(12) United States Patent
Katoh et al.

(10) Patent No.: US 6,333,564 B1
(45) Date of Patent: Dec. 25, 2001

(54) SURFACE MOUNT TYPE SEMICONDUCTOR DEVICE AND METHOD OF PRODUCING THE SAME HAVING AN INTERPOSING LAYER ELECTRICALLY CONNECTING THE SEMICONDUCTOR CHIP WITH PROTRUSION ELECTRODES

(75) Inventors: Yoshitsugu Katoh; Mitsutaka Sato; Hiroshi Inoue; Seiichi Orimo; Akira Okada, all of Kawasaki; Yoshihiro Kubota, Nagano; Mitsuo Abe, Kawasaki; Toshio Hamano, Kawasaki; Yoshitaka Aiba, Kawasaki; Tetsuya Fujisawa, Kawasaki; Masaaki Seki, Kawasaki; Noriaki Shiba, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/336,747

(22) Filed: Jun. 21, 1999

(30) Foreign Application Priority Data

Jun. 22, 1998 (JP) ................................................ 10-175164
Jun. 17, 1999 (JP) ................................................ 11-171612

(51) Int. Cl.$^7$ .................................................. H01L 23/48
(52) U.S. Cl. .......................... 257/780; 257/738; 438/118; 438/616
(58) Field of Search .................................... 257/737, 738, 257/780, 781; 438/616, 106, 119, 118

(56) References Cited

U.S. PATENT DOCUMENTS

| 5,384,698 | 1/1995 | Shen | 700/29 |
| 5,521,435 | * 5/1996 | Mizukoshi | 257/698 |
| 6,087,203 | * 7/2000 | Eng et al. | 438/118 |

FOREIGN PATENT DOCUMENTS

| 8-306817 | 11/1996 | (JP) . |
| 9-64080 | 3/1997 | (JP) . |
| 9-162216 | 6/1997 | (JP) . |
| 9-219463 | 8/1997 | (JP) . |
| 10-107091 | 4/1998 | (JP) . |
| 10-98130 | 4/1998 | (JP) . |
| 10-189861 | 7/1998 | (JP) . |
| 10-261753 | 9/1998 | (JP) . |
| 10-275880 | 10/1998 | (JP) . |
| 10-284678 | 10/1998 | (JP) . |
| 10-321672 | 12/1998 | (JP) . |
| 2860646 | 12/1998 | (JP) . |
| 11-16959 | 1/1999 | (JP) . |
| 11-17048 | 1/1999 | (JP) . |
| 11-40694 | 2/1999 | (JP) . |
| 2895022 | 3/1999 | (JP) . |
| 11-135682 | 5/1999 | (JP) . |

* cited by examiner

*Primary Examiner*—Timothy P. Callahan
*Assistant Examiner*—Minh Nguyen
(74) *Attorney, Agent, or Firm*—Armstrong, Westerman, Hattori, McLeland & Naughton, LLP

(57) ABSTRACT

A semiconductor device and a method of producing the same, the device including a semiconductor chip; balls which function as external connecting terminals; a substrate which electrically connects the semiconductor chip and the balls; a mold resin which seals at least a part of the semiconductor chip; and a connecting portion sealing resin which seals the connecting portion between the substrate and the semiconductor chip. The semiconductor device is mounted onto a printed circuit board via the balls. The thermal expansion coefficient of the mold resin is matched with the thermal expansion coefficient of the printed circuit board. A side surface holding portion for the holding the side surfaces of the semiconductor chip is formed in the mold resin to restrict thermal deformation of the semiconductor chip.

14 Claims, 57 Drawing Sheets

FIG.27

EVALUATION CONDITIONS : ONE-SIDE MOUNTING (-25°C ~ RT ~ 125°C)

|  | 500cyc | 1000cyc | 1500cyc | 2000cyc | 2500cyc |
|---|---|---|---|---|---|
| COMPARATIVE EXAMPLE | 0/15 | 12/15 | 3/3 | — | — |
| 24th EMBODIMENT | 0/15 | 0/15 | 0/15 | 0/15 | 0/15 |
| 25th EMBODIMENT | 0/15 | 0/15 | 0/15 | 12/15 | — |

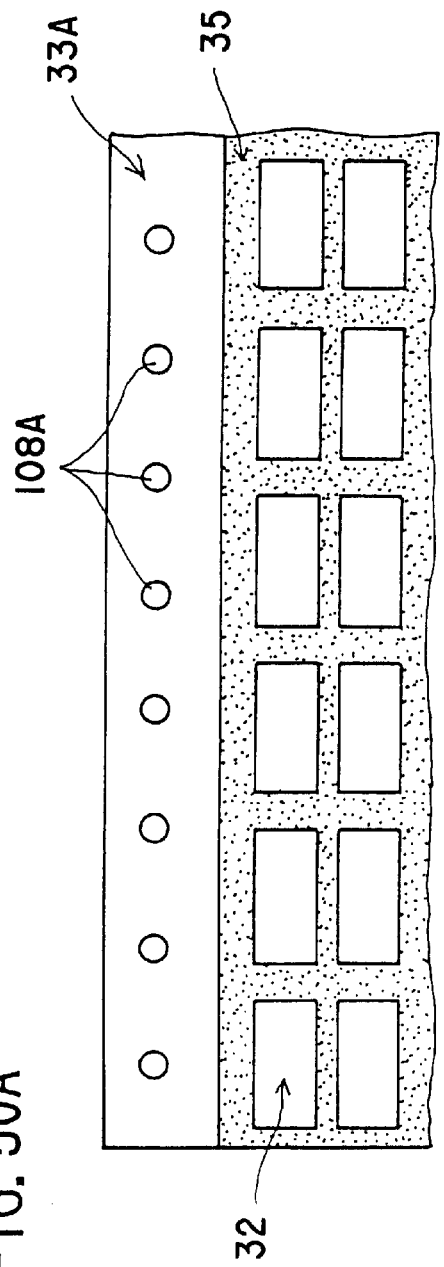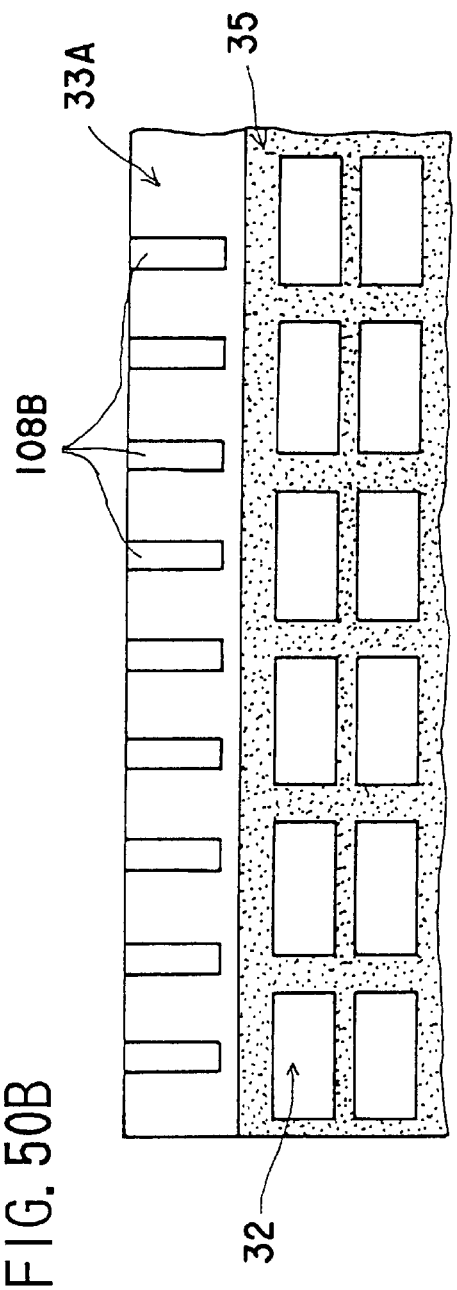

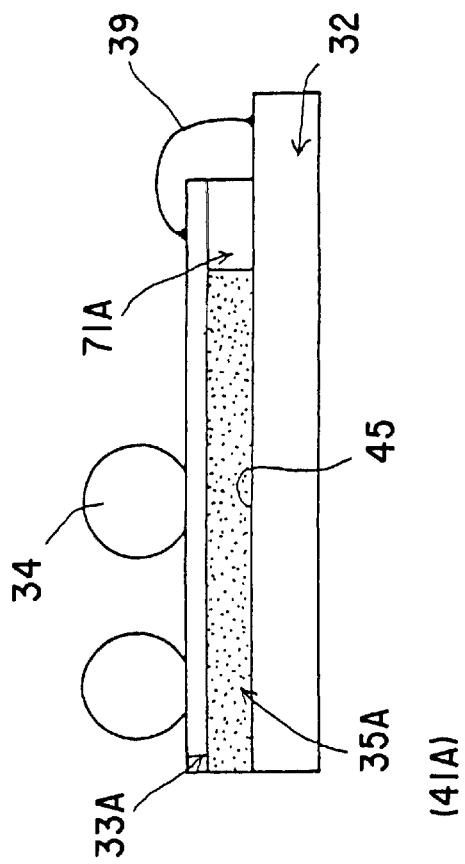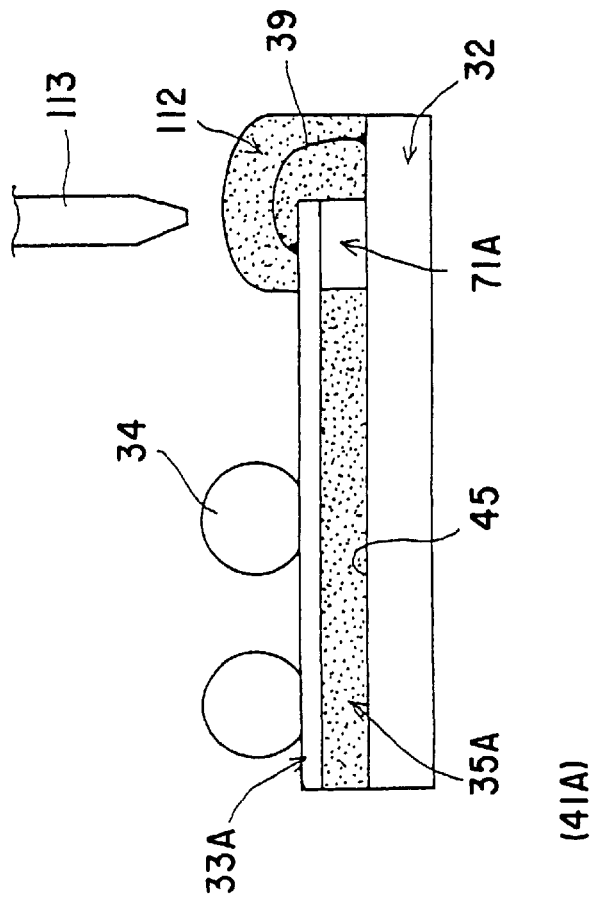
FIG. 54A
FIG. 54B

FIG.69

| | UNIT | A | | B | | C | | D | |
|---|---|---|---|---|---|---|---|---|---|
| | | 25°C | 180°C | 25°C | 170°C | 25°C | 170°C | 25°C | 170°C |
| MELTING POINT | (°C) | 327 | | 323 | | 327 | | 270 | |
| NORMAL TEMPERATURE | (°C) | 260 | | 260 | | 260 | | 150 | |
| NONADHESIVENESS | — | ◎ | | ◎ | | ◎ | | ○ | |
| FLUORINE MIGRATION | — | ○ | | ○ | | ○ | | △ | |
| HARDNESS (SHORE) | — | D50~55 | | D50~55 | | D50~55 | | D76 | |
| KINEMATIC FRICTION COEFFICIENT (0.69MP/3m/min) | — | 0.15 | | 0.15 | | 0.15 | | 0.4 | |
| WATER ABSORPTION (24h) | (%) | 0.00 | | 0.00 | | 0.00 | | 0.029 | |
| TENSILE STRENGTH | (kg/cm²) MD | 530 | 200 | 487 | 280 | 566 | 213 | 455 | — |
| | TD | 407 | 210 | 450 | 250 | 533 | 187 | — | — |
| ELONGATION | (%) MD | 370 | 460 | 407 | 660 | 468 | 690 | 100~400 | — |
| | TD | 322 | 430 | 372 | 620 | 470 | 650 | — | — |
| SURFACE ROUGHNESS (RZ) | (μm) | 1.5 | — | 1.0 | — | 0.43 | — | 0.32 | — |

SURFACE MOUNT TYPE SEMICONDUCTOR DEVICE AND METHOD OF PRODUCING THE SAME HAVING AN INTERPOSING LAYER ELECTRICALLY CONNECTING THE SEMICONDUCTOR CHIP WITH PROTRUSION ELECTRODES

BACKGROUND OF THE INVENTION

1. Field of the Invention

The present invention generally relates to a semiconductor device and a method of producing the same and, more particularly, to a semiconductor device of a surface mount package type and a method of producing the same.

2. Description of the Related Art

Generally, a BGA (Ball Grid Array) type semiconductor device is well known as a semiconductor device of the surface mount package type. The BGA-type semiconductor device has ball-like protrusion electrodes (bumps) as external connecting terminals, and the protrusion electrodes are bonded to a printed circuit board so that the semiconductor device is mounted onto the printed circuit board.

In recent years, there has been an increasing demand for highly reliable electronic equipment onto which semiconductor devices are mounted, and, hence, high reliability is also expected when a semiconductor device is mounted onto a printed circuit board.

FIG. 1 shows a conventional semiconductor device of a surface mount package type. A BGA-type semiconductor device 1 comprises a semiconductor chip 2, a wiring board 3 (hereinafter referred to as "substrate 3"), protrusion electrodes 4 (hereinafter referred to as "balls 4"), and a mold resin 5. The substrate 3 comprises insulating resin tape 6 made of polyimide (hereinafter referred to as "PI tape") and a wiring layer 7. The semiconductor chip 2 is mounted on the upper surface of the substrate 3 with a bonding member 10.

Ball attachment holes 8 are formed in ball attachment positions in the PI tape 6 of the substrate 3. The wiring layer 7 is made of copper foil formed into a predetermined pattern. Metal wires 9 are bonded between the wiring layer 7 and the semiconductor chip 2, and are connected to the balls 4 through the ball attachment holes 8. In this manner, the semiconductor chip 2 is electrically connected to the balls 4 via the metal wires 9 and the wiring layer 7.

The balls 4 are bumps which function as external connecting terminals, and are formed by soldering. The balls 4 are bonded to the wiring layer 7 through the ball attachment holes 8 formed in the PI tape 6. The balls 4 are also disposed on the mounting surface of the substrate 3 (on the bottom surface in FIG. 1) in an area array so as to accommodate the high-density semiconductor chip 2 and the small semiconductor device 1.

The mold resin 5 is formed on the upper surface of the substrate 3, on which the semiconductor chip 2 is mounted, so as to protect the semiconductor chip 2, the wiring layer 7, and the metal wires 9.

The semiconductor device 1 is surface-mounted on a printed circuit board 11. More specifically, the balls 4 are positioned with electrodes 12 formed on the printed circuit board 11, and the semiconductor device 1 is then placed on the printed circuit board 11. The balls 4 are bonded to the electrode 12 by reflow soldering, so that the semiconductor device 1 is mounted on the printed circuit board 11.

The semiconductor chip 2 in the semiconductor device 1 generates heat when operated. The temperature of the semiconductor chip 2 rises during when operated, and drops when stopped. By the heat, the semiconductor device 1 thermally expands.

However, since the thermal expansion coefficients of the semiconductor device 1 and the printed circuit board 11 are different, a thermal expansion difference occurs between the semiconductor device 1 and the printed circuit board 11, thereby causing stress in the bonding position between the semiconductor device 1 and the printed circuit board 11. Such stress might results in removal of the balls 4 from the electrodes 12.

To solve this problem, a semiconductor device 20 shown in FIG. 2 has been developed. In FIG. 2, the same components as in the semiconductor device 1 shown in FIG. 1 are indicated by the same reference numerals.

The semiconductor device 20 is characterized by a buffer member 21 interposed between the semiconductor chip 2 and the substrate 3. The buffer member 21 is made of elastomer (a low elastic modulus material), and is elastically deformed. The substrate 3 is disposed on the bottom surface (the surface facing the printed circuit board 11) of the buffer member 21.

The semiconductor chip 2 has a face-down structure, and the semiconductor chip 2 and the substrate 3, between which the buffer member 21 is interposed, are electrically connected by the metal wires 9. A potting resin 22 formed by potting seals the semiconductor chip 2.

Transfer molding cannot be performed on the structure having the buffer member 21 that can be elastically deformed. For this reason, the potting resin 22 seals the semiconductor chip 2 and the metal wires 9.

The buffer member 21 interposed between the semiconductor chip 2 and the substrate 3 takes up a thermal expansion difference between the semiconductor device 20 and the printed circuit board 11. Thus, stress is prevented between the semiconductor chip 2 and the substrate 3, and the bonding reliability (packaging reliability) between the balls 4 and the electrodes 12 can be improved.

With the semiconductor device 20, however, there is a problem that the buffer member 21 interposed between the semiconductor chip 2 and the substrate 3 adds to the number of components and complicates the production procedures, resulting in high production costs.

Another problem is that the semiconductor device 20 becomes taller than the semiconductor device 1 by the height of the buffer member 21 between the semiconductor chip 2 and the substrate 3.

The semiconductor chip 2 attached to the buffer member 21 can be sealed only by the potting resin 22, and a fillet-like concave portion 23 is inevitably formed on the boundary of the potting resin 22 and the upper surface of the semiconductor chip 2. Because of the concave portion 23, the upper surface of the semiconductor device 20 formed by the semiconductor chip 2 and the potting resin 22 is not flat, resulting in another problem that desirable chucking cannot performed with the semiconductor device 20.

If the semiconductor device 20 is transported using a vacuum chuck, it is necessary to chuck the upper surface of the semiconductor device 20 having the balls 4 formed on the mounting surface (the bottom surface) of the substrate 3. Especially for the small chip size package shown in FIG. 2, it is necessary to vacuum chuck the entire upper surface of the semiconductor device 20 (i.e., the entire upper surface formed by the semiconductor chip 2 and the potting resin 22).

With the potting resin 22, however, the upper surface of the semiconductor device 20 is not flat due to the fillet-like concave portion 23 on the upper edge. Furthermore, the entire surface of the vacuum chuck needs to be in contact with the upper surface of the semiconductor device 20, but air entering through the concave portion 23 lowers the degree of vacuum and hinders secure chucking.

SUMMARY OF THE INVENTION

A general object of the present invention is to provide a semiconductor device and a method of producing the same in which the above disadvantages are eliminated.

A more specific object of the present invention is to provide a semiconductor device which requires lower production costs, is shorter in height, and can be securely chucked.

The above objects of the present invention are achieved by a semiconductor device which comprises: a semiconductor chip; protrusion electrodes which function as external connecting terminals; an interposer which electrically connects the semiconductor chip to the protrusion electrodes; a mold resin which seals at least a part of the semiconductor chip and a part of the interposer; and a connecting portion sealing resin which seals the connecting portion between the interposer and the semiconductor chip. In this semiconductor device, the thermal expansion coefficient of the mold resin is matched to a thermal expansion coefficient of the printed circuit board, and the mold resin is provided with a side surface holding portion which holds side surfaces of the semiconductor chip so as to restrict thermal deformation of the semiconductor chip.

In this structure, the thermal expansion difference between the printed circuit board and the mold resin can be eliminated. Also, by restricting thermal deformation of the semiconductor chip by the side surface holding portion, thermal deformation of the semiconductor chip can be substantially equal to thermal deformation of the mold resin. Accordingly, the thermal expansion coefficient of the entire semiconductor device is substantially equal to the thermal expansion coefficient of the printed circuit board, and no thermal expansion difference exits between the semiconductor device and the printed circuit board. Thus, the bonding position of the semiconductor device and the printed circuit board can be protected from stresses caused by a temperature change of the semiconductor chip, thereby improving the mounting reliability. Since the mold resin, which is conventionally employed in a semiconductor device for sealing the semiconductor chip, also restricts thermal deformation of the semiconductor chip, stresses between the semiconductor device and the printed circuit board can be prevented without adding a new component. Thus, the semiconductor device can remain thin, and the mounting reliability can be improved.

In the above semiconductor device, the mold resin may be elastic, and be elastically deformed to absorb stresses caused by the thermal difference between the semiconductor chip and the printed circuit board.

The above objects of the present invention are also achieved by a semiconductor device production method which includes the steps of: disposing bonding members in predetermined positions on one or both of a semiconductor substrate and an interposer; cutting the semiconductor substrate into individual semiconductor chips; bonding the semiconductor chips to the interposer via the bonding members, so that electrode pads formed on the semiconductor chips are electrically connected to the interposer; molding a mold resin in an opening between each of the semiconductor chips and the interposer separated by one or both of the bonding members and sides of the semiconductor chip; and collectively cutting the mold resin and the interposer into individual semiconductor devices.

The above objects of the present invention are also achieved by a semiconductor device production method which includes the steps of: disposing a semiconductor substrate evenly on an expandable sheet member; cutting only the semiconductor substrate disposed on the sheet member into individual semiconductor chips; expanding the sheet member so as to elongate a distance between the semiconductor chips; disposing an interposer on the semiconductor chips so that the semiconductor chips are electrically connected to the interposer; forming a sealing resin in a connecting position between the interposer and each of the semiconductor chips and sides of each of the semiconductor chips; and collectively cutting the sealing resin and the interposer into individual semiconductor devices.

The above and other objects and features of the present invention will become more apparent from the following description taken in conjunction with the accompanying drawings.

BRIEF DESCRIPTION OF THE DRAWINGS

FIG. 27 shows evaluation results of semiconductor devices of a twenty-fourth embodiment and a twenty-fifth embodiment of the present invention;

FIGS. 50A and 50B illustrates clamp portions formed in the substrate;

FIGS. 54A and 54B show metal wires sealed by potting resin in the molding step;

FIG. 69 shows types of expandable sheet member suitable in the second example of the semiconductor device production method of the present invention.

DESCRIPTION OF THE PREFERRED EMBODIMENTS

The following is a description of embodiments of the present invention, with reference to the accompanying drawings.

Figure 3:
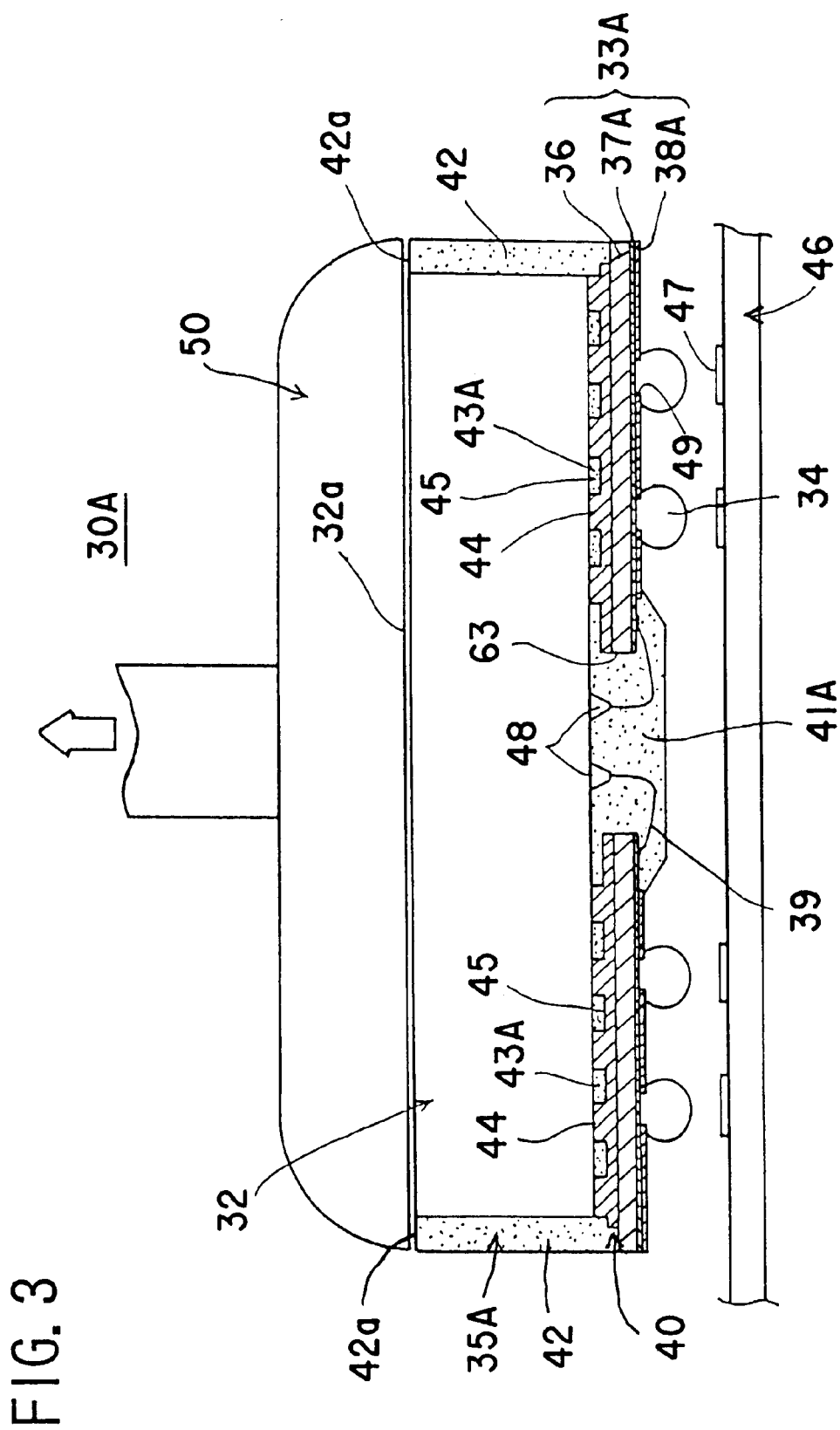
FIG. 3 is a sectional view of a semiconductor device of first and second embodiments of the present invention.

FIG. 3 is a sectional view of a semiconductor device 30A of a first embodiment. In this figure, for ease of explanation, a printed circuit board 46 is shown below the semiconductor device 30A, and a vacuum chuck 50 is shown above the semiconductor device 30A.

The semiconductor device 30A comprises a semiconductor chip 32, a wiring board 33A (hereinafter simply referred to as "substrate 33A"), protrusion electrodes (hereinafter referred to as "balls 34"), a mold resin 35A, a bonding member 40, and a connecting portion sealing resin 41A.

The semiconductor chip 32 is a memory chip such as a D-RAM, and is provided with electrode pads 48 in the center of its bottom surface. The semiconductor chip 32 is attached onto the substrate 33A with the bonding member 40.

When the semiconductor chip 32 is mounted, the circuit forming surface of the semiconductor chip 32 faces the substrate 33. in other words, the semiconductor chip 32 forms a face-down structure with the substrate 33A.

The substrate 33A functions as an interposer which electrically connects the semiconductor chip 32 and the balls 34. The substrate 33A comprises insulating resin tape 36, a wiring layer 37A, and a resist 38A, laminated in that order. The resin tape 36 is made of polyimide (the resin tape 36 will be hereinafter referred to as "PI tape 36"), and an opening 63 is formed in the position facing the electrode pads 48 of the semiconductor chip 32.

The wiring layer 37A is made of copper foil formed into a predetermined pattern. Metal wires 39 are bonded between the inner side of the wiring layer 37A and the electrode pads 48. The balls 34 are bonded to the other side of the wiring layer 37A.

When the metal wires 39 are disposed between the wiring layer 37A and the electrode pads 48, the metal wires 39 can be lower and shorter, because the semiconductor chip 32 and the substrate 33A form the face-down structure. Thus, the semiconductor device 30A can be made smaller and shorter in height, and the electric characteristics (especially the high-frequency characteristics) between the semiconductor chip 32 and the substrate 33A can be improved.

The resist 38A is an insulating resin having photosensitivity, and ball attachment holes 49 are formed in the bonding positions of the balls 34. The resist 38A is also removed from the bonding positions between the metal wires 39 and the wiring layer 37A. The resist 38A protects the wiring layer 37A.

The substrate 33A has the same structure as TAB (Tape Automated Bonding) tape, having the PI tape 36, the wiring layer 37A, and the resist 38A, laminated in that order. Thus, the substrate 33A having a high density can be formed so as to accommodate the small semiconductor device 30A and the multi-pinned semiconductor chip 32.

The balls 34, which are soldered balls, for instance, function as external connection terminals electrically and mechanically bonded to the printed circuit board 46. The balls 34 are bonded to the wiring layer 37A through the ball attachment holes 49 formed in the resist 38A, thereby electrically connecting the semiconductor chip 32 to the balls 34 via the metal wires 39 and the wiring layer 37A (the substrate layer 33A).

The bonding member 40 is made of thermoset resin. The surface of the bonding member 40 facing the substrate 33A is flat, while the surface facing the semiconductor chip 32 is uneven. More specifically, the surface of the bonding member 40 facing the semiconductor chip 32 is provided with convex portions 44 and concave interposing portions 45. The convex portions 44 are cylindrical or prismatic, and the portions other than the convex portions 44 are the interposing portions 45.

The bonding member 40 made of thermoset resin is given adhesive strength through a heating process. The smooth bottom surface of the bonding member 40 adheres to the substrate 33A, and the convex portions 44 of the uneven upper surface adheres to the semiconductor chip 32. The bonding member 40 is then cooled, so that the substrate 33A is fixed to the semiconductor chip 32 via the bonding member 40.

In this manner, the substrate 33A can be securely fixed to the semiconductor chip 32. In the fixed state, spaces are formed in the positions of the interposing portions 45 between the semiconductor chip 32 and the bonding member 40, because the convex portions 44 and the interposing portions 45 are formed on the surface of the bonding member 40 facing the semiconductor chip 32.

The mold resin 35A seals at least a part of the semiconductor chip 32 and a part of the substrate 33A so as to protect the semiconductor chip 32 and the substrate 33A. The connecting portion sealing resin 41A seals the connecting portions between the electrode pads 48 and the wiring layer 37A via the metal wires 39.

In this embodiment, the mold resin 35A and the connecting portion sealing resin 41A are integrally formed by a transfer molding method using the same metal mold. The collective formation of the mold resin 35A and the connecting portion sealing resin 41A reduces the cost of the metal mold and improves the efficiency of the molding process.

When the mold resin 35A and the connecting portion sealing resin 41A are transfer-molded with a metal mold, the metal is designed so that the mold resin 35A is formed around the side surfaces of the semiconductor chip 32. In the following description, the part of the mold resin 35A facing the side surfaces of the semiconductor chip 32 will be referred to as side surface protecting portion 42.

Since there are spaces formed in the positions of the interposing portions 45 between the semiconductor chip 32 and the bonding member 40, the mold resin 35A is injected into the interposing portion 45 during the molding process. In the following description, the mold resin 35A injected into the interposing portions 45 will be referred to as lower surface holding portions 43A.

The semiconductor device 30A is surface-mounted on the printed circuit board 46. The printed circuit board 46 is a resin substrate such as a printed wiring board, and the surface of the printed circuit board 46 is provided with electrodes 47 in the positions corresponding to the positions of the balls 34. After the semiconductor device 30A is placed on the printed circuit board 46 with the vacuum chuck 50, the balls 34 are bonded to the electrodes 47 by heating, so that the semiconductor chip 32 is mounted on the printed circuit board 46.

Figure 1:
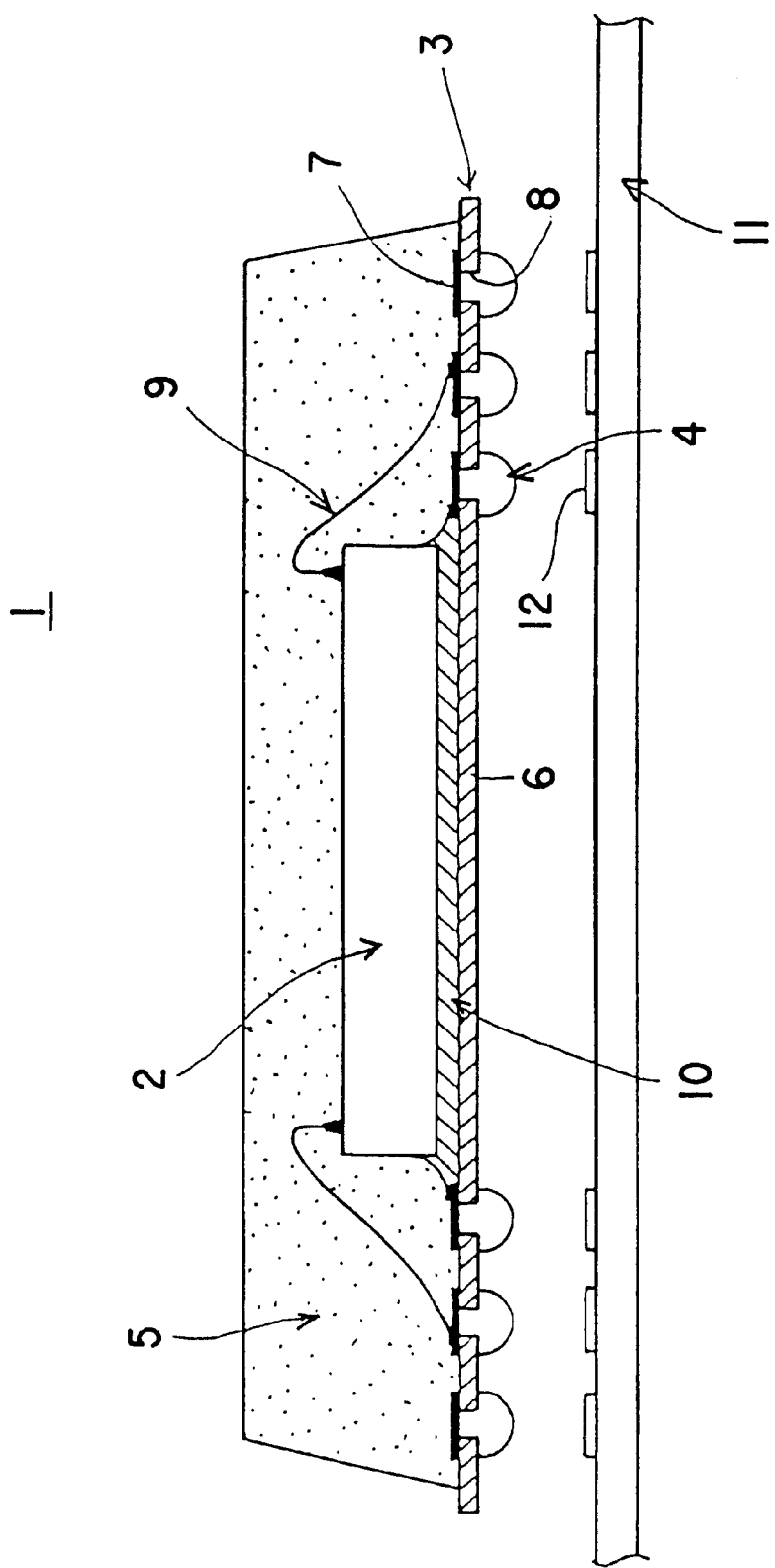
FIG. 1 illustrates a conventional semiconductor device.

In the semiconductor device 30A of this embodiment, heat is generated when the semiconductor chip 32 operates. Also, the semiconductor chip 32 and the printed circuit board 46 differ in thermal expansion coefficient. Because of this, as in the semiconductor device 1 (shown in FIG. 1) of the prior art, stress is caused in the bonding positions between the semiconductor device 30A (or the balls 34) and the printed circuit board 46, due to the thermal expansion difference between the semiconductor chip 32 and the printed circuit board 46.

To eliminate the above problem in the semiconductor device 30A of this embodiment, the thermal expansion coefficient of the mold resin 35A is matched to the thermal expansion coefficient of the printed circuit board 46. A printed wiring board used as the printed circuit board 46 normally has a thermal expansion coefficient of about 14 ppm. In this embodiment, the thermal expansion coefficient of the mold resin 35A is substantially the same as the thermal expansion coefficient of the printed circuit board 46.

The thermal expansion coefficient of the mold resin 35A can be controlled by the type and amount of filler mixed in the mold resin 35A. For instance, if epoxy resin is used as a base material of the mold resin 35A, the type and amount of filler are controlled so that the linear expansion coefficient is in the range of 10 to 20 ppm, and that the Young's modulus is in the range of 1000 to 3000 kg/mm$^2$.

In this manner, the thermal expansion coefficient of the mole resin 35A can be made substantially equal to the thermal expansion coefficient (about 14 ppm, for instance) of the printed circuit board 46. By matching the thermal expansion coefficient of the mold resin 35A to the thermal expansion coefficient of the printed circuit board 46, the thermal expansion difference between the printed circuit board 46 and the mold resin 35A can be eliminated.

In this embodiment, the mold resin 35A has the side surface holding portion 42 for holding the side surfaces of the semiconductor chip 32. Also, the lower surface holding portions 43A collectively formed with the side surface holding portion 42 are formed on the lower surface of the semiconductor chip 32.

The side surfaces and the lower surface of the semiconductor chip 32 are held by the mold resin 35A (the side surface holding portion 42 and the lower surface holding portions 43A), so that the semiconductor chip 32 can be prevented from being thermally deformed. Thus, the resin mold 35A restricts thermal deformation of the semiconductor chip 32.

The semiconductor chip 32 is only allowed thermal deformation within the range of the thermal deformation of the mold resin 35A, so that the thermal deformation of the semiconductor chip 32 can be equal to the thermal deformation of the mold resin 35A. Since the substrate 33A is also bonded to the mold resin 35A, the substrate 33A only allows thermal deformation within the range of the thermal deformation of the mold resin 35A.

In this embodiment, since the thermal expansion coefficient of the entire semiconductor device 30A is substantially equal to the thermal expansion coefficient of the printed circuit board 46, there is no thermal expansion difference between the semiconductor device 30A and the printed circuit board 46. Even if there is a temperature variation of the semiconductor chip 32, the bonding positions of the balls 34 can be prevented from being damaged by stress caused in the bonding positions between the semiconductor device 30A and the printed circuit board 46. Thus, the mounting reliability can be improved.

Also, the mold resin 35A not only seals and protects the semiconductor chip 32, but also restricts thermal deformation of the semiconductor chip 32. In this manner, no stress is caused between the semiconductor device 30A and the printed circuit board 46. Without adding a component for preventing stress, the mounting reliability can be improved, and the semiconductor device 30A can remain thin.

Figure 2:
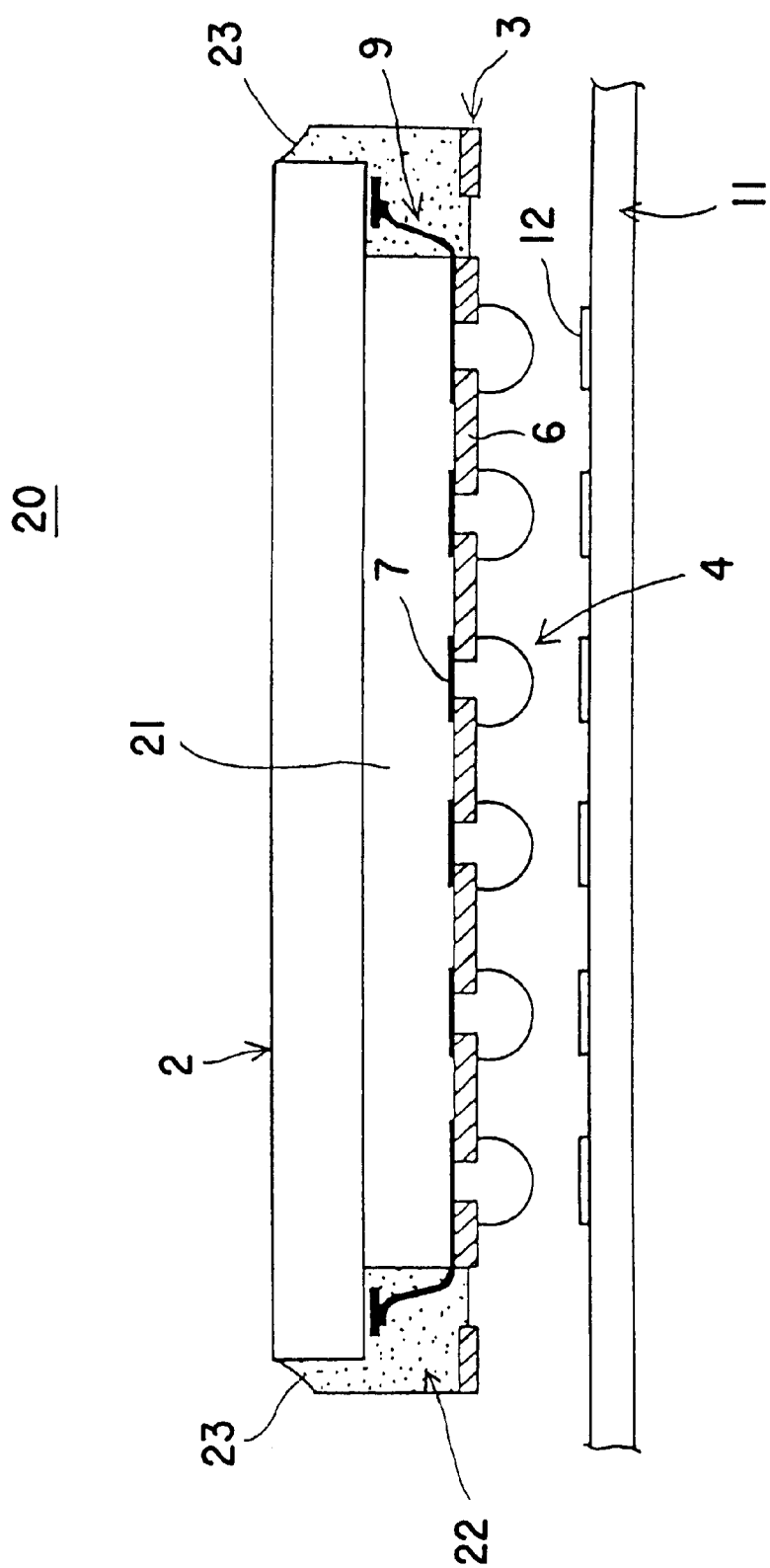
FIG. 2 illustrates another conventional semiconductor device.

Since the semiconductor device 30A of this embodiment is not provided with the buffer member 21 shown in FIG. 2, the mold resin 35A can be formed by a transfer molding method. The upper end surface 42a of the side surface holding portion 42 and the upper surface 32a of the semiconductor chip 32 can be easily formed on the same plane by the transfer molding method using a metal mold.

With the smooth upper surface (consisting of the upper end surface 42a and the chip upper surface 32a) of the semiconductor device 30A, the semiconductor device 30A can be transported by the vacuum chuck 50. Thus, the transportation process of the semiconductor device 30A can be easily and securely carried out.

Next, a second embodiment of the present invention will be described. A semiconductor device of the second embodiment is characterized by the mold resin, and the other components are the same as the components of the semiconductor device 30A shown in FIG. 3.

The semiconductor device 30A of this embodiment is characterized by elasticity of the mold resin 35A. It is easy to give elasticity to the mold resin 35A by controlling the type and amount of filler mixed into the mold resin 35A. The elastic modulus of the mold resin 35A is set at such a value that the stress caused by the thermal expansion difference between the semiconductor chip 32 and the printed circuit board 46 can be completely taken up.

The mold resin 35A is elastically deformed to take up the stress caused by the thermal expansion difference between the semiconductor chip 32 and the printed circuit board 46. Even if thermal deformation occurs in the semiconductor chip 32, the bonding position between the semiconductor device 30A and the printed circuit board 46 can be prevented from being damaged by the stress. Thus, the mounting reliability can be improved.

In this embodiment, the mold resin 35A not only seals and protects the semiconductor chip 32, but also takes up thermal deformation of the semiconductor chip 32. As in the first embodiment, stress between the semiconductor device 30A and the printed circuit board 46 can be prevented, without adding a new component. Thus, the mounting reliability can be improved, while the semiconductor device 30A can remain thin.

The elastic mold resin 35A is interposed between the side surface holding portion 42 and the connecting portion sealing resin 41A, so that the mold resin 35A can also be disposed on the surface of the semiconductor chip 32 facing the substrate 33A. Thus, the mold resin 35A can take up thermal deformation of the semiconductor chip 32 with more certainty.

The bonding member 40 is also made of a material having a high elastic modulus, so that less stress is caused between the semiconductor device 30A and the printed circuit board 46.

Figure 4:
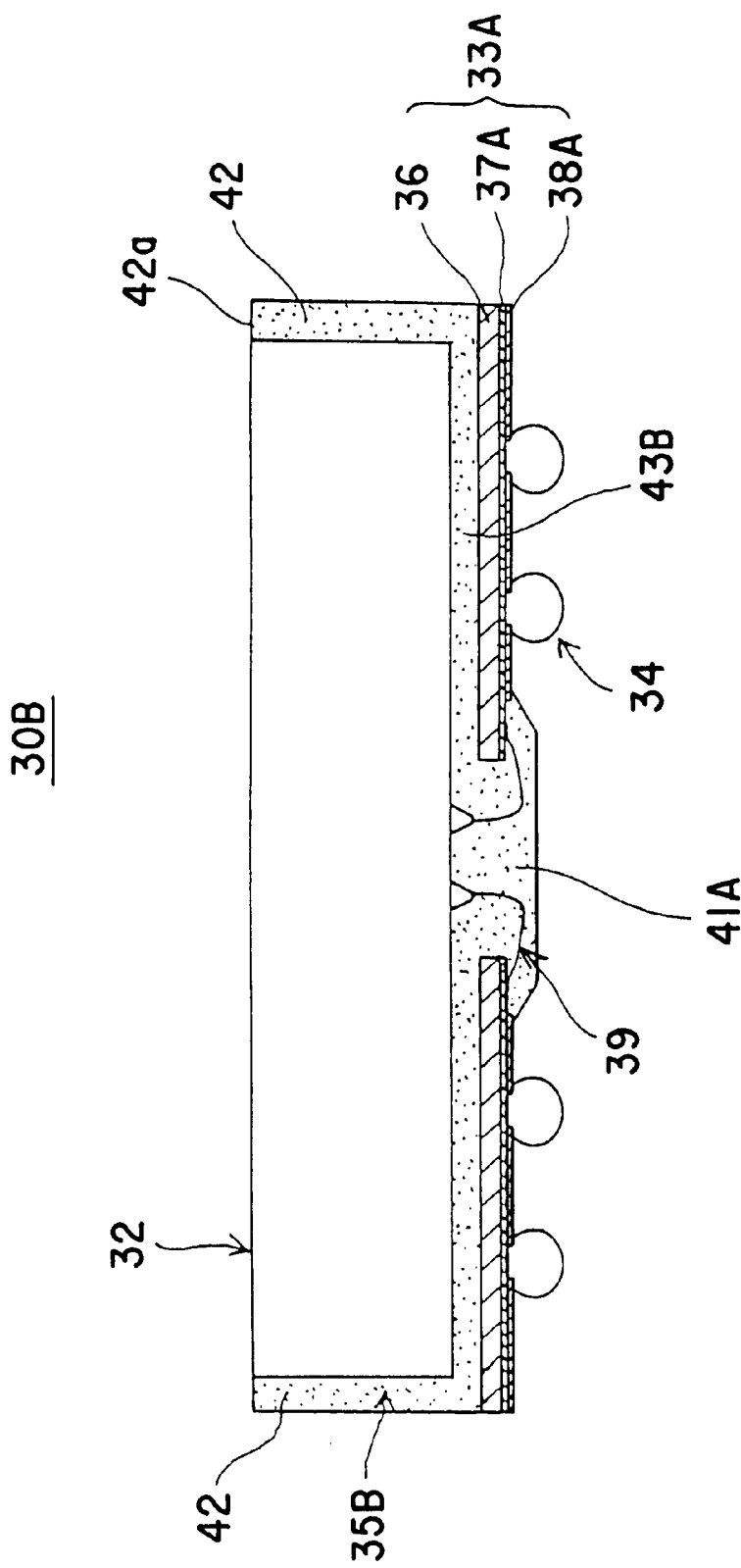
FIG. 4 is a sectional view of a semiconductor device of a third embodiment of the present invention.

FIG. 4 illustrates a semiconductor device 30B of a third embodiment of the present invention. In FIG. 4, the same components as in the first and second embodiments shown in FIG. 3 are indicated by the same reference numerals. This also applies to the other embodiments shown in FIGS. 5 to 22.

The semiconductor device 30B of the third embodiment is the same as the semiconductor device 30A of the first and second embodiments, except that the bonding member 40 is eliminated. The substrate 33A is bonded and secured to the semiconductor chip 32 through a lower surface holding portion 43B which is a part of a mold resin 35B.

Without the bonding member 40, thermal deformation of the semiconductor chip 32 can be restricted, and stress between the semiconductor device 30B and the printed circuit board can be taken up. Also, the number of components can be reduced, thereby lowering the production costs and simplifying the production procedures of the semiconductor device 30B.

Figure 5:
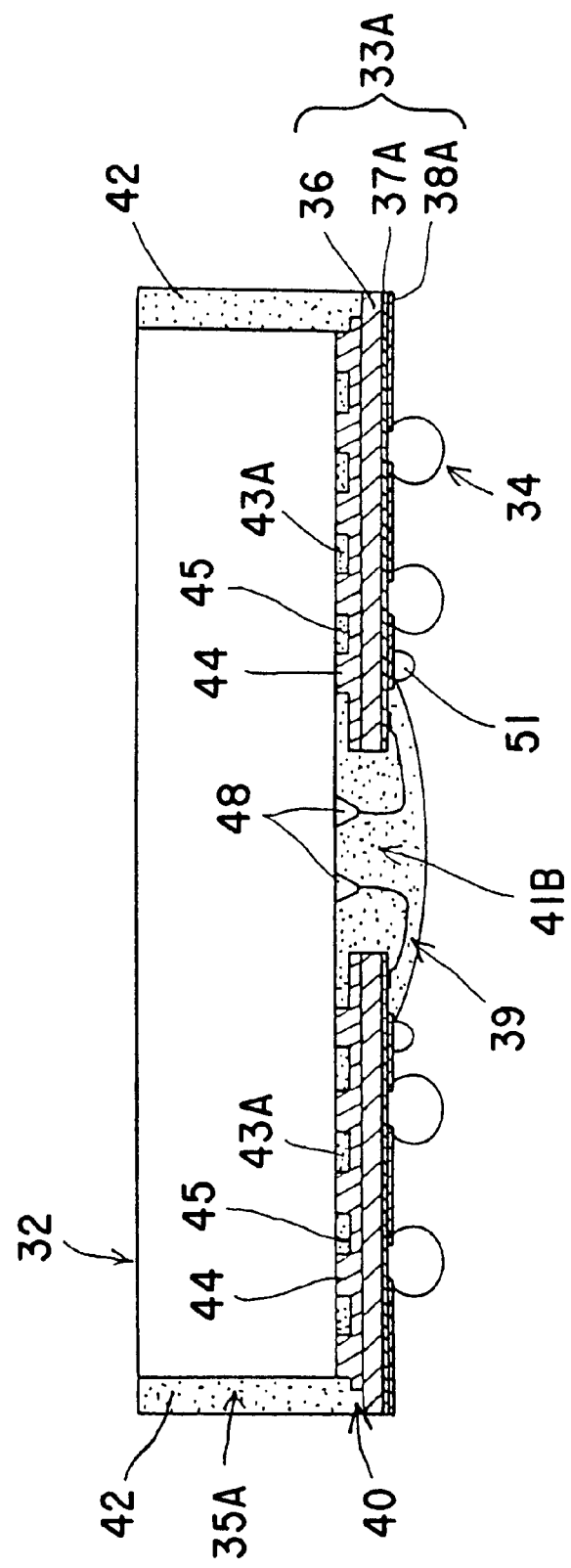
FIG. 5 is a sectional view of a semiconductor device of a fourth embodiment of the present invention.

FIG. 5 illustrates a semiconductor device 30C of a fourth embodiment of the present invention. In the semiconductor devices 30A and 30B of the first to third embodiments, the connecting portion sealing resin 41A for sealing and protecting the connecting portions between the electrode pads and the wiring layer 37A via the metal wires 39 is formed by the transfer molding method. On the other hand, the semiconductor device 30C of this embodiment is characterized by forming a connecting portion sealing resin 41B by potting.

To form the connecting portion sealing resin 41A by the transfer molding method as in the first to third embodiments, it is necessary to provide the metal mold with a cavity in a shape corresponding to the shape of the connecting portion sealing resin 41A. In the fourth embodiment, on the other hand, the connecting portion sealing resin 41B is formed by potting, thereby eliminating the need to provide the metal mold with the cavity having the shape corresponding to the shape of the connecting portion sealing resin 41B. As a result, the cost of the metal mold is reduced, and the production costs of the semiconductor device 30C are reduced accordingly.

In the semiconductor device 30C of this embodiment, the substrate 33A (or the resist 38A) is provided with a dam 51 for preventing potting resin from flowing to the balls 34 during the potting process.

Figure 6:
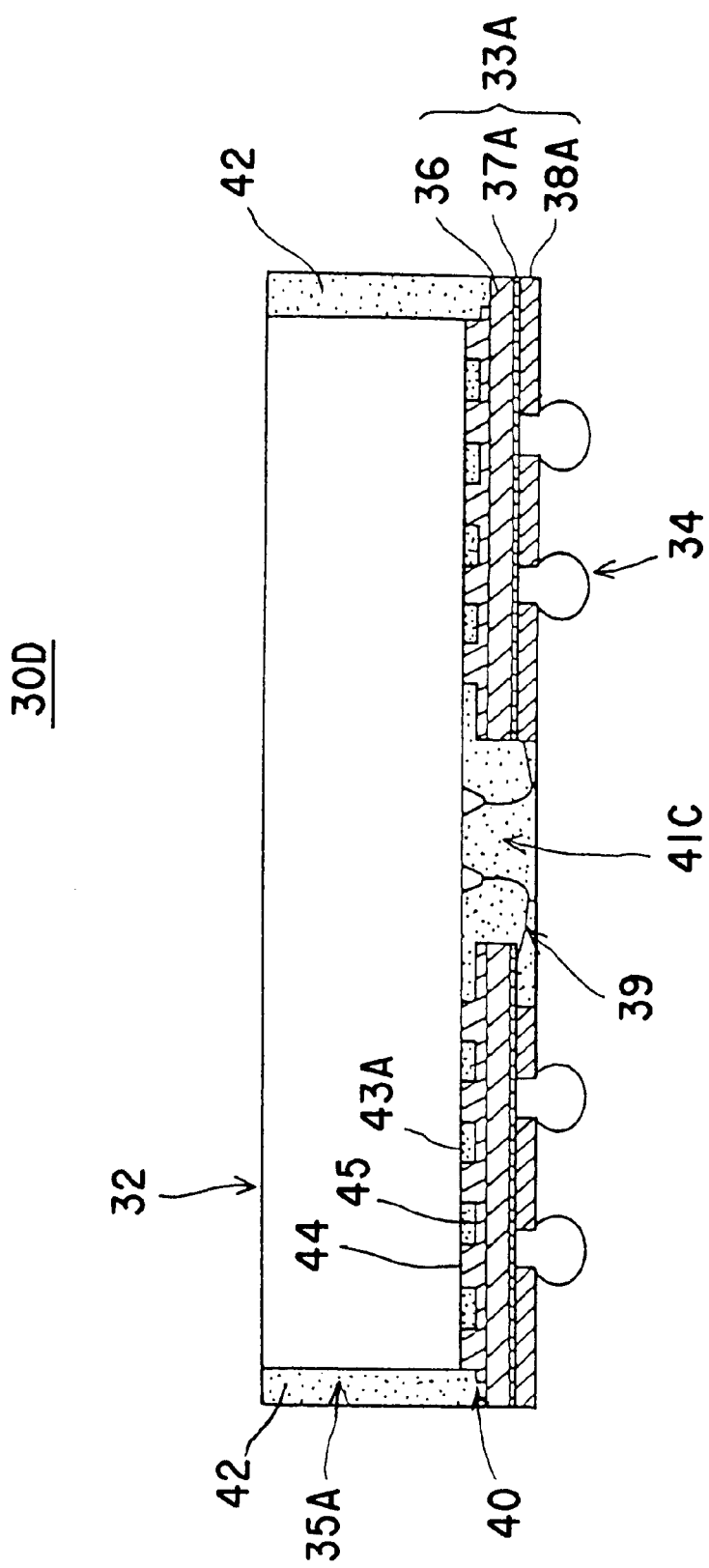
FIG. 6 is a sectional view of a semiconductor device of a fifth embodiment of the present invention.

FIG. 6 illustrates a semiconductor device 30D of a fifth embodiment of the present invention. The semiconductor device 30D of this embodiment is characterized by a connecting portion sealing resin 41C formed by a screen printing method.

The connecting portion sealing resin 41C formed by the screen printing method eliminates the need to provide the metal mold with a cavity having a shape corresponding to the shape of the connecting portion sealing resin 41C. Thus, the cost of the metal mold is lowered, and the production costs of the semiconductor device 30D can be reduced accordingly.

Figure 7:
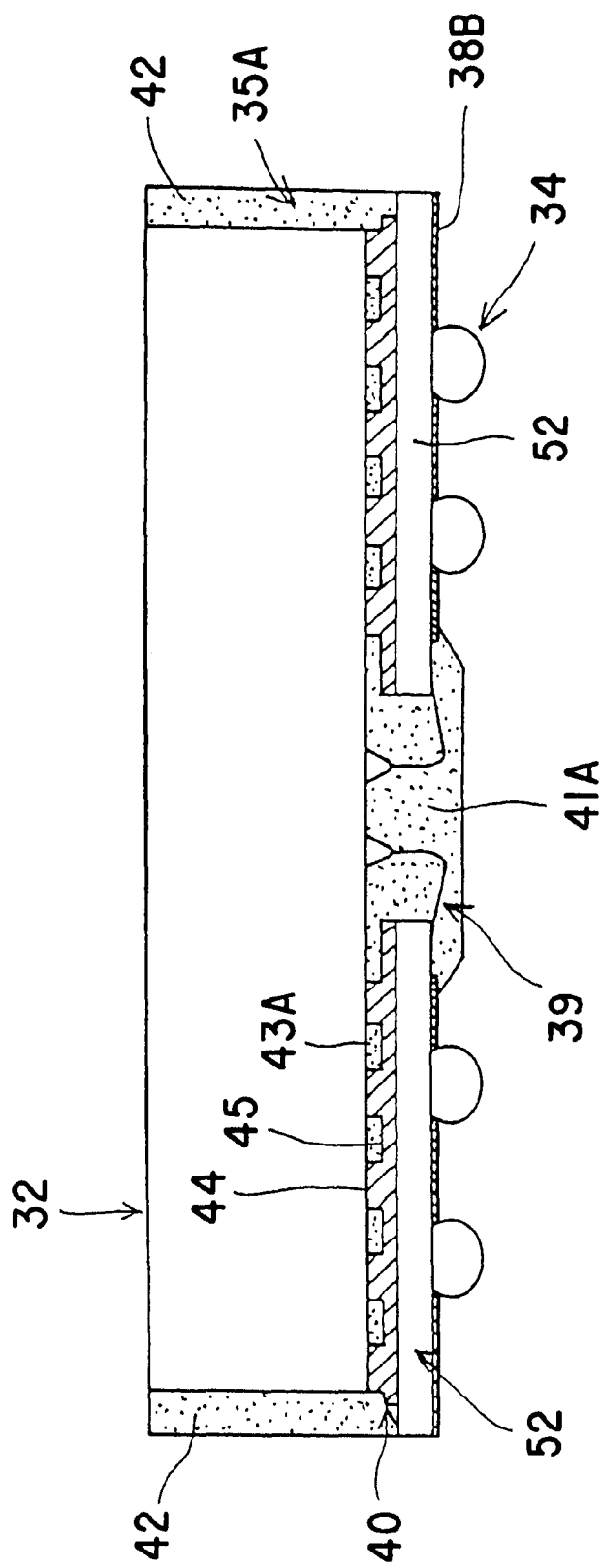
FIG. 7 is a sectional view of a semiconductor device of a sixth embodiment of the present invention.

FIG. 7 illustrates a semiconductor device 30E of a sixth embodiment of the present invention. In the semiconductor devices 30A to 30C of the first to fourth embodiments, the substrate 33A having a layered structure including the PI tape 36, the wiring layer 37A, and the resist 38A, is employed as an interposer. In the semiconductor device 30E of the sixth embodiment, on the other hand, a lead member 52 is employed as an interposer.

The lead member 52 is formed by cutting a lead frame into a predetermined shape. The lead frame is made of a lead frame material, such as 42 alloy (iron-nickel alloy) or copper alloy. This technique of producing a semiconductor device using a lead frame is generally used in producing semiconductor devices of a DIP (Dual Inline Package) type and QFP (Quad Flat Package) type.

Such a conventional technique can be used in producing the semiconductor device 30E, because the lead member 52 is used as the interposer. Thus, the semiconductor device 30E can be produced with conventional equipment, and the production costs can be lowered accordingly.

The lead frame material is cheaper than the material used for the substrate 33A of the first to fifth embodiments, thereby further lowering the production costs of the semiconductor device 30E. Also, since the lead material 52 is harder than the substrate 33A, the stability and the reliability in wire bonding of the metal wires 39 can be improved.

Figure 8:
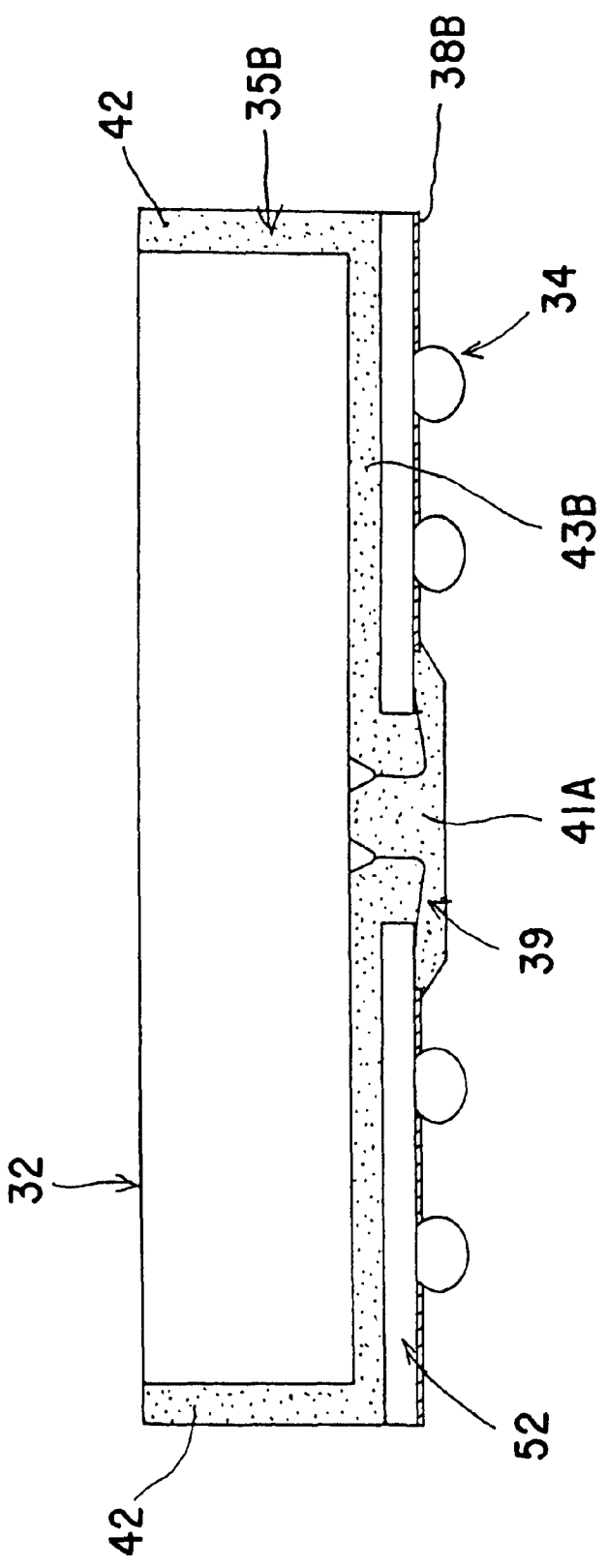
FIG. 8 is a sectional view of a semiconductor device of a seventh embodiment of the present invention.

FIG. 8 illustrates a semiconductor device 30F of a seventh embodiment of the present invention. The semiconductor device 30F of this embodiment is the same as the semiconductor device 30E of the sixth embodiment shown in FIG. 7, except that the bonding member 40 is eliminated in the semiconductor device 30F.

Like the semiconductor device 30B of the third embodiment shown in FIG. 4, the semiconductor device 30F of this embodiment has a smaller number of components. Besides the effects mentioned in the description of the sixth embodiment, this embodiment has effects of lowering the production costs and simplifying the production procedures.

Figure 9:
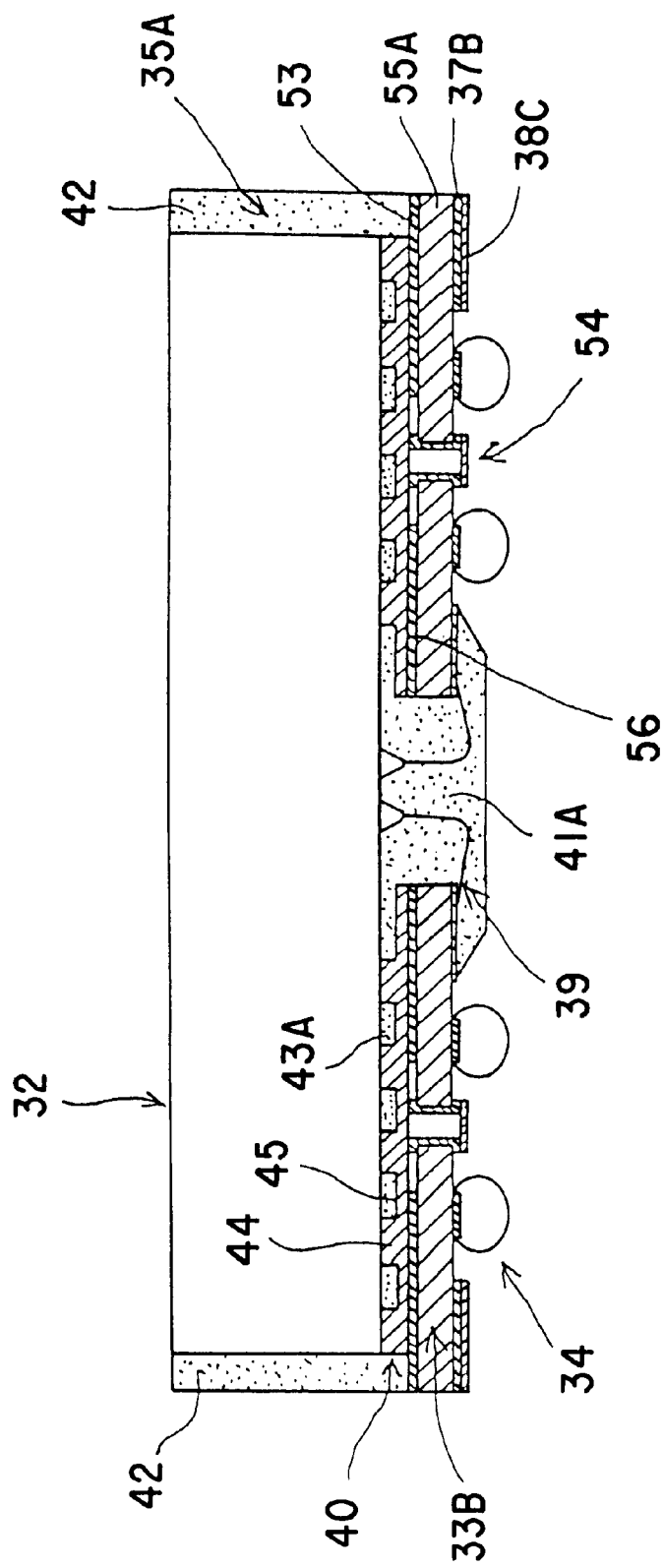
FIG. 9 is a sectional view of a semiconductor device of an eighth embodiment of the present invention.

FIG. 9 illustrates a semiconductor device 30G of an eighth embodiment of the present invention. The semiconductor device 30G is characterized by a substrate 33B made of an organic material as an interposer.

The substrate 33B has a base material 55A made of an organic material such as glass-epoxy. A ground pattern 53 is formed on the upper surface (facing the semiconductor chip 32) of the base material 55A, and a wiring layer 37B having a predetermined pattern is formed on the lower surface (the mounting surface) of the base material 55A. A resist 38C covers and protects the wiring layer 37B.

At least one ground via 54 for connecting the ground pattern 53 to the wiring layer 37B is formed in a predetermined position of the substrate 33B. The ground via 54 (which may also be a signal via) improves the degree of freedom in pulling around wires of the substrate 33B, thereby simplifying the designing of the pattern.

Furthermore, a wire bonding strengthening pattern 56 (hereinafter referred to as "W/B strengthening pattern") is formed in a predetermined position on the upper surface of the base material 55A. The position of the W/B strengthening pattern 56 is opposite to the bonding position between the metal wires 39 and the wiring layer 37B.

As is well known, ultrasonic wire bonding is performed to bond the metal wires 39. However, if the hardness of the substrate at the bonding point of the metal wires 39 is not high enough, desired ultrasonic wire bonding cannot be performed due to vibration of the substrate. To avoid this, the W/B strengthening pattern 56 is formed to reinforcing the wire bonding position of the metal wires 39 in this embodiment. Thus, reliable wire bonding can be performed.

Figure 10:
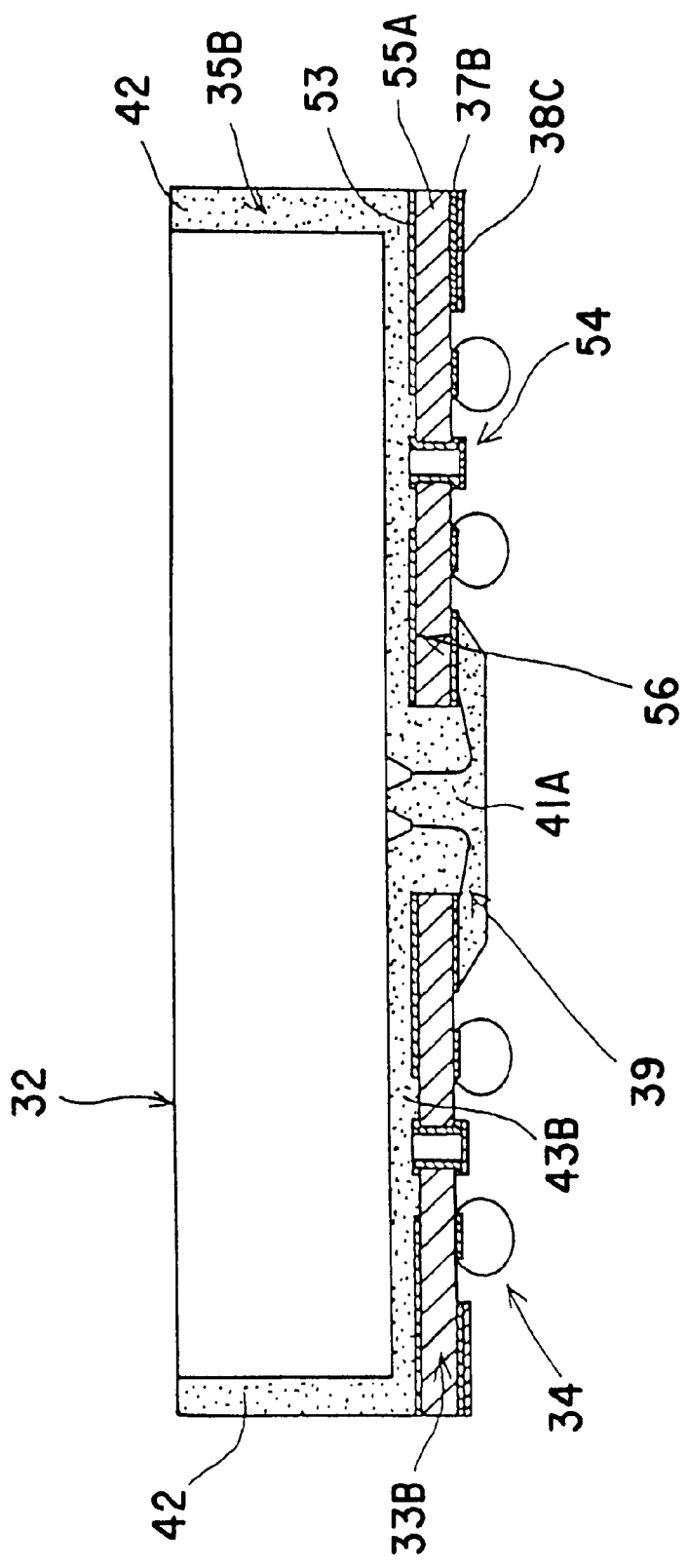
FIG. 10 is a sectional view of a semiconductor device of a ninth embodiment of the present invention.

FIG. 10 illustrates a semiconductor device 30H of a ninth embodiment of the present invention. The semiconductor device 30H is the same as the semiconductor device 30G of the eighth embodiment shown in FIG. 9, except that the bonding member 40 is eliminated from the semiconductor device 30H.

The semiconductor device 30H of this embodiment has a smaller number of components. Besides the effects mentioned in the description of the eighth embodiment, the ninth embodiment has effects of lowering the production costs and simplifying the production procedures of the semiconductor device 30H.

Figure 11:
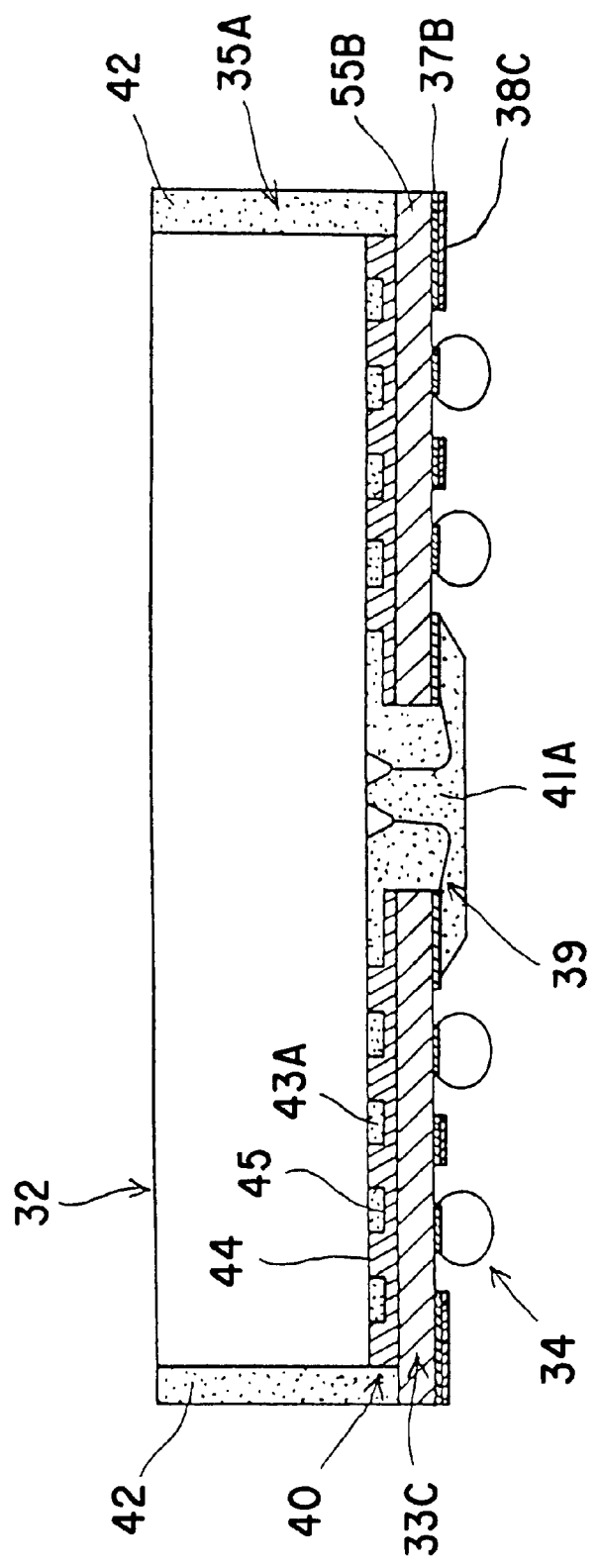
FIG. 11 is a sectional view of a semiconductor device of a tenth embodiment of the present invention.

FIG. 11 illustrates a semiconductor device 30I of a tenth embodiment of the present invention. The semiconductor device 30I of this embodiment has a substrate 33C made of an organic material as an interposer as in the eighth and ninth embodiments. This embodiment is characterized in that the wiring layer 37B is formed only on the lower surface (the mounting surface) of the substrate 33C.

More specifically, the substrate 33C has a base material 55B made of an organic material such as glass-epoxy. The wiring layer 37B is formed on the lower surface (the mounting surface).of the base material 55B in a predetermined pattern. The resist 38C covers and protects the wiring layer 37B.

As is apparent from the embodiments described so far, various types of substrate or lead material can be used as an interposer which electrically connects the semiconductor chip 32 and the balls 34.

Figure 12:
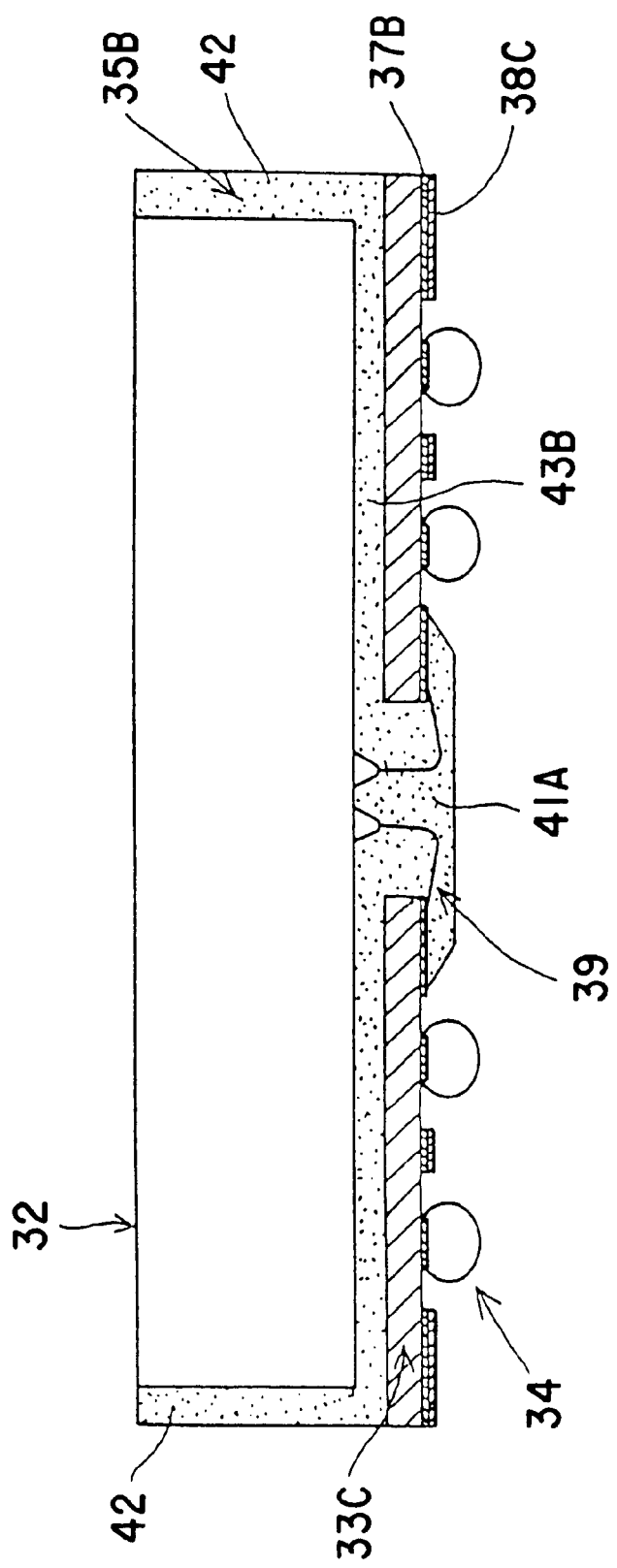
FIG. 12 is a sectional view of a semiconductor device of an eleventh embodiment of the present invention.

FIG. 12 illustrates a semiconductor device 30J of an eleventh embodiment of the present invention. The semiconductor device 30J is substantially the same as the semiconductor device 30I of the tenth embodiment shown in FIG. 11, except that the bonding member 40 is eliminated from the semiconductor device 30J.

The semiconductor device 30J has a smaller number of components than the semiconductor device 30I of the tenth embodiment. The production costs of the semiconductor device 30J are lower than those of the semiconductor device 30I, and the production procedures are simpler in this embodiment than in the tenth embodiment.

Figure 13:
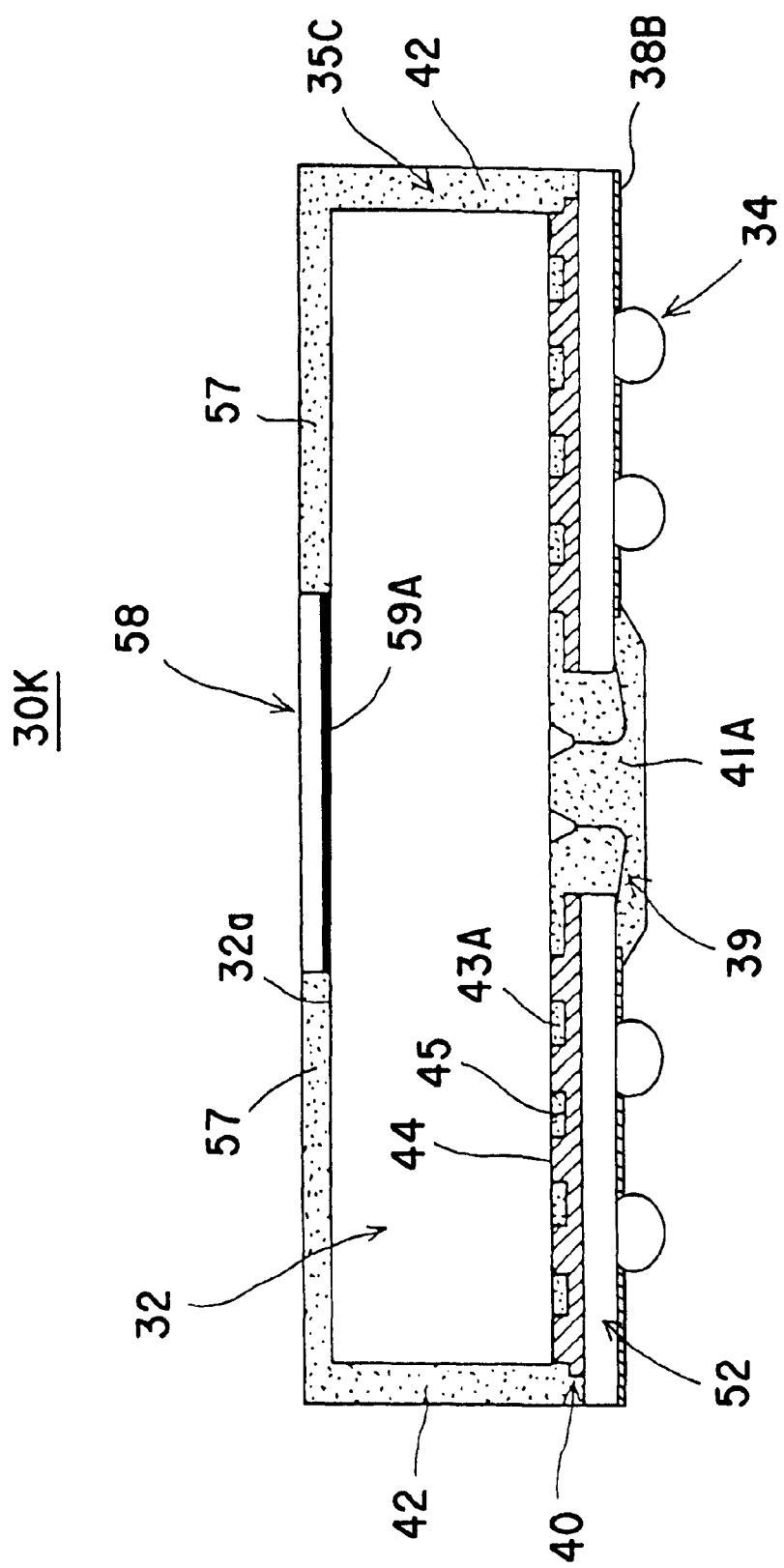
FIG. 13 is a sectional view of a semiconductor device of a twelfth embodiment of the present invention.

FIG. 13 illustrates a semiconductor device 30K of a twelfth embodiment of the present invention. The semiconductor device 30K has the lead material 52 as the interposer as in the sixth embodiment shown in FIG. 7. This embodiment is characterized in that a holding lead member 58 is also formed on a chip upper surface 32a of the semiconductor chip 32. In other words, the semiconductor device 30K of this embodiment is sandwiched by the lead members 52 and 58. The holding lead member 58 is bonded to the semiconductor chip 32 through a bonding layer 59A.

The holding lead member 58 formed on the chip upper surface 32a of the semiconductor chip 32 secures the semiconductor chip 32 in the metal mold while the mold resin 35C is transfer-molded with precision. Thus, the formation precision of the side surface holding portion 42 can be improved, and thermal deformation of the semiconductor chip 32 can be surely restricted.

In the semiconductor device 30K of this embodiment, the mold resin 35C also covers the chip upper surface 32a of the semiconductor chip 32, so that thermal deformation of the semiconductor chip 32 can be surely restricted. In FIG. 13, the part of the mold resin 35C covering the chip upper surface 32a is referred to as an upper holding portion 57.

With the upper holding portion 57 formed on the chip upper surface 32a, the semiconductor chip 32 is entirely sealed by the mold resin 35C. Thus, moisture can be prevented from entering the semiconductor device 30K (through the interface between the semiconductor device 32 and the mold resin 35C), and excellent moisture resistance can be maintained in the semiconductor device 30K.

Figure 14:
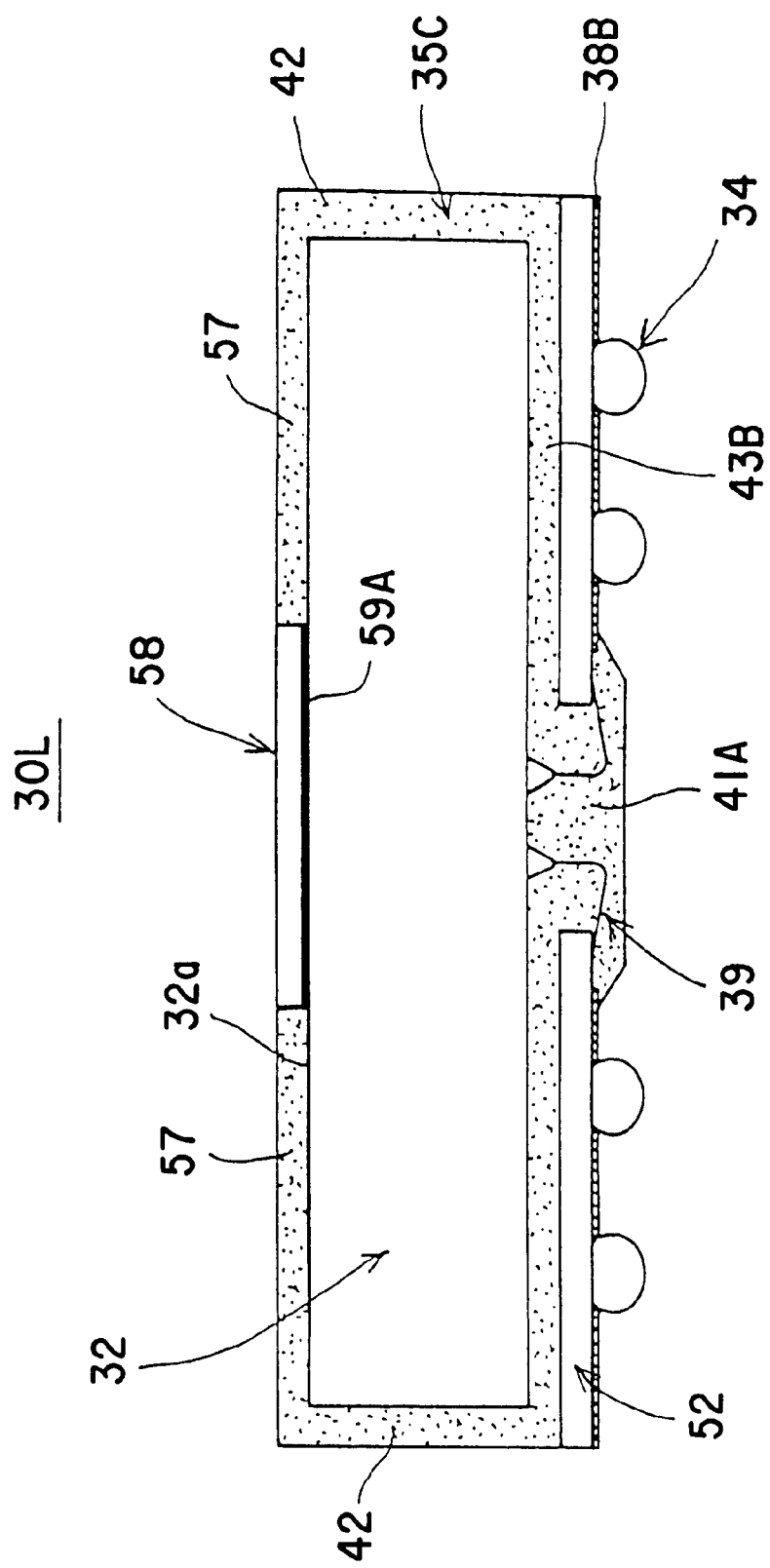
FIG. 14 is a sectional view of a semiconductor device of a thirteenth embodiment of the present invention.

FIG. 14 illustrates a semiconductor device 30L of a thirteenth embodiment of the present invention. The semiconductor device 30L is substantially the same as the semiconductor device 30K of the twelfth embodiment shown in FIG. 13, except that the bonding member 40 is eliminated from the semiconductor device 30L.

The semiconductor device 30L has a smaller number of components than the semiconductor device 30K of the twelfth embodiment. The production costs of the semiconductor device 30L are lower than those of the semiconductor device 30K, and the production procedures are simpler in this embodiment than in the twelfth embodiment.

Figure 15:
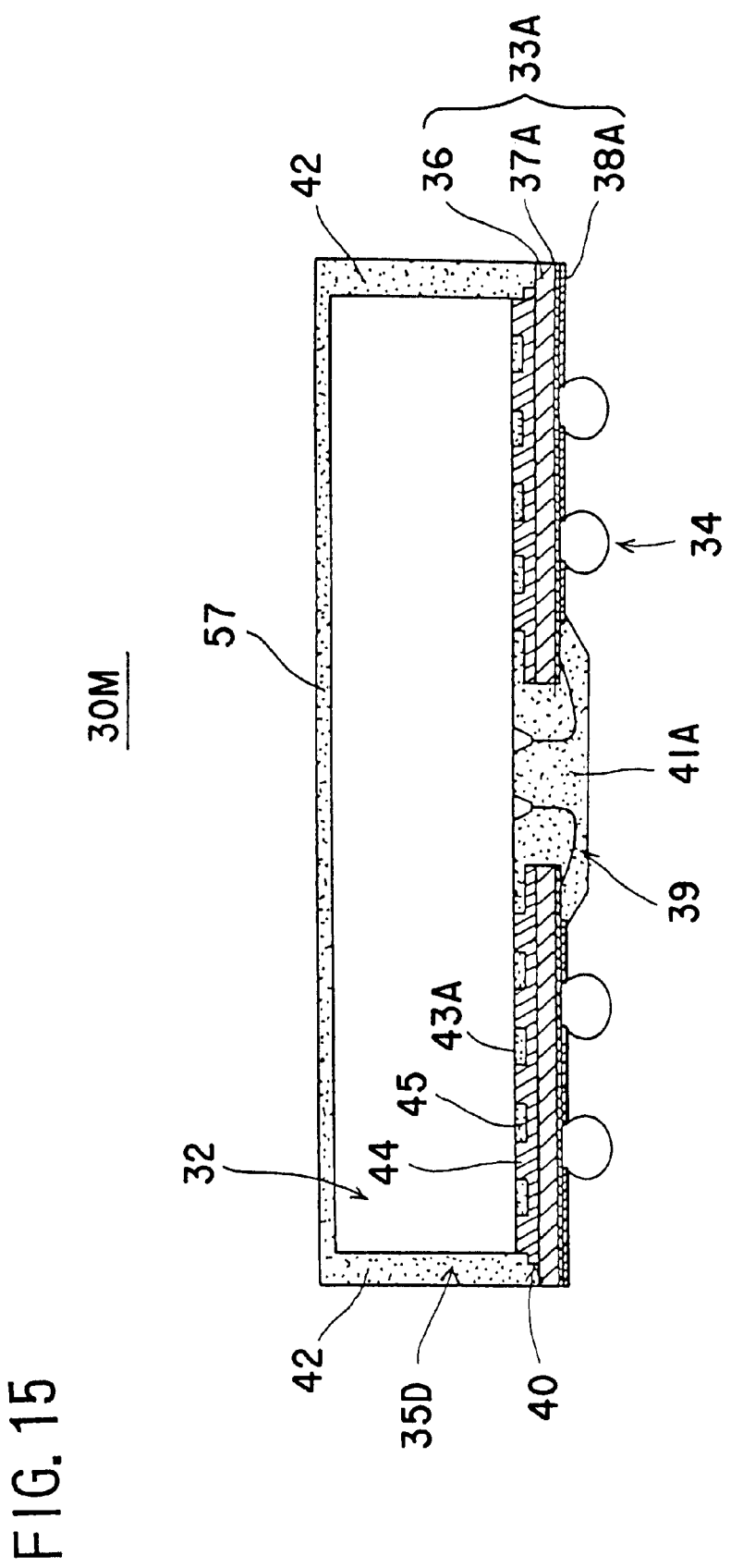
FIG. 15 is a sectional view of a semiconductor device of a fourteenth embodiment of the present invention.

FIG. 15 illustrates a semiconductor device 30M of a fourteenth embodiment of the present invention. The semiconductor device 30M of this embodiment is characterized by a mold resin 35D which covers the entire outer surface of the semiconductor chip 32.

By sealing the entire outer surface of the semiconductor chip 32 with the mold resin 35D, thermal deformation of the semiconductor chip 32 can be surely restricted, as in the semiconductor devices 30K and 30L of the twelfth and thirteenth embodiments of the present invention.

In the twelfth and thirteenth embodiments of the present invention, there is a possibility that moisture might enter the semiconductor device through the interface between the holding lead member 58 and the upper holding portion 57, due to the holding lead member 58 formed on the chip upper surface 32a. To avoid this, the mold resin 35D seals the entire surface of the semiconductor chip 32 in the semiconductor device 30M of this embodiment. Thus, the semiconductor device 30M can be surely protected from moisture to maintain excellent moisture resistance.

Figure 16:
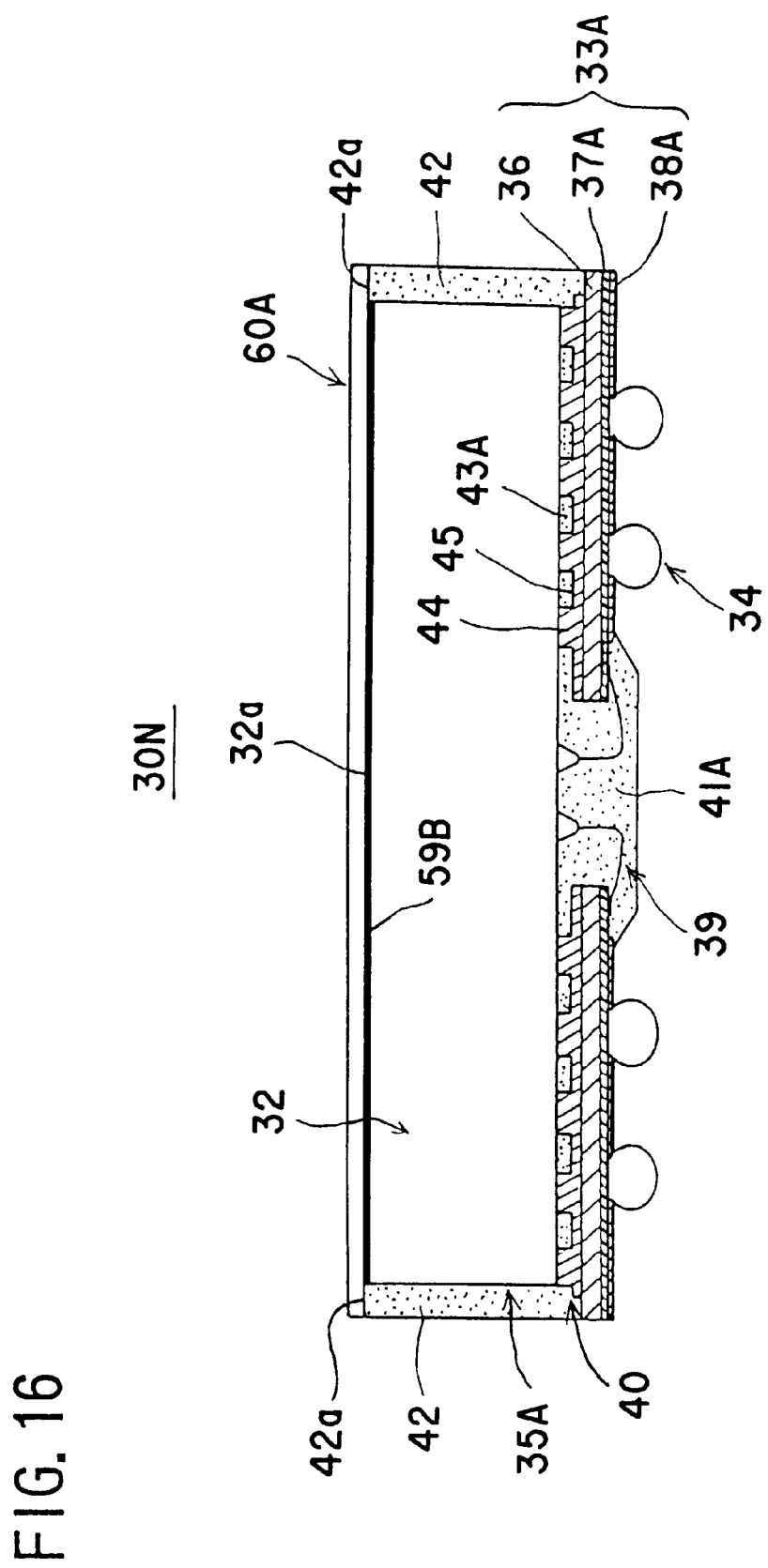
FIG. 16 is a sectional view of a semiconductor device of a fifteenth embodiment of the present invention.

FIG. 16 illustrates a semiconductor device 30N of a fifteenth embodiment of the present invention. The semiconductor device 30N of this embodiment is substantially the same as the semiconductor device 30A of the first embodiment shown in FIG. 1, except that a heat plate 60A is disposed as a heat radiation member on the chip upper surface 32a of the semiconductor chip 32.

As described before, the upper end surface 42a of the mold resin 35A is formed by the transfer molding method on the same plane as the chip upper surface 32a of the semiconductor chip 32. Accordingly, the heat plate 60A has a flat surface. Since there is no need to perform a molding process for the heat plate 60A, the heat plate 60A can be inexpensive. The heat plate 60A is bonded to the semiconductor chip 32 with a bonding layer 59B.

In this embodiment, the heat plate 60A formed on the chip upper surface 32a of the semiconductor chip 32 enhances efficient heat radiation from the semiconductor chip 32. Thus, a temperature rise of the semiconductor chip 32, which causes stress between the semiconductor device 30N and the printed circuit board 46, can be restricted.

With the structure of this embodiment, the stress caused between the semiconductor device 30N and the printed circuit board 46 can be lowered. In this embodiment, the bonding positions of the balls 34 can be prevented from being damaged by the stress, and the mounting reliability can be further improved.

Figure 17:
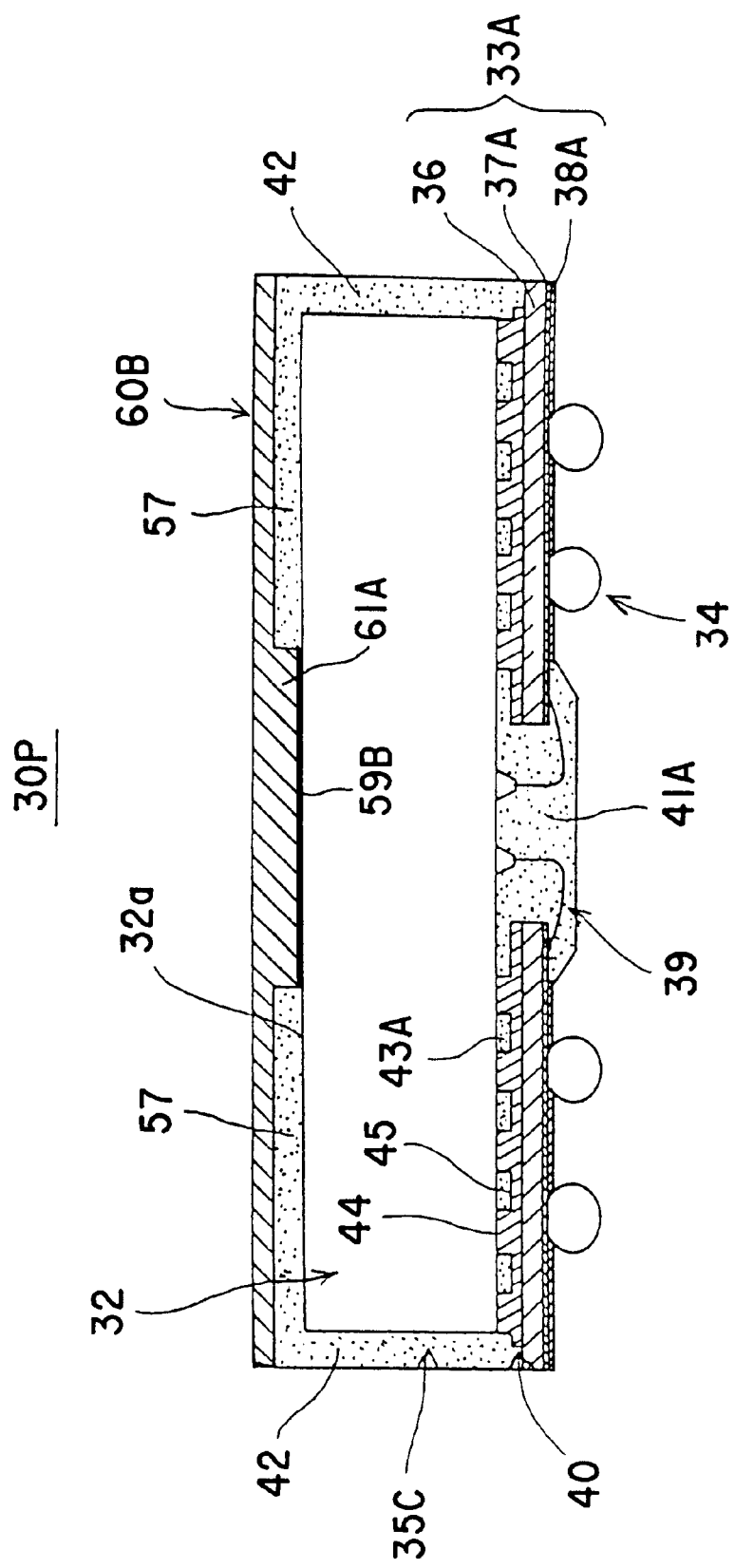
FIG. 17 is a sectional view of a semiconductor device of a sixteenth embodiment of the present invention.

FIG. 17 illustrates a semiconductor device 30P of a sixteenth embodiment of the present invention. Like the semiconductor device 30N of the fifteenth embodiment shown in FIG. 16, the semiconductor device 30P of this embodiment is provided with a heat plate 60B which functions as a heat raleasing member formed on the semiconductor chip 32.

In the semiconductor device 30N of the fifteenth embodiment, the heat plate 60A is disposed directly on the chip upper surface 32a of the semiconductor chip 32. In the semiconductor device 30P of the sixteenth embodiment, on the other hand, the upper holding portion 57 (the mold resin 35C) is interposed between the heat plate 60B and the chip upper surface 32a.

The heat plate 60B has a protrusion 61A which protrudes toward the semiconductor chip 32. The protrusion 61A is bonded to the semiconductor chip 32 with the bonding layer 59B. Heat generated in the semiconductor chip 32 is released from the entire surface of the heat plate 60B via the protrusion 61A. In this embodiment, the stress caused between the semiconductor device 30P and the printed circuit board 46 can be reduced, and the mounting reliability can be improved.

As the upper holding portion 57 (the mold resin 35C) is disposed on the chip upper surface 32a in the semiconductor device 30P, the mold resin 35C seals the entire surface of the semiconductor chip 32. Thus, the semiconductor device 30P can be protected from moisture to maintain excellent moisture resistance.

Figure 18:
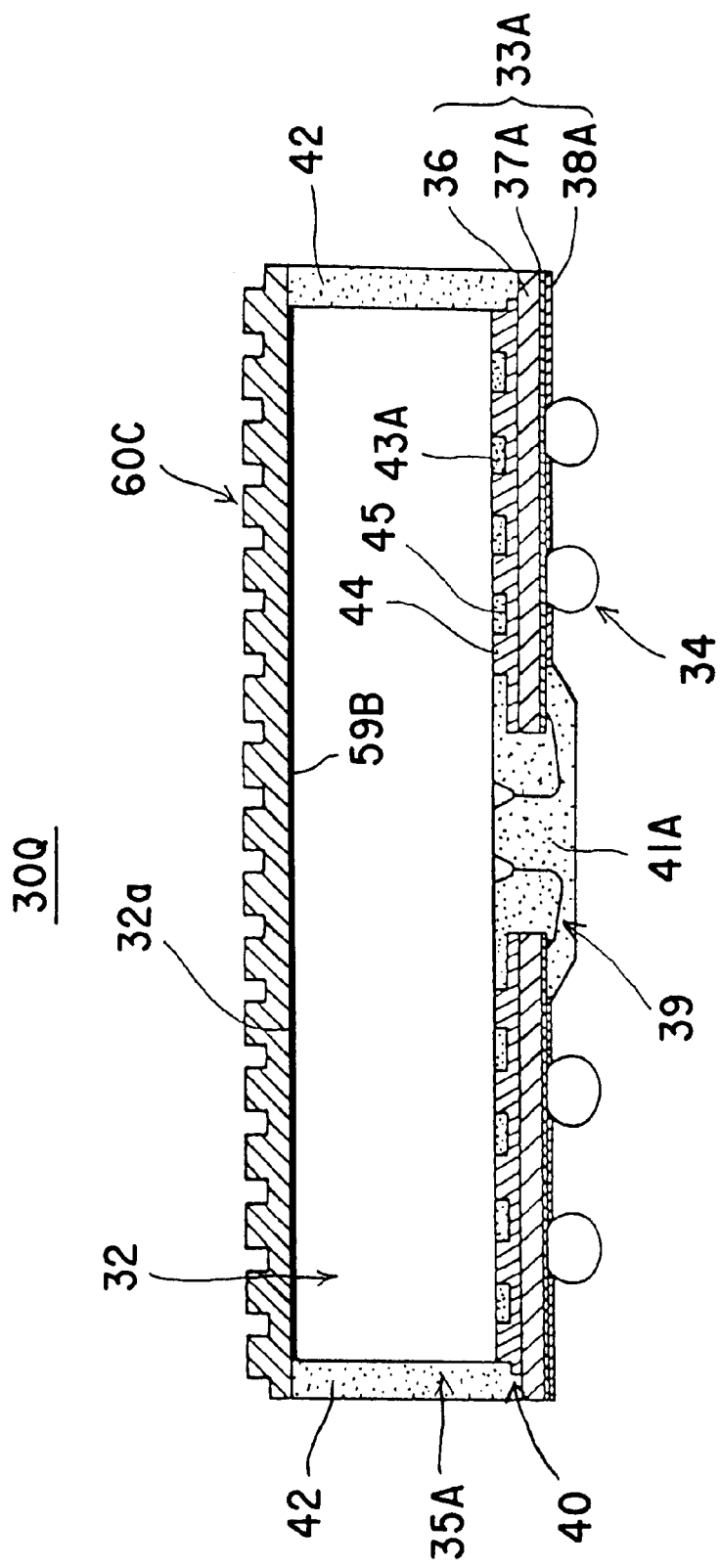
FIG. 18 is a sectional view of a semiconductor device of a seventeenth embodiment of the present invention.

FIG. 18 illustrates a semiconductor device 30Q of a seventeenth embodiment of the present invention. The semiconductor device 30Q of this embodiment are the same as the semiconductor device 30N of the fifteenth embodiment shown in FIG. 16 in that a heat plate 60C which functions as a heat releasing member is disposed on the chip upper surface 32a of the semiconductor chip 32.

In the semiconductor device 30N of the fifteenth embodiment, the heat plate 60A has a flat surface. In this embodiment, on the other hand, the heat plate 60C has concavities and convexities, so that a wider area can be cooled to improve the radiation properties.

As the heat in the semiconductor chip 32 can be more efficiently released, the stress caused between the semiconductor device 33Q and the printed circuit board 46 can be further reduced, and the mounting reliability can be further improved.

Figure 19:
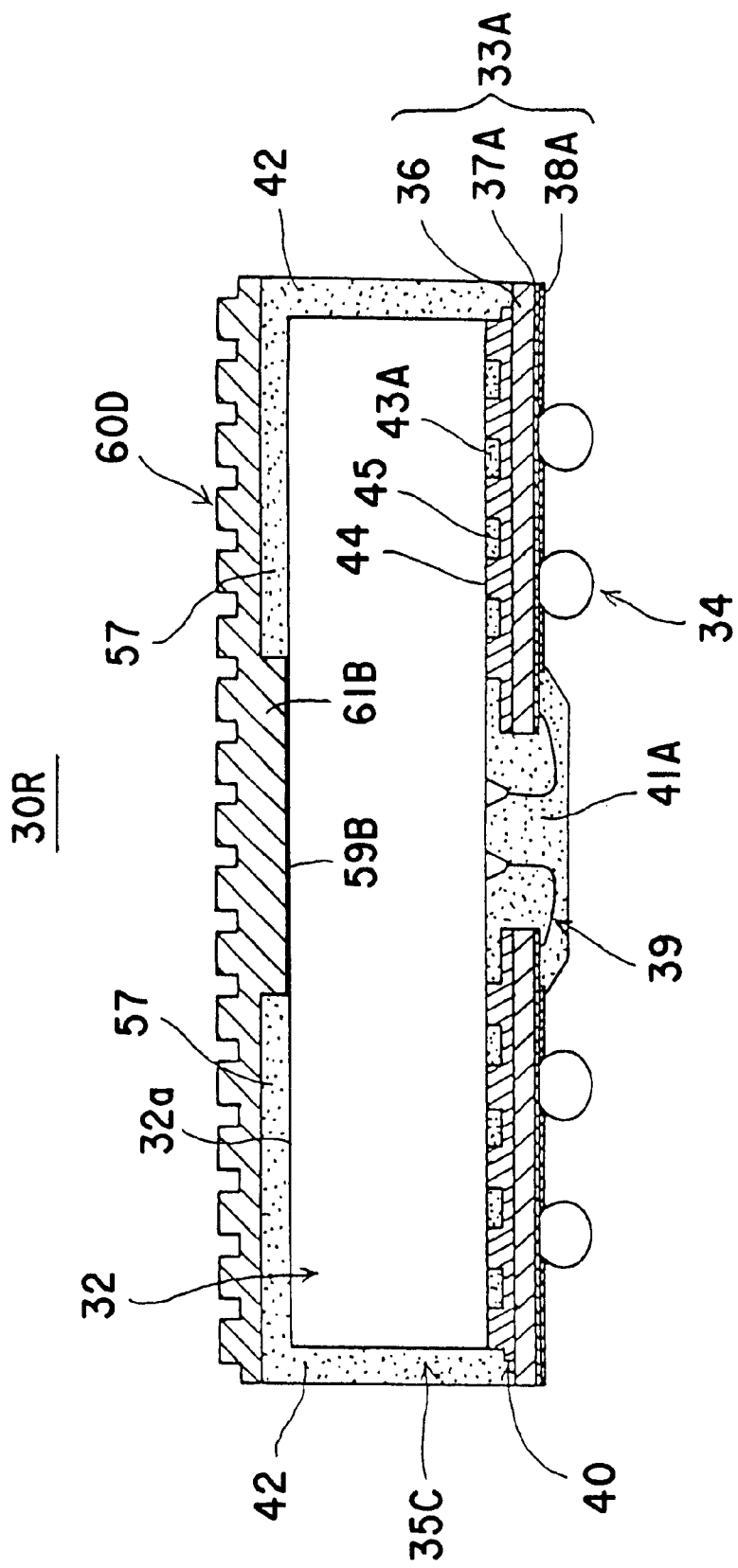
FIG. 19 is a sectional view of a semiconductor device of an eighteenth embodiment of the present invention.

FIG. 19 illustrates a semiconductor device 30R of an eighteenth embodiment of the present invention. The semiconductor device 30R of this embodiment is the same as the semiconductor device 30Q of the seventeenth embodiment shown in FIG. 18 in that a heat plate 60D has concavities and convexities.

In the semiconductor device 30Q of the seventeenth embodiment, the heat plate 60C is disposed directly on the chip upper surface 32a of the semiconductor chip 32. In the semiconductor device 30R of this embodiment, however, the upper holding portion 57 (the mold resin 35C) is interposed between the heat plate 60D and the chip upper surface 32a.

The heat plate 60D is provided with a protrusion 61B which protrudes toward the semiconductor chip 32. The protrusion 61B is bonded to the semiconductor chip 32 with the bonding layer 59B. With this structure, the heat generated in the semiconductor chip 32 can be efficiently released from the entire surface of the heat plate 60D via the protrusion 61B, and the mounting reliability can be improved.

Since the upper holding portion 57 (the mold resin 35C) is disposed on the chip upper surface 32a in the semiconductor device 30R of this embodiment, the mold resin 35C seals the entire surface of the semiconductor chip 32. Thus, the semiconductor device 30R can be protected from moisture to maintain excellent moisture resistance.

Figure 20:
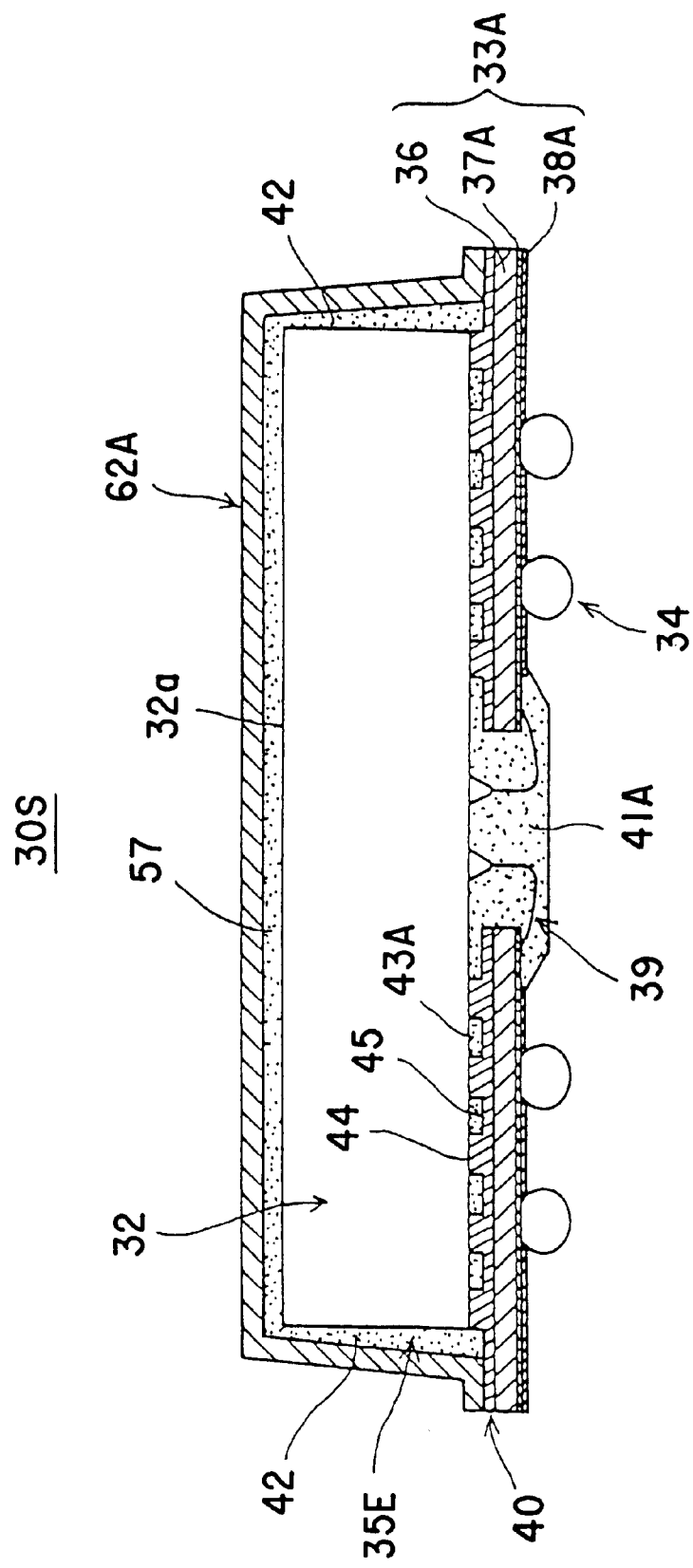
FIG. 20 is a sectional view of a semiconductor device of a nineteenth embodiment of the present invention.

FIG. 20 illustrates a semiconductor device 30S of a nineteenth embodiment of the present invention. The semiconductor device 30S of this embodiment is characterized by a cap member 62A formed on the substrate 33A. The cap member 62A covers the semiconductor chip 32 and a mold resin 35E, and is made of a lead frame material such as 42 allow or copper alloy.

The cap member 62A hermetically seals the semiconductor chip 32 and the mold resin 35E so as to prevent moisture from entering the semiconductor device 30S (especially into the mold resin 35E). With this structure, the moisture resistance for the mold resin 35E can be increased, and the reliability of the semiconductor device 30S can be improved.

As the semiconductor chip 32 is also protected by the cap member 62A made of metal as well as the mold resin 35E, the mechanical strength of the semiconductor device 30S can be improved. Thus, the reliability of the semiconductor device 30S can be further improved.

Figure 21:
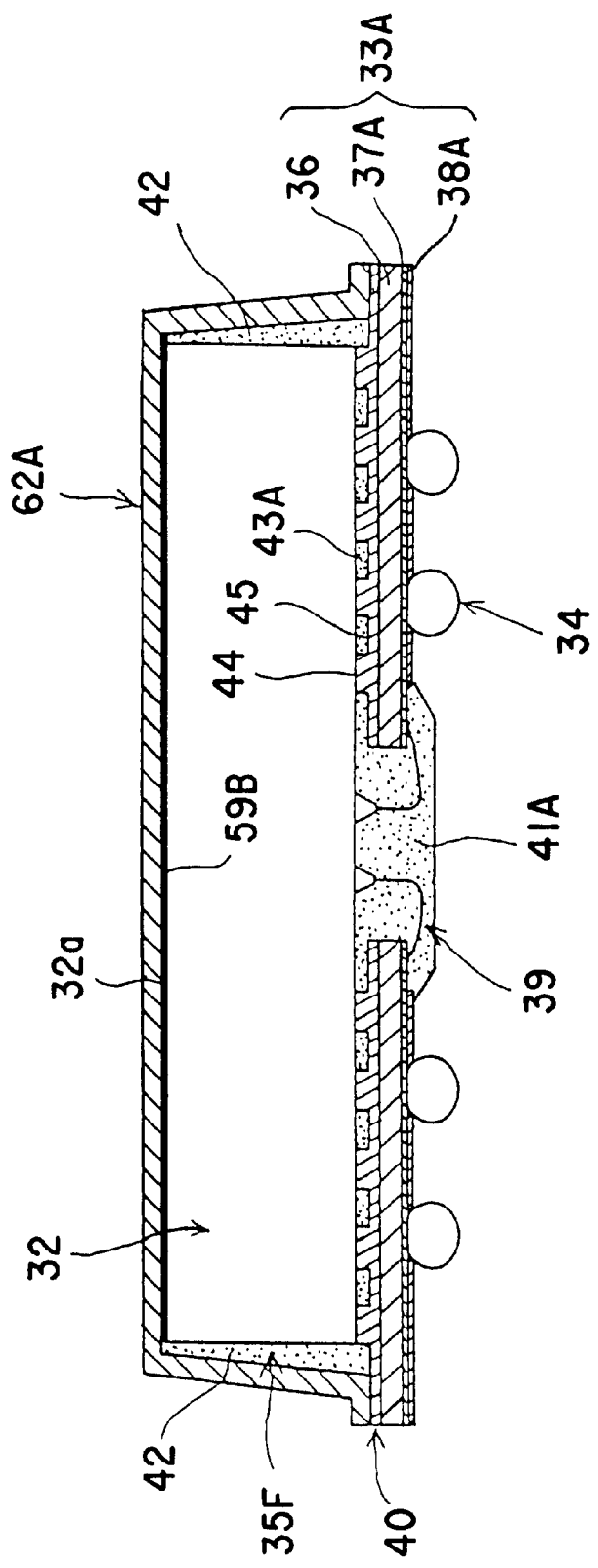
FIG. 21 is a sectional view of a semiconductor device of a twentieth embodiment of the present invention.

FIG. 21 illustrates a semiconductor device 30T of a twentieth embodiment of the present invention. Like the semiconductor device 30S of the nineteenth embodiment shown in FIG. 20, the semiconductor device 30T of this embodiment is provided with the cal member 62A, which covers the semiconductor chip 32 and a mold resin 35F.

In the semiconductor device 30S of the nineteenth embodiment, the upper holding portion 57 (the mold resin 35E) is interposed between the chip upper surface 32a of the semiconductor chip 32 and the cap member 62A. In the semiconductor device 30T of this embodiment, however, the cap member 62A is directly in contact with the chip upper surface 32a of the semiconductor chip 32.

In this embodiment, the cap member 62A is made of a material having good heat radiation properties. In order to improve the bond between the semiconductor chip 32 and the cap member 62A, the bonding layer 59B is interposed between the cap member 62A and the chip upper surface 32a.

In this embodiment, the cap member 62A made of a material having good heat radiation properties is directly in contact with the semiconductor chip 32, so that the cap member 62A can function as a heat radiation member. With this structure, the heat generated in the semiconductor chip 32 can be efficiently released. Besides the effects mentioned in the nineteenth embodiment shown in FIG. 20, this embodiment has effects of reducing the stress caused between the semiconductor device 30T and the printed circuit board 46 and further improving the mounting reliability.

Figure 22:
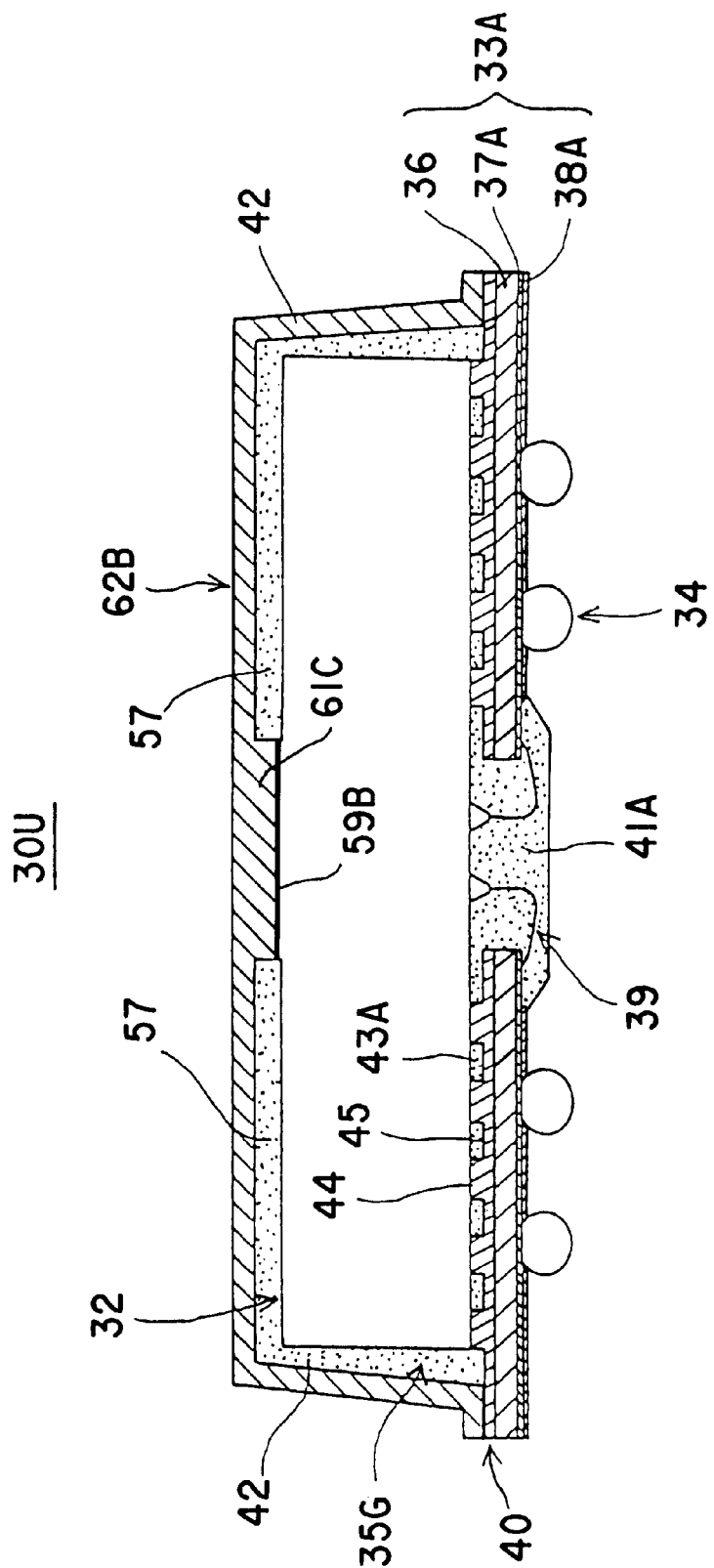
FIG. 22 is a sectional view of a semiconductor device of a twenty-first embodiment of the present invention.

FIG. 22 illustrates a semiconductor device 30U of a twenty-first embodiment of the present invention. Like the semiconductor device 30S of the nineteenth embodiment shown in FIG. 20, the semiconductor device 30U of this embodiment is provided with a cap member 62B. The upper holding portion 57 is interposed between the chip upper surface 32a of the semiconductor chip 32 and the cap member 62B.

In the semiconductor device 30S of the nineteenth embodiment, the cap member 62A is not in contact with the chip upper surface 32A. In the semiconductor device 30U of this embodiment, however, the cap member 62B has a protrusion 61C which protrudes toward the semiconductor device 32, and the protrusion 61C is in contact with the semiconductor chip 32 via the bonding layer 59B.

Besides the effects mentioned in the nineteenth embodiment shown in FIG. 20, this embodiment also has the effects mentioned in the twentieth embodiment shown in FIG. 21. Thus, the semiconductor device 30U of this embodiment can have improved moisture resistance and heat radiation properties, as well as high reliability.

Figure 23:
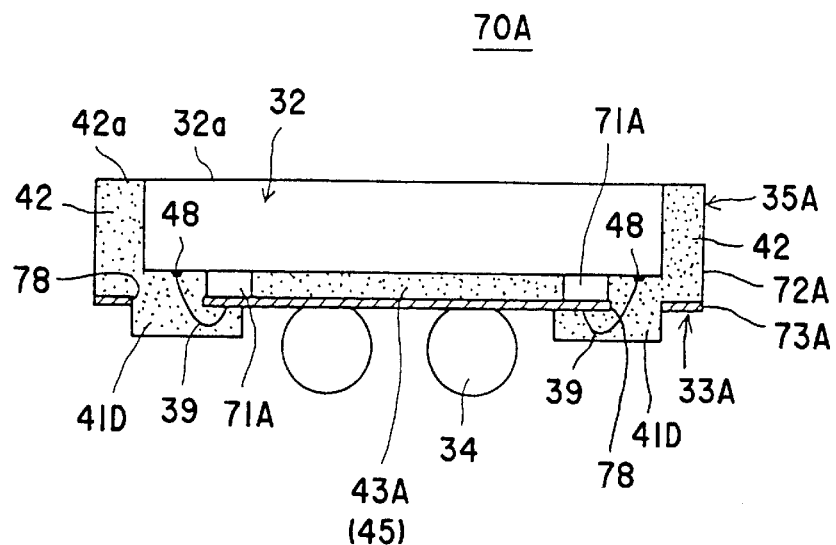
FIG. 23 is a sectional view of a semiconductor device of a twenty-second embodiment of the present invention.

FIG. 23 illustrates a semiconductor device 70A of a twenty-second embodiment of the present invention. The semiconductor chip 32 of each of the embodiments described so far has a center pad structure such as a D-RAM, but the electrode pads 48 can be disposed on the outer periphery of the semiconductor chip 32.

The semiconductor device 70A of this embodiment is characterized by the semiconductor chip 32 having the electrode pads 48 on its outer periphery. With the semiconductor chip 32 having the peripheral pad structure, insertion holes 78 for inserting the metal wires 39 are formed in the vicinity of the outer surface of the substrate 33A.

In the peripheral pad structure having the electrode pads 48 disposed on the outer periphery of the semiconductor chip 32, the pad disposing area can be larger than in the center pad structure having the electrode pads 48 disposed in the center of the outer surface of the semiconductor chip 32. Thus, more terminals can be disposed in the semiconductor device 70A of this embodiment.

Figure 24:
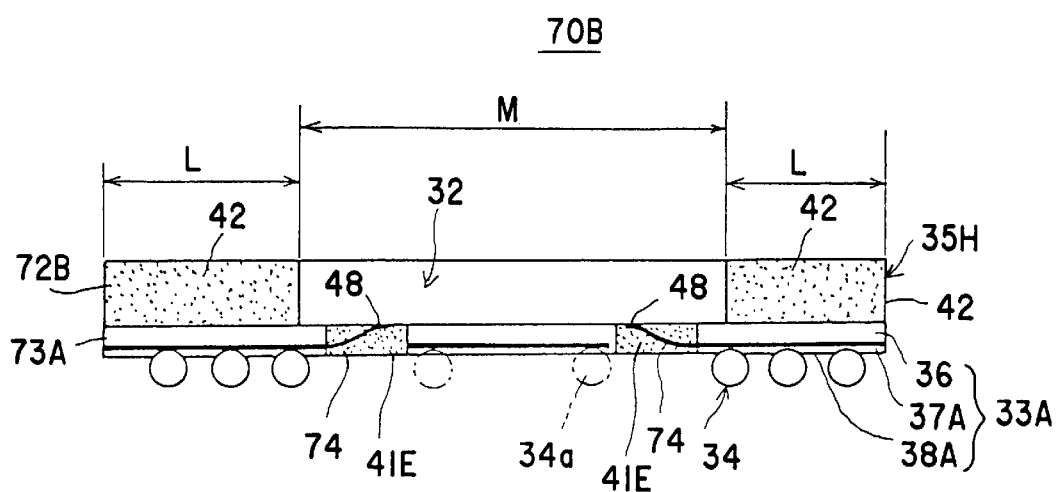
FIG. 24 is a sectional view of a semiconductor device of a twenty-third embodiment of the present invention.

FIG. 24 illustrates a semiconductor device 70B of a twenty-third embodiment of the present invention. In the other embodiments described so far, the area of the semiconductor chip 32 in a plan view is substantially equal to the area of the substrate 33A, 33B, or 33C, so that the balls 34 to be the external connecting terminals face the semiconductor chip 32.

The semiconductor device 70B of this embodiment, on the other hand, is characterized by a region of the substrate 33A extended from the outer periphery of the semiconductor chip 32 and the balls 34 (protrusion electrodes) disposed on the extended region. The region indicated by arrows L in FIG. 24 is the extended region of the substrate 33A extended from the outer periphery of the semiconductor chip 32, and the balls 34 are disposed under the extended region L. The positions of the balls 34 are not limited to the extended region L, but they may be disposed under the region facing the semiconductor chip 32 (indicated by an arrow M in FIG. 24) as in the other embodiments. In FIG. 24, the balls disposed under the chip facing region are indicated by 34a.

In this embodiment, the area of the semiconductor chip 32 is larger than the area of the substrate 33A by the extended region L of the substrate 33A extended form the outer periphery of the semiconductor chip 32. The balls 34 can be disposed in the extended region L of the substrate 33A. Accordingly, the intervals between the balls 34 can be made longer than the intervals between the electrode pads 48 of the semiconductor chip 32. Even if the semiconductor chip 32 is provided with a large number of terminals, the semiconductor device 70B can be electrically connected to the printed circuit board via the balls 32. Thus, the semiconductor device 70B can have a high density.

In the semiconductor device 70B of this embodiment, the side surfaces 72B of a mold resin 35H are on the same plane as the side surfaces 73A of the substrate (interposer) 33A. The mold resin 35H and the substrate 33A are collectively cut out so as to form the common plane. By doing so, the appearance of the semiconductor device 70B can be improved. In FIG. 24, reference numeral 74 indicates lead terminals which connect the substrate 33A and the electrode pads 48 in this embodiment.

Figure 25:
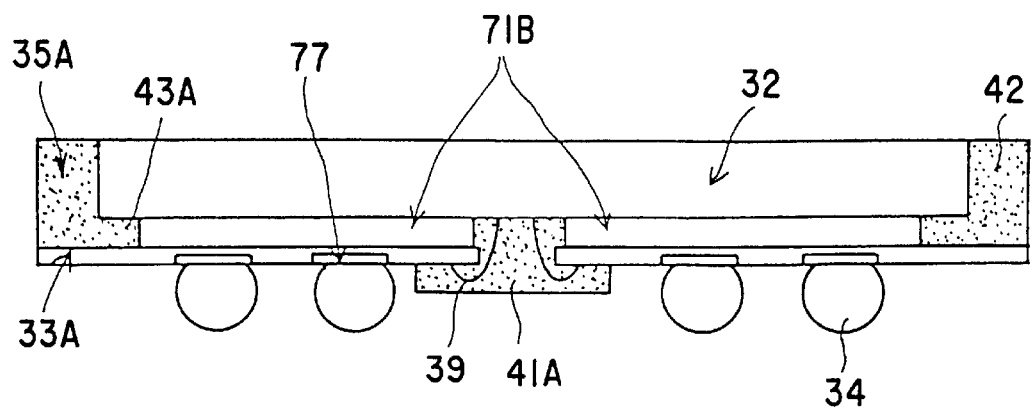
FIG. 25 is a sectional view of a semiconductor device of a twenty-fourth embodiment of the present invention.
Figure 26:
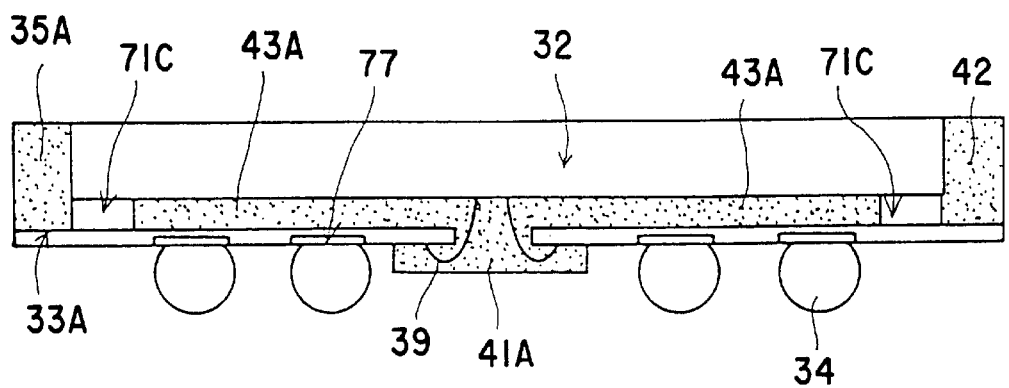
FIG. 26 is a sectional view of a semiconductor device of a twenty-fifth embodiment of the present invention.

FIG. 25 illustrates a semiconductor device 70C of a twenty-fourth embodiment of the present invention, and FIG. 26 illustrates a semiconductor device 70D of a twenty-fifth embodiment of the present invention. The semiconductor devices 70C and 70D of the twenty-fourth and twenty-fifth embodiments are characterized in that materials interposed between the semiconductor chip 32 and the ball disposing positions on the substrate 33A have the same properties.

Lands 77 or bonding the balls 34 are formed in the ball disposing positions on the substrate 33A. In this embodiment, a material interposed between the semiconductor chip 32 and the region on the substrate 33A corresponding to the lands 77 has uniform properties.

More specifically, the semiconductor device 70C shown in FIG. 25 has only a bonding member 71B between the semiconductor chip 32 and the substrate 33A above the lands 77. Accordingly, the bonding member 71B covers all the area above the lands 77 in this embodiment.

The semiconductor device 70D shown in FIG. 26 has a lower surface holding portion 43A (the mold resin 35A) between the semiconductor chip 32 and the substrate 33A above the lands 77. Accordingly, the lower surface holding portion 43A (the mold resin 35) covers all the area above the lands 77.

Only the bonding member 71B or the lower surface holding portion 43A (the mold resin 35A) are interposed between the semiconductor chip 32 and the substrate 33A above the lands 77, so that the material disposed above the lands has the uniform properties. With this structure, the mounting reliability of the semiconductor devices 70C and 70D can be improved.

If materials having different properties (elasticity, thermal expansion rate, and the like) are interposed between the semiconductor chip 32 and a plurality of ball disposing positions on the substrate 33A (the regions above the lands 77), different stresses are caused in the respective ball disposing positions. For instance, in a case where one of two adjacent ball disposing positions is provided with a material having high rigidity (such as the mold resin) while the other is provided with a material having low rigidity (such as the bonding member), the bonding member takes up stresses, but the mold resin has a low stress absorption rate. Because of this, stresses are caused intensively onto the ball disposing positions provided with the material (the mold resin) having high rigidity. With the stresses being caused intensively on certain ball disposing positions, the balls 34 in the certain disposing positions becomes liable to detach from the substrate 33A or the printed circuit board.

In the twenty-fourth and twenty-fifth embodiments, on the other hand, all the ball disposing positions are provided with a material having uniform properties, so that stresses caused in the ball disposing positions (the positions of the lands 77) can be dispersed. Thus, stress concentration on certain ball disposing positions can be prevented. In this manner, the balls 34 can be prevented from detaching from the substrate 33A or the printed circuit board, and the mounting reliability of the semiconductor devices 70C and 70D can be improved.

FIG. 27 shows the experiment results of reliability tests conducted on the semiconductor devices 70C and 70D of the twenty-fourth and twenty-fifth embodiments. In FIG. 27, a comparative example is the results of the same reliability test conducted on semiconductor devices in which the ball disposing positions are provided with materials having different properties.

In this experiment, each of the semiconductor devices is single-side mounted on a printed circuit board, and temperature cycles of −25 to 125 are applied. The temperature cycles are 500 cycles, 100 cycles, 1500 cycles, 2000 cycles, and 2500 cycles. Here, the number of damaged semiconductor devices in each case is shown as "(number of damaged semiconductor devices)/(number of tested semiconductor devices)".

From the experiment results shown in FIG. 27, the number of damaged semiconductor devices of the comparative example markedly increased at 1000 cycles, and all the tested semiconductors of the comparative example were damaged at 1500 cycles.

On the other hand, none of the semiconductor devices 70D of the twenty-fifth embodiment were damaged until 1500 cycles. This proves that the semiconductor device 70D has high reliability than the comparative example. However, the semiconductor device 70D of the twenty-fifth embodiment might be damaged at 200 cycles or higher. Meanwhile, the semiconductor device 70C of the twenty-fourth embodiment was not damaged in this experiment, and is proved to have the highest reliability of all the test semiconductor devices.

Figure 28:
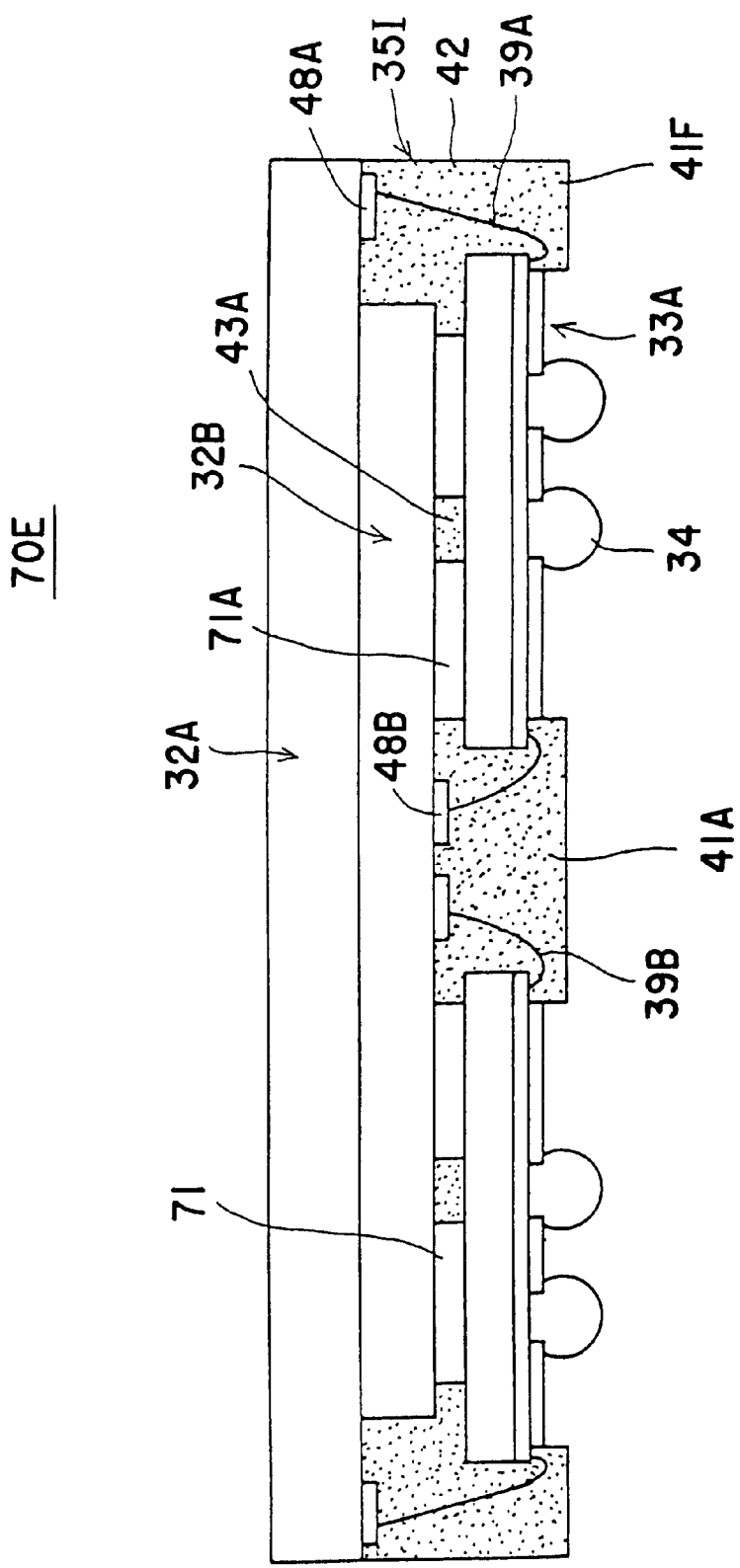
FIG. 28 is a sectional view of a semiconductor device of a twenty-sixth embodiment of the present invention.
Figure 29:
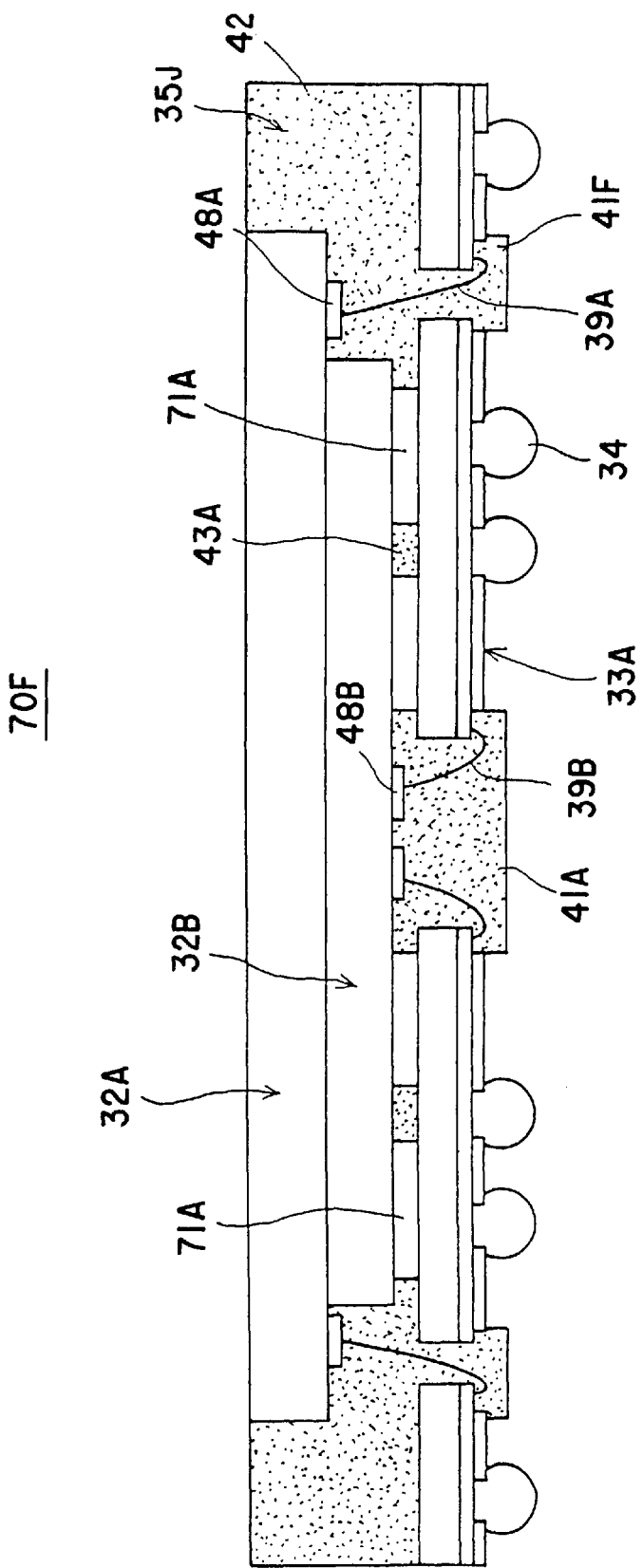
FIG. 29 is a sectional view of a semiconductor device of a twenty-seventh embodiment of the present invention.
Figure 30:
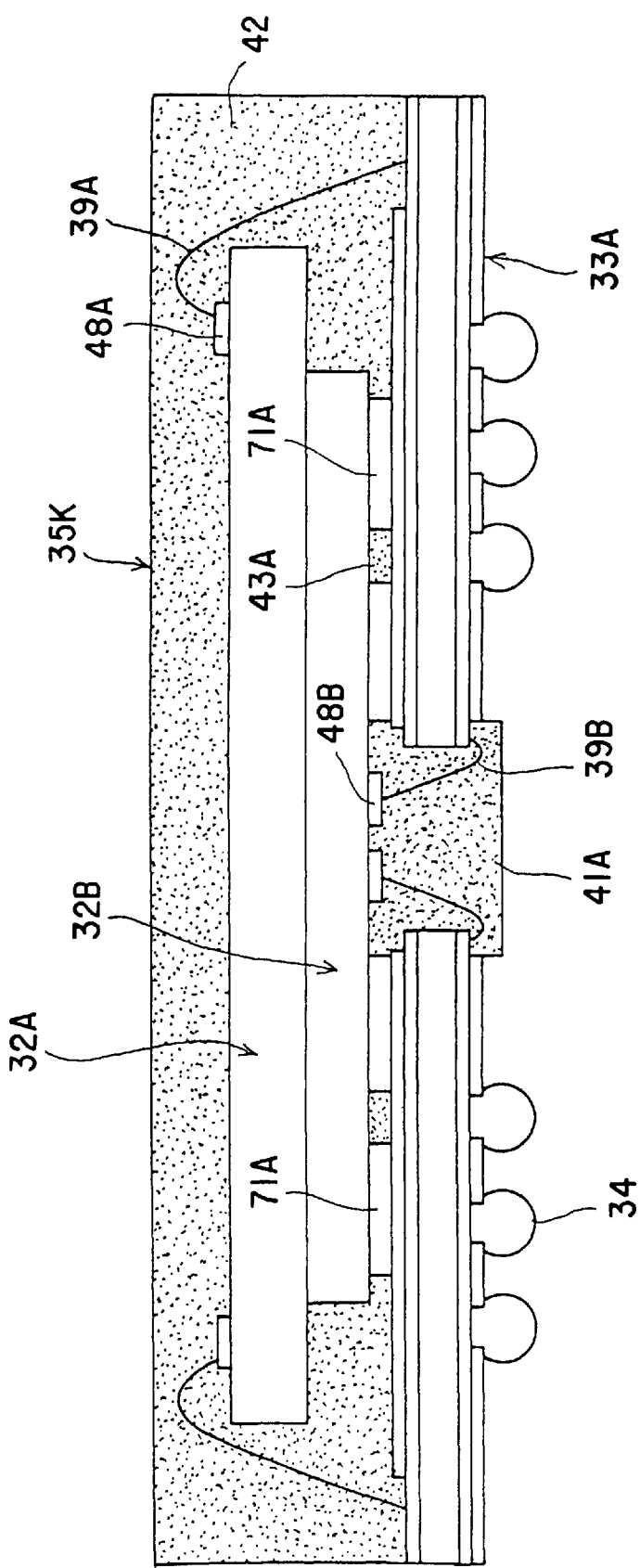
FIG. 30 is a sectional view of a semiconductor device of a twenty-eighth embodiment of the present invention.
Figure 31:
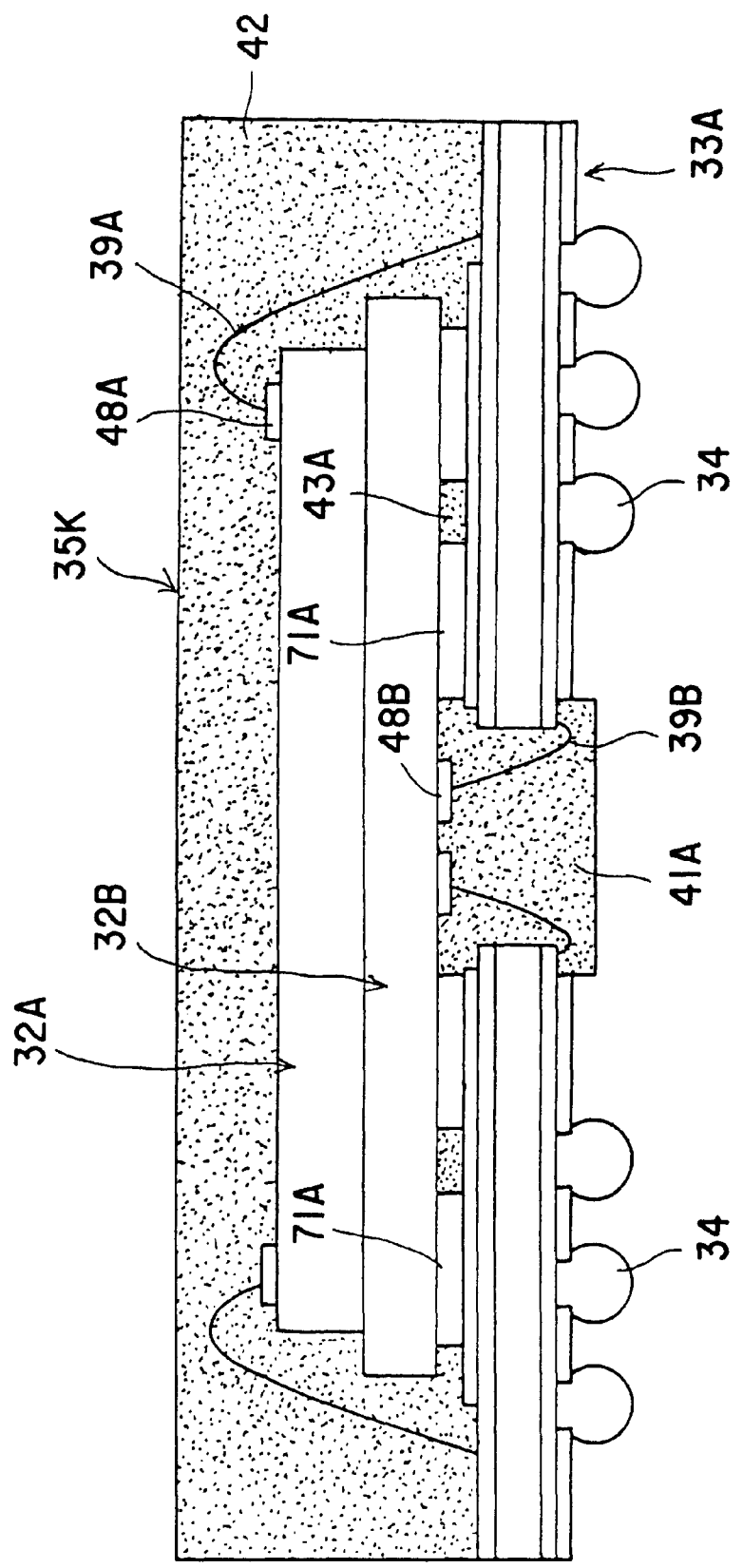
FIG. 31 is a sectional view of a semiconductor device of a twenty-ninth embodiment of the present invention.

FIG. 28 illustrates a semiconductor device 70E of a twenty-sixth embodiment of the present invention. FIG. 29 illustrates a semiconductor device 70F of a twenty-seventh embodiment of the present invention. FIG. 30 illustrates a semiconductor device 70F of a twenty-eighth embodiment of the present invention. FIG. 31 illustrates a semiconductor device 70H of a twenty-ninth embodiment of the present invention. The semiconductor devices 70E to 70H are characterized in that a plurality (two in these embodiments) of semiconductor chips 32A and 32B are stacked up in mold resins 35I to 35K.

In the semiconductor devices 70E to 70H, the semiconductor chip 32A in the upper position is a logic LSI, for instance, and has a peripheral pad structure having electrode pads 48A in the outer periphery of the semiconductor chip 32A. The semiconductor chip 32B in the lower position is a memory chip, such as a D-RAM, and has a center pad structure having electrode pads 48B in the center of the semiconductor chip 32B.

In the semiconductor devices 70E and 70F of the twenty-sixth and twenty-seventh embodiments shown in FIGS. 28 and 29, the semiconductor chips 32A and 32B are both stacked up in a face-down manner (in which each circuit forming surface faces the printed circuit board). Also, the size (or the area in a plan view) of the semiconductor chip 32B in the lower position is smaller than the size (or the area in a plan view) of the semiconductor chip 32A in the upper position. The electrodes pads 48A of the semiconductor chip 32A are attached to a step formed by the difference in size.

In the semiconductor device 70E of the twenty-sixth embodiment shown in FIG. 28, the mold resin 35I hold the sides of the semiconductor chip 32B in the lower position, but does not hold the sides of the semiconductor chip 32A in the upper position. In the semiconductor device 70F of the twenty-seventh embodiment shown in FIG. 29, the mold resin 35J holds the sides of both the semiconductor chip 32A and the semiconductor chip 32B.

In each of the semiconductor devices 70G and 70H of the twenty-eighth and twenty-ninth embodiments shown in FIGS. 30 and 31, the semiconductor chip 32B in the lower position has a face-down structure, and the semiconductor chip 32A in the upper position has a face-up structure (in which the circuit forming surface is situated on the opposite side to the printed circuit board). The mold resin 35K holds the sides of both the semiconductor chips 32A and 32B.

In the semiconductor device 70G of the twenty-eighth embodiment shown in FIG. 30, the size (the area in a plan view) of the semiconductor chip 32B in the lower position is larger than the size (the area in a plan view) of the semiconductor chip 32A in the upper position. In the semiconductor device 70H of the twenty-ninth shown in FIG. 31, on the other hand, the size (the area in a plan view) of the semiconductor chip 32B in the lower position is smaller than the size (the area in a plan view) of the semiconductor chip 32A in the upper position.

In the above semiconductor devices 70E to 70H of the twenty-sixth to twenty-ninth embodiments, the semiconductor chips 32A and 32B are stacked up in the mold resins 35I to 35K, so that semiconductor devices of different types, such as a logic semiconductor chip and a memory semiconductor chip as in the above embodiment, can be disposed in one package. Thus, the semiconductor devices 70E to 70H have high densities. Also, the wiring distance between the semiconductor chips 32A and 32B can be shortened, thereby making signal transmission loss smaller than in a structure in which semiconductor chips are disposed in separate packages. Thus, the semiconductor devices 70E to 70H can keep up with high-speed operations.

In the twenty-sixth to twenty-ninth embodiments, the semiconductor chip 33A disposed in the lower position facing the substrate 33A has the center pad structure so as to make the devices more compact. If both of the semiconductor chips 32A and 32B have the peripheral structure (in which the electrode pads are disposed on the outer periphery of each semiconductor chip), the size of the semiconductor chips are limited at the time of stacking them. To expose the electrode pads, the semiconductor chip in the lower position must be made larger than the semiconductor chip in the upper position, resulting in a large-size semiconductor device.

On the other hand, the semiconductor chip 32B having the center pad structure needs to be disposed in the face-down manner, so that the semiconductor chip 32A can be stacked on the semiconductor chip 32B. Here, the semiconductor chip 32A stacked on the rear surface of the semiconductor chip 32B where no electrode pads are formed. In this structure, the size of the semiconductor chip 32A in the upper position is not limited to the size of the semiconductor chip 32B in the lower position. Thus, the semiconductor chip 32A can be made smaller than the semiconductor chip 32B so as to obtain a small-size semiconductor device.

The following is a description of a semiconductor device production method of the present invention. In the following description, the semiconductor device 70A of the twenty-second embodiment shown in FIG. 23 is cited as an example, and the same components as in FIG. 23 are indicated by the same reference numerals.

A method of producing the semiconductor device 70A of the present invention comprises a bonding member disposing step, a first cutting step, a chip mounting step, a molding step, a second cutting step, and a ball disposing step.

Figure 32:
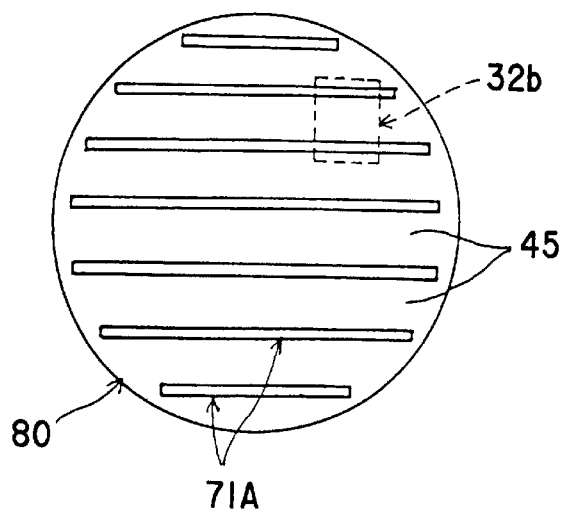
FIG. 32 illustrates a bonding member disposing step in a semiconductor device production method of the present invention.

FIG. 32 illustrates the bonding member disposing step. In the bonding member disposing step, bonding members 71A are disposed in predetermined positions on one or both of a wafer 80 (a semiconductor substrate) or the wiring board 33A (an interposer). The bonding members 71A in FIG. 32 are disposed on the wafer 80, for instance.

The wafer 80 has already been processed at this point, and has a plurality of semiconductor chips. The disposing positions of the bonding members 17 are situated on the respective semiconductor chips. The bonding members 71A are made of resin having a thermosetting property or thermoplastic property, such as epoxy resin.

In this step, two of the bonding members 17A are disposed in each of the semiconductor chip forming regions (one is indicated by a broken line 32b in FIG. 32) on the wafer 80. In each of the semiconductor chip forming regions, the area interposed between the two bonding members 71A becomes the interposing portion 45.

Figure 33:
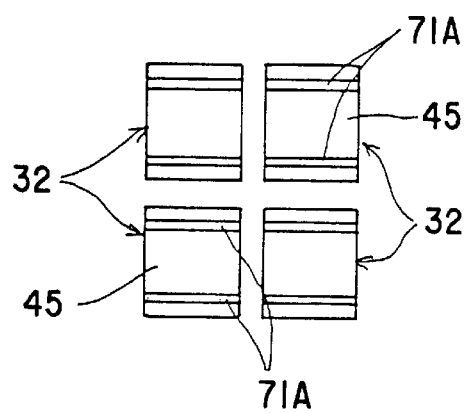
FIG. 33 illustrates a first cutting step in the semiconductor device production method of the present invention.

The above bonding member disposing step is followed by the first cutting step. In this first cutting step, the wafer 80 is cut into the individual semiconductor chips 32 by a dicing saw (not shown). FIG. 33 shows the semiconductor chips 32 divided in the first cutting step. In FIG. 33, there are only four semiconductor chips 32 for ease of drawing.

As described so far, the bonding members 71A are disposed on the wafer 80 in the bonding member disposing step, and the wafer 80 is then cut into the individual semiconductor chips 32 in the first cutting step. In this manner, the disposing process the bonding members 71A becomes easier than that in a method in which the first cutting step is first carried out and bonding members are then disposed on the individual semiconductor devices.

Figure 34:
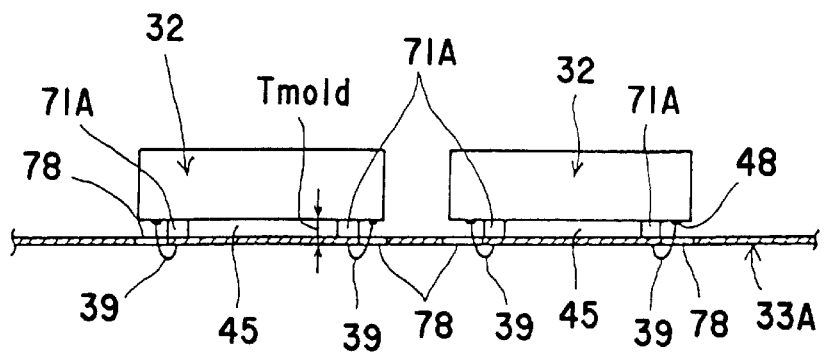
FIG. 34 illustrates a chip mounting step in the semiconductor device production method of the present invention.

The first cutting step is followed by the chip mounting step. In the chip mounting step, the semiconductor chips 32 divided in the first cutting step are bonded to the substrate 33A to be an interposer by the bonding members 71, and the electrode pads 48 formed on the semiconductor chips 32 are electrically connected to the substrate 33A. FIG. 34 shows the semiconductor chips 32 mounted onto the substrate 33A.

In this method, the metal wires 39 are used to electrically connect the electrode pads 48 to the substrate 33A. The metal wires 39 are connected by a wire bonding device. Also, the insertion holes 78 are formed in predetermined positions in the substrate 33A, and the ends of the metal wires 39 are bonded to the lower surface of the substrate 33A via the insertion holes 78.

In the chip mounting step in this method, the individual semiconductor chips 32 are bonded and secured to the substrate 33A via the bonding members 71A, so that the electrode pads 48 of the semiconductor chips 32 can be readily and surely connected (wire-bonded) to the substrate 33A. The bonding members 71A also function as spacers to maintain predetermined opening distance (indicated by an arrow $T_{mold}$ in the figure) between the semiconductor chips and the substrate 33A. The openings between the semiconductor chips 32 and the substrate 33A function as the interposing portions 45.

The bonding members 71A are situated in positions facing the bonding positions where the metal wires 39 are bonded to the substrate 33A. The bonding members 71A restrict unnecessary oscillation caused in the substrate 33A at the time of bonding the metal wires 39, so that the metal wires 39 can be surely bonded to the substrate 33A.

Figure 35:
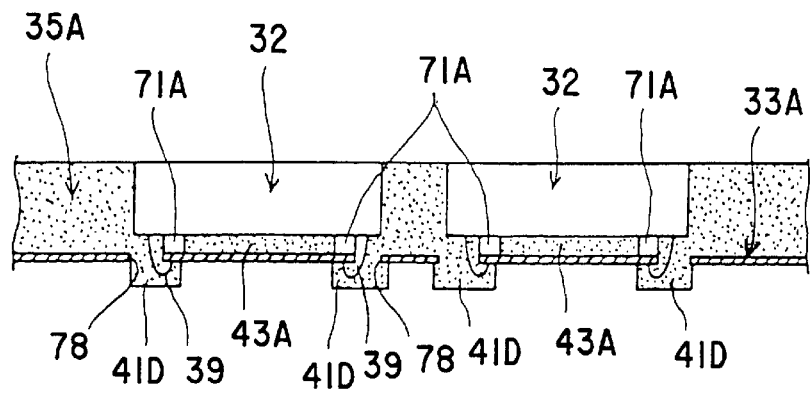
FIG. 35 illustrates a molding step in the semiconductor device production method of the present invention.

The chip mounting step is followed by the molding step. FIG. 35 shows the semiconductor chips 32 and the substrate 33A provided with the mold resin 35A. In the molding step, the mold resin 35A is filled in the interposing portions 45 (the openings between the semiconductor chips 32 and the substrate separated by the bonding members 71A) so as to seal the sides (outer side surfaces) of the semiconductor chips 32. The mold resin 35A filled in the interposing portions 45 constitutes the lower surface holding portions 43A.

Since the bolding members 71A as spacers are disposed between the semiconductor chips 32 and the substrate 33A to form the interposing portions 45, it is not necessary to employ other members for separating the semiconductor chips 32 and the substrate 33A to form the lower surface holding portions 43A. Thus, the molding step in this method is simplified.

In this method, since the metal wires 39 are bonded to the lower surface (facing the printed circuit board) of the substrate 33A via the insertion holes 78, a part of each of the metal wires 39 protrudes from the lower surface of the substrate 33A. To protect the protruding portions of the metal wires 39, connecting portion sealing resins 41D are formed on the lower surface of the substrate 33A. The mold resin 35A is formed by a metal mold 100A (shown in FIG. 47).

Figure 36:
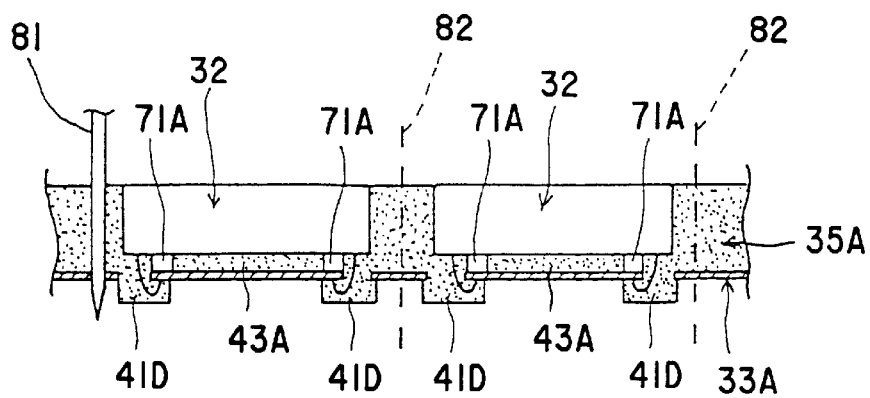
FIG. 36 illustrates a second cutting step of the semiconductor device production method of the present invention.

The molding step is followed by the second cutting step. In the second cutting step, the mold resin 35A and the substrate 33A are collectively cut into individual semiconductor devices 70A (here, the balls 34 has yet to be formed). More specifically, dicing positions 82 set between the adjacent semiconductor chips 32 are cut by a dicing saw 31, as shown in FIG. 36. Thus, the individual semiconductor devices 70A are formed.

Figure 37:
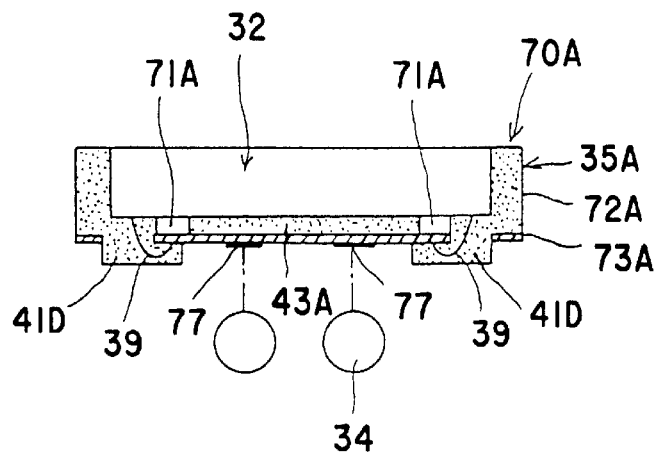
FIG. 37 illustrates a ball disposing step in the semiconductor device production method of the present invention.

In the second cutting step in this method, the mold resin 35A and the substrate 33A are collectively cut, so that the side surfaces 72A of the mold resin 35A are on the same plane as the side surfaces 73A of the substrate 33A, as shown in FIG. 37. The side surfaces 72A and the side surfaces 73A form the side surfaces of each of the semiconductor devices 70A.

Compared with a conventional technique of dividing the semiconductor devices by breaking gates, the appearance of the semiconductor devices produced by the method of the present invention can be improved without gate-break marks. Also, no nick is caused on the surface of the mold resin 35A.

The second cutting step is followed by the ball disposing step. In the ball disposing step, the balls 34 are formed on the substrate 33A of each of the semiconductor devices 70A. More specifically, the lands 77 are already formed in predetermined positions on the substrate 33A, and the balls 34 are bonded to the lands 77 by a conventional transfer method, for instance. The ball disposing step can be carried out prior to the second cutting step, and the mold resin 35A and the substrate 33A provided with the balls 34 can be collectively cut.

The semiconductor device 70A shown in FIG. 23 is thus produced by carrying out the above steps.

The following is a more detailed description of the above production steps and other embodiments of the respective production steps.

Figure 38A:
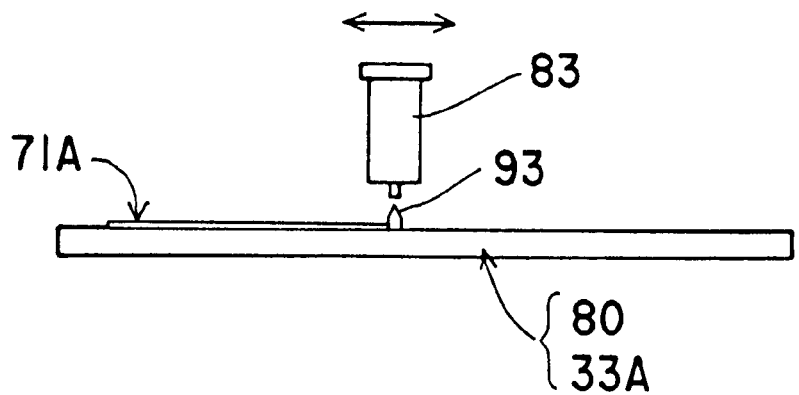
FIGS. 38A to 38C illustrate the bonding member disposing step in detail.
Figure 38B:
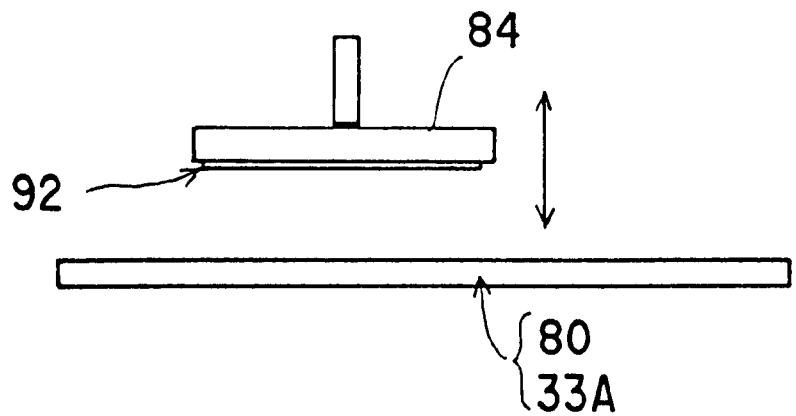
Figure 38C:
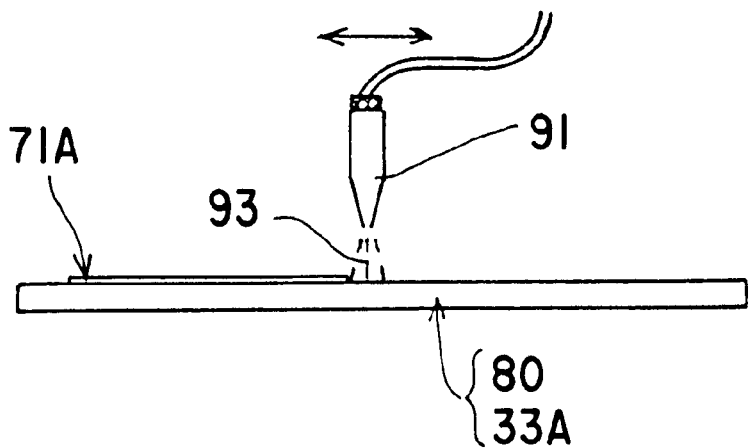

FIGS. 38A to 38C show more specific examples of the bonding member disposing step. In FIG. 38A, resin 93 is melted to form the bonding members 71A on the wafer 80 by a potting technique. In the potting technique, a dispenser 83 filled with the melted resin 93 is moved in a direction of an arrow in the figure, thereby disposing the bonding members 71A on the wafer 80.

In FIG. 38B, sheet-like resin 92 having the shape of the bonding members 71A is transferred to onto the wafer 80 (hereinafter referred to as sheet bonding technique). In the sheet bonding technique, the sheet-like resin 92 is attached to a bonding jig 84, and the bonding jig 84 is pressed onto the wafer 80 to bond the sheet-like resin 92 to the wafer 80. Here, the attachment surface of the bonding jig 84, to which the sheet-like resin 92 is attached, is made of a material having poor bonding ability with respect to the sheet-like resin 92. Also, a heater for heating the sheet-like resin 92 is disposed in the bonding jig 84. With this structure, the sheet-like resin 92 can be bonded to the wafer 80 simply by pressing the bonding jig 84 onto the wafer 80.

In FIG. 38C, the resin 93 is melted and then sprayed onto the wafer 80 by a spray nozzle 91 to form the bonding members 71A (hereinafter referred to as "spray technique").

The bonding members 71A can be formed on the wafer 80 by any of the techniques. By the potting technique or the spray technique, a change of the disposing positions of the bonding members 71A can be easily accommodated. By the sheet bonding technique, the sheet-like resin 92 is disposed on the bonding jig 84, so that the bonding members 71A can be collectively disposed on the wafer 80, thereby improving the efficiency of the bonding member disposing step.

Figure 39:
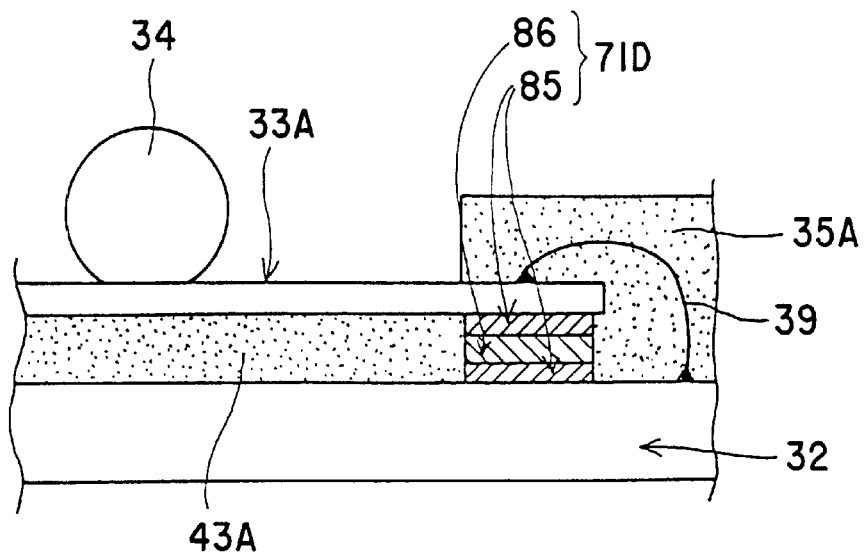
FIG. 39 shows a first modification of the bonding member disposing step in which a bonding member has a three-layered structure.

FIG. 39 illustrates a first modification of the bonding member disposing step. In the bonding disposing step described with reference to FIG. 32, the bonding members 71A are only made of resin. In this modification, however, a metal layer 86 is interposed between two bonding layers 85 to form a bonding member 71D. More specifically, the lower bonding layer 85 is first formed on the wafer 80 (the semiconductor chip 32) by the potting technique or the spray technique. The metal layer 86 is then formed on the lower bonding layer 85 by the sheet bonding technique. The upper bonding layer 85 is formed on the metal layer 86 by the potting technique or the spray technique. Having the metal layer 86 interposed between the bonding layers 85, the bonding member 71D has higher strength than the bonding member 71A made only of resin.

Figure 40:
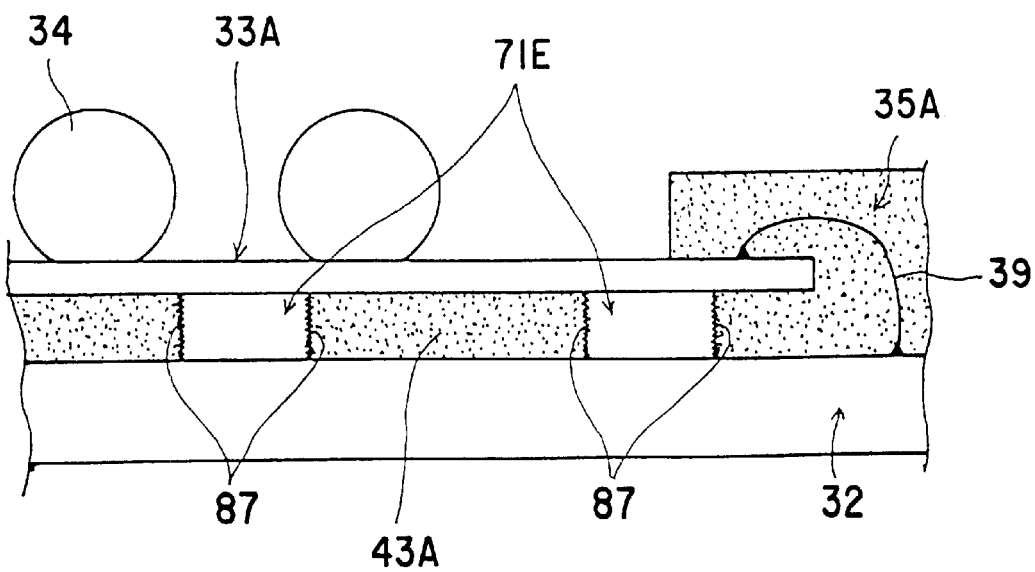
FIG. 40 illustrates a second modification of the bonding member disposing step in which the bonding member is compatible with the mold resin.

FIG. 40 illustrates a second modification of the bonding member disposing step. In the bonding member disposing step described with reference to FIG. 32, the relationship between the materials of the bonding member 71A and the mold resin 35A are not taken into consideration. In this modification, on the other hand, the material of bonding members 71E should be compatible (or have high compatibility) with the material of the mold resin 35A. Here, the higher the compatibility between the two materials, the better the two materials can be mixed. When selecting the materials of the bonding members 71E and the mold resin 35A, the compatibility between the two materials should be high so that the bonding members 71E and the mold resin 35A are evenly mixed at interfaces 87 after the molding step. In this manner, the bonding between the mold resin 35A and the bonding members 71E can be improved, and moisture can be prevented from entering between the mold resin 35A and the bonding members 71E. Thus, the reliability of the semiconductor devices can be improved.

Figure 41:
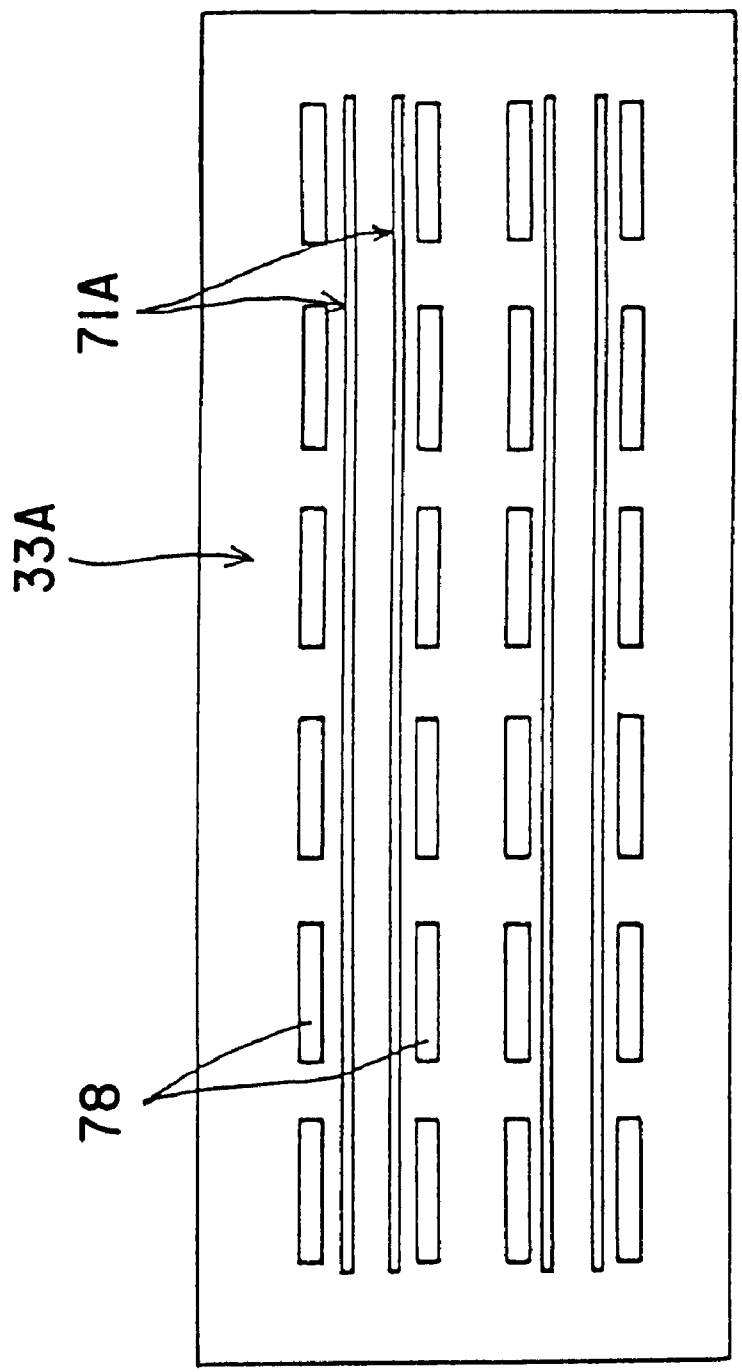
FIG. 41 illustrates a third modification of the bonding member disposing step in which the bonding member is disposed on the substrate.

FIG. 41 shows a third modification of the bonding member disposing step. In the bonding member disposing step described with reference to FIG. 32, the bonding members 71A are disposed on the wafer 80. In this modification, on the other hand, the bonding members 71A are formed on the substrate 33A. The bonding members 71A can be formed on the substrate 33A by the potting technique, the sheet bonding technique, or the spray technique. By forming the bonding members 71A on the substrate 33A, the semiconductor chips 32 can be better protected from damage than a structure in which the bonding members 71A are disposed on the wafer 80 (in such a case, the bonding members 71A are formed on the circuit forming surface of each of the semiconductor chips 32 formed on the wafer 80). When the bonding members 71A are formed on the wafer 80 by the potting technique or the spray technique, the semiconductor chips 32 formed on the wafer 80 might be damaged by heat, because the melted bonding members 71A have high temperature.

On the other hand, since the substrate 33A has only the wiring pattern (not shown) and the insertion holes 78 before the semiconductor chips 32 are mounted, nothing would be damaged by heat when the bonding members 71A are disposed on the substrate 33A. Thus, the semiconductor chips 32 can be well protected, and the reliability of the semiconductor production can be improved.

Figure 42:
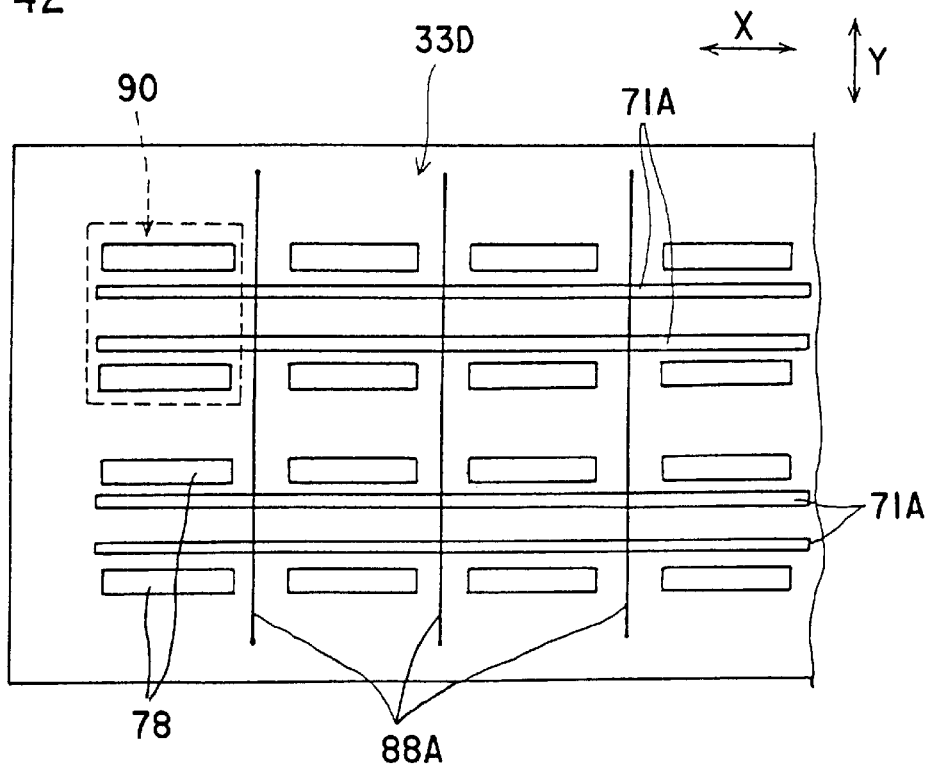
FIG. 42 illustrates a fourth modification of the bonding member disposing step in which the substrate has the slits.

FIG. 42 illustrates a fourth modification of the bonding member disposing step. In the bonding member disposing step described above with reference to FIG. 32, the substrate 33A prior to mounting of the semiconductor chips 32 has only the wiring pattern and the insertion holes 78. In this modification, on the other hand, a substrate 33D further has slits 88A.

More specifically, the slits 88A are formed in a direction (indicated by an arrow Y) perpendicular to the direction of disposing the bonding members 71A (indicated by an arrow X). The slits 88A are formed in the dicing positions where the substrate 33D is divided in the second cutting step. The slits 88A absorb stresses caused in the substrate 33D. If stresses are caused in the substrate 33D by heat, the slits 88A becomes deformed to absorb the stresses. By doing so, the substrate 33D can be prevented from being deformed, so that the substrate 33D can be used without being bent or deformed in the bonding member disposing step, the chip mounting step, and the molding step. Thus, defects can be prevented in the respective steps, and the reliability of the semiconductor devices can be improved.

Figure 46:
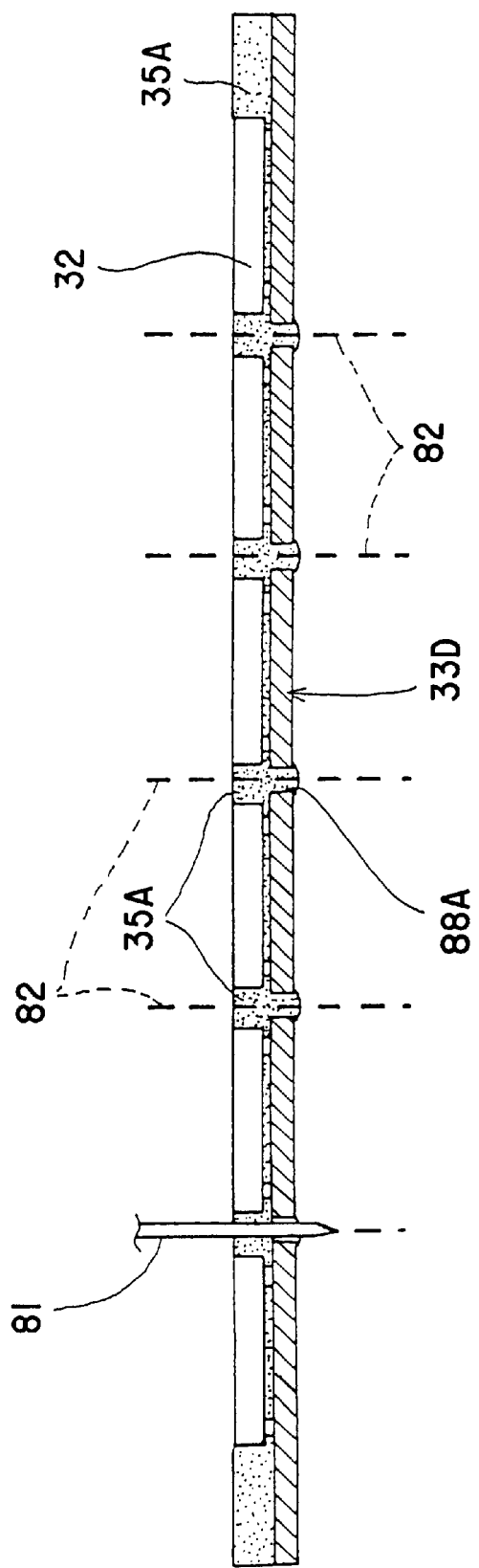
FIG. 46 illustrates the relationship between the slit positions and dicing positions.

In this modification, the slits 88A are formed in the dicing positions 82 where the substrate 33D is divided in the second cutting step. Accordingly, the dicing saw 81 (a jig which performs the cutting) mainly cuts the mold resin 35A that is softer than the substrate 33D, as shown in FIG. 46. Thus, the life of the dicing saw 81 can be prolonged.

Furthermore, since the slits 88A can be collectively formed at the time of forming of the insertion holes 78 in the substrate 33D, the slits 88A do not complicate the production procedures of the substrate 33D. In a case where the second cutting step is carried out from the side of the substrate 33D, the slits 88A also function as positioning marks for determining the dicing positions.

Figure 43:
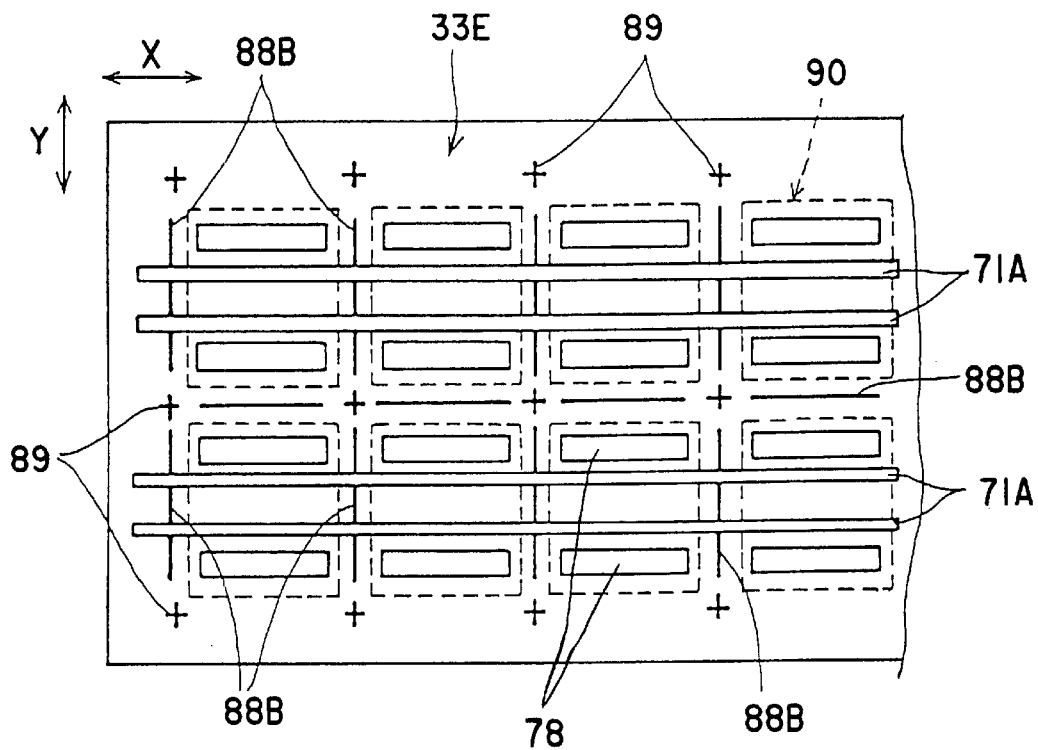
FIG. 43 illustrates the fourth modification in which the substrate has the slits.
Figure 44:
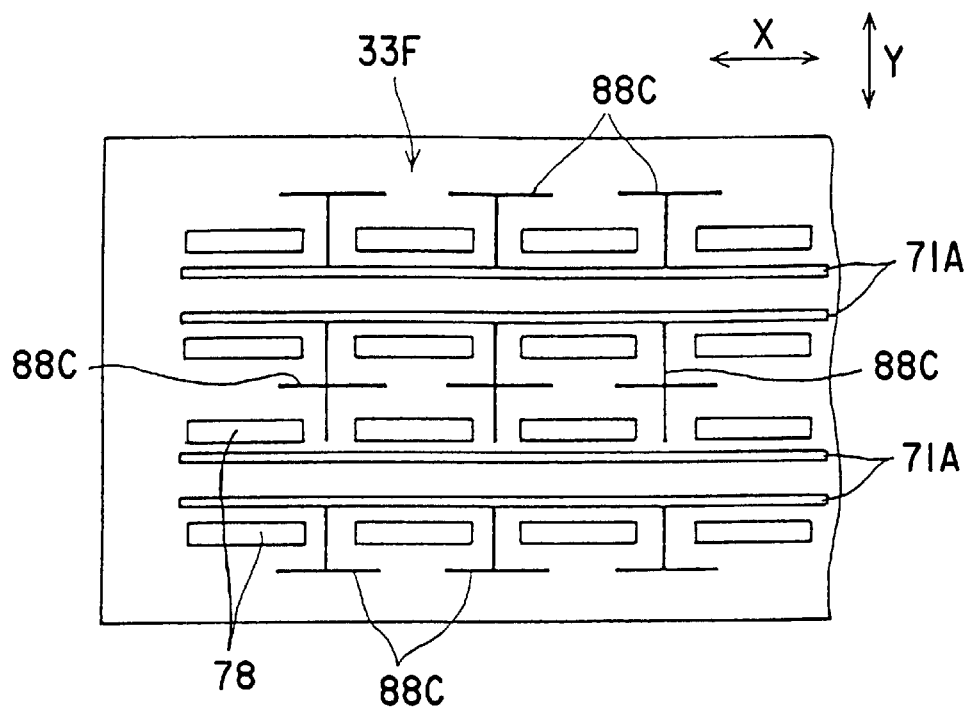
FIG. 44 illustrates the fourth modification in which the substrate has the slits.
Figure 45:
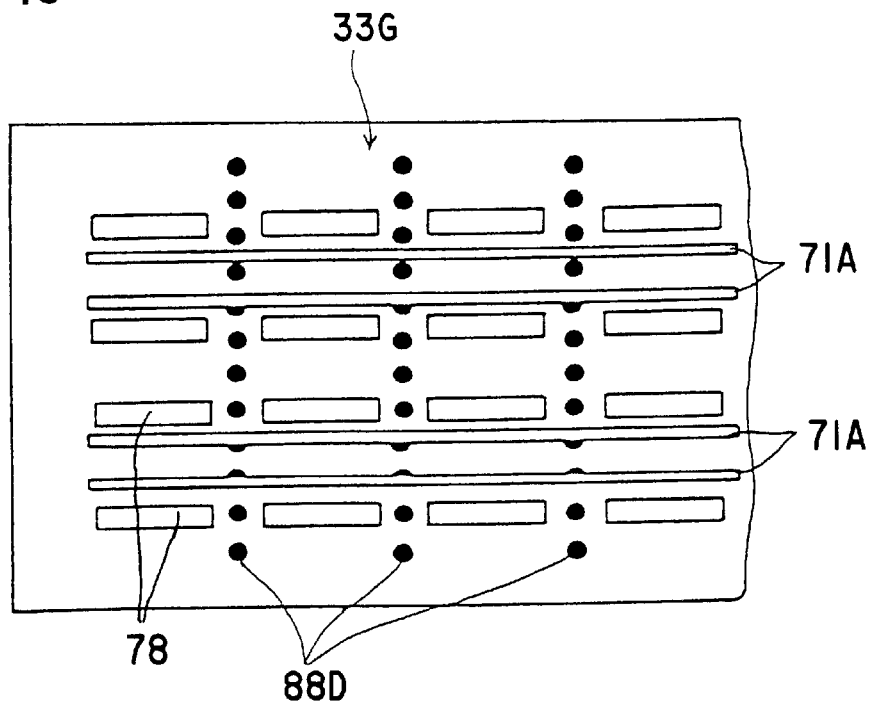
FIG. 45 illustrates the fourth modification in which the substrate has the slits.

FIGS. 43 to 45 show modifications of the substrate 33D shown in FIG. 42.

A substrate 33E shown in FIG. 43 is provided with slits 88B in the direction of the arrow Y as well as in the direction of the arrow X. Cross-shaped dicing marks 39 for indicating the dicing positions are also formed in predetermined positions. Each of the dicing marks 39 is made up of two slits, and the slits 88B and the dicing marks 39 can be collectively formed.

A substrate 33F shown in FIG. 44 is provided with slits 88C which consist of slits extending in the direction of the arrow X and slits extending in the direction of the arrow Y. Since the slits in the direction of the arrow X are perpendicular to the slits in the direction of the arrow Y, the slits 88C can evenly absorb stresses.

A substrate 33G shown in FIG. 45 is characterized by circular slits (holes) 88D. The shape of the slits is not limited to those shown in FIGS. 42 to 44, but it can have other shapes, as long as stresses can be efficiently alleviated. Also, the slits are not necessarily uniform, but can vary in shape and size in accordance with stress distribution caused in the substrate.

Figure 47:
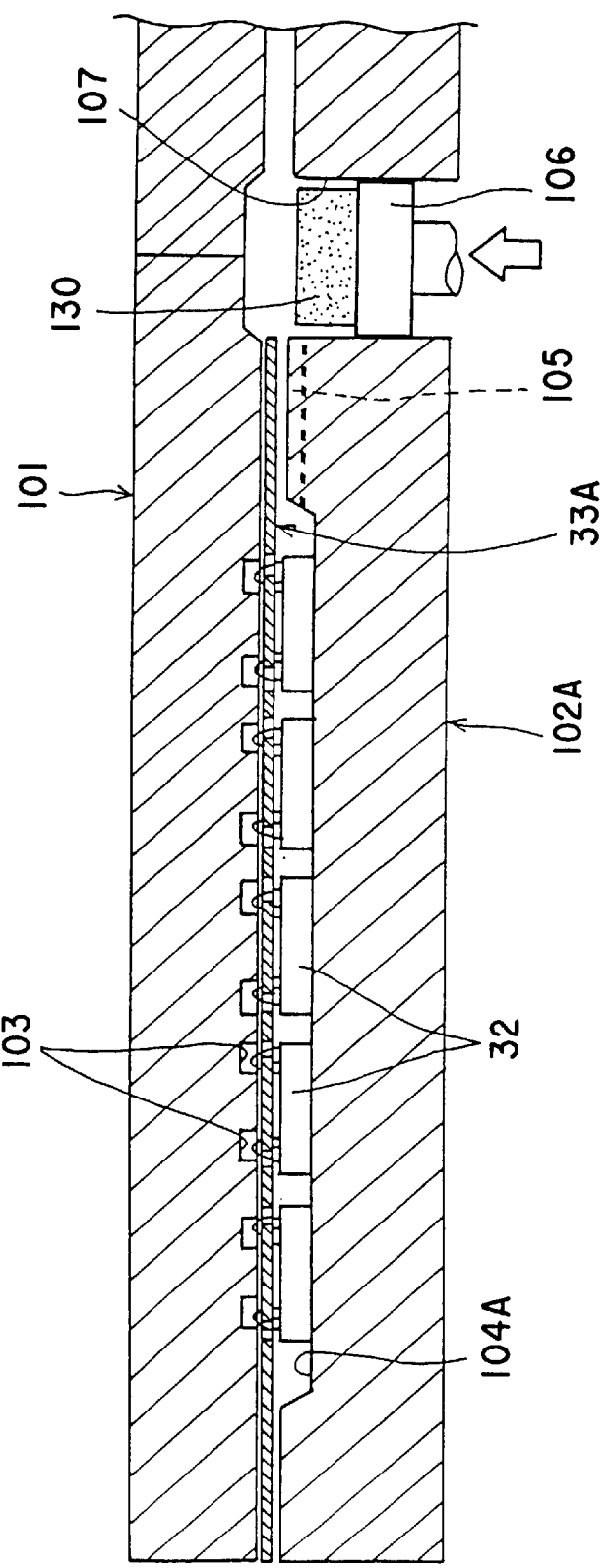
FIG. 47 illustrates a first example of a metal mold used in the molding step.

FIG. 47 shows a first example of a metal mold used in the molding step. A metal mold 100A comprises an upper mold 101 and a lower mold 102A. The semiconductor chips 32 mounted on the substrate 33A are interposed between the upper mold 101 and the lower mold 102A, and the mold resin 35A is then molded.

The upper mold 101 is provided with upper cavities 103 on its lower surface (the surface facing the substrate 33A). The upper cavities 103 are used to form the connecting portion sealing resins 41D, and correspond to the positions of the metal wires protruding via the insertion holes 78 formed in the substrate 33A. The upper mold can be replaced with another one depending on the type of the semiconductor chips 32 (size or position of the metal wires 39). Thus, even if the semiconductor chips 32 vary in type, it is unnecessary to replace the entire metal mold 10A, and the cost of the metal mold can be reduced accordingly.

The lower mold 102A is provided with a lower cavity 104A, and the semiconductor chips 32 are mounted on the upper surface of the lower cavity 104A. The lower cavity 104A is large enough to accommodate the semiconductor chips 32 all together. If the type of the semiconductor chips 32 varies, it is unnecessary to replace the lower cavity 104A with another one. A pot 107 is formed in the center of the lower mold 102A, and a plunger head 106 is disposed in the pot 107. Tablet-shaped resin 130 to be the mold resin 35A is placed on the plunger head 106. The plunger head 106 slides up and down in the pot 107 by means of a press device (not shown). A lower gate 105 is formed between the pot 107 and the lower cavity 104A. The lower mold 102A is also provided with a heater (not shown) near the pot 107 to heat and melt the resin 130.

When the semiconductor chips 32 attached to the substrate 33A are interposed between the upper mold 101 and the lower mold 102A, the plunger head 106 moves upward, and the melted resin 130 enters the cavities 103 and 104A through the lower gate 105, thereby forming the mold resin 35A. Here, the lower surface holding portions 43A (formed between the semiconductor chips 32 and the substrate 33A) and the connecting portion sealing resins 41D are collectively formed.

Figure 48:
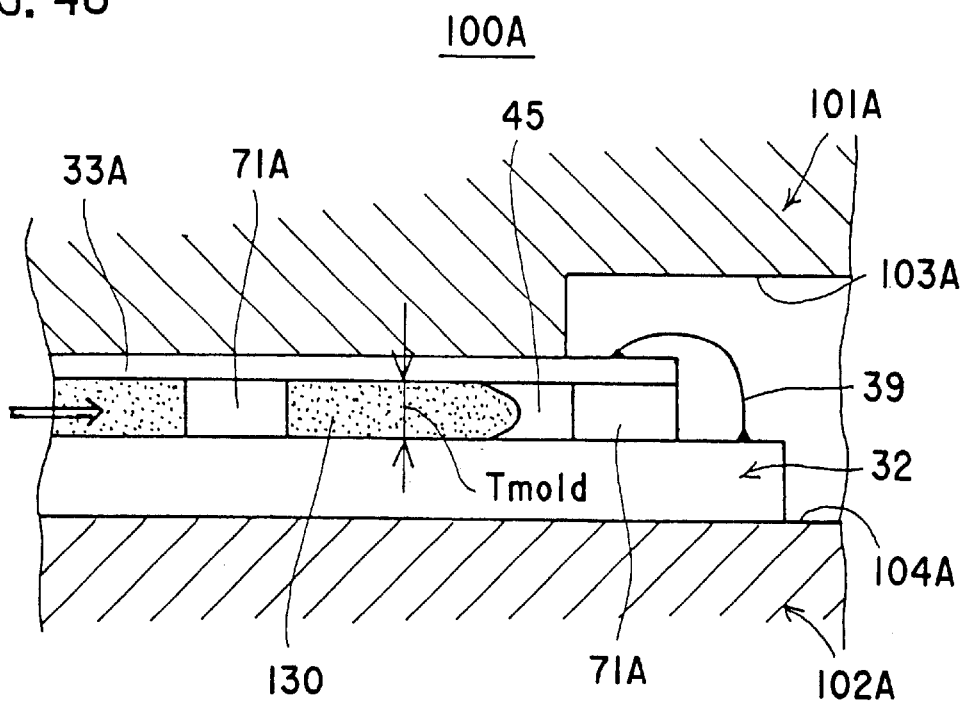
FIG. 48 illustrates filler contained in the mold resin.
Figure 49:
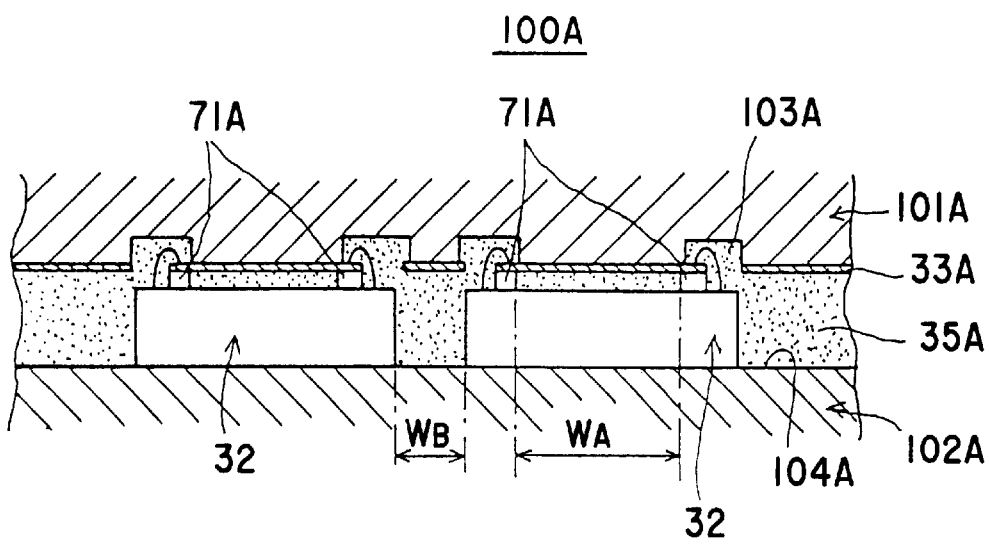
FIG. 49 illustrates the filler contained in the mold resin.

FIG. 48 illustrates the resin 1390 being filled into the opening (i.e., the interposing portion 45) between the semiconductor chip 32 and the substrate 33A. FIG. 49 shows the resin 130 filled in the opening (i.e., the interposing portion 45) between the semiconductor chip 32 and the substrate 33A.

As is well known, the resin 130 contains filler (not shown) to obtain desired viscosity, thermosetting property, and strength. The filler is made up of grains, and if the maximum size of each grain (hereinafter referred to as "maximum filler diameter R") is large, some trouble might be caused during the filling of the resin 130.

In FIGS. 48 and 49, the opening distance between the semiconductor chips 32 and the substrate 33A is indicated by $T_{mold}$, the distance between the bonding members 71A on each of the semiconductor chips 32 is indicated by $W_A$, and the distance between the semiconductor chips 32 is indicated by $W_B$. Here, the relationships between the values are $T_{mold} > R$, $W_A > R$, and $W_B > R$. More specifically, since the maximum filler diameter R is approximately 75 μm, each of the distances $T_{mold}$, $W_A$, and $W_B$, is set at 75 μm or longer (100 μm, for instance). With this structure, the filler can be prevented from getting stuck between the semiconductor chips 32 and the substrate 33A, between the bonding members 71A, and between the semiconductor chips 32. Thus, the filling of the resin 130 can be smoothly carried out.

Meanwhile, when the semiconductor chips 32 attached to the substrate 33A are interposed between the upper mold 101 and the lower mold 102A, the substrate 33A is partially clamped between the upper mold 101 and the lower mold 102A. Therefore, clamp portions are formed in the substrate 33A.

FIG. 50A shows conventional clamp portions 108A formed in the substrate 33A. When the filling area of the resin 130 is wide, only low resin injection pressure is caused even if the area of each of the clamp portions 108A is small as shown in FIG. 50A. In such a case, the substrate 33 is not shifted. However, it is necessary to fill the resin 130 into narrow openings such as the upper cavities 103 and the interposing portions 45 between the semiconductor chips 32 and the substrate 33A, resulting in high resin injection pressure. With the conventional small clamp portions 108A, the substrate 33A might be shifted, bent, or warped.

In this embodiment, on the other hand, clamp portions 108B are larger than the clamp portions 108A, as shown in FIG. 50B. With the larger clamp portions 108B, the substrate 33A can be firmly held between the upper mold 101 and the lower mold 102A, and be prevented from being shifted. Also, the substrate 33A can be prevented from being bent or warped due to an increase of a clamping force. Thus, more accurate molding can be carried out.

Figure 51:
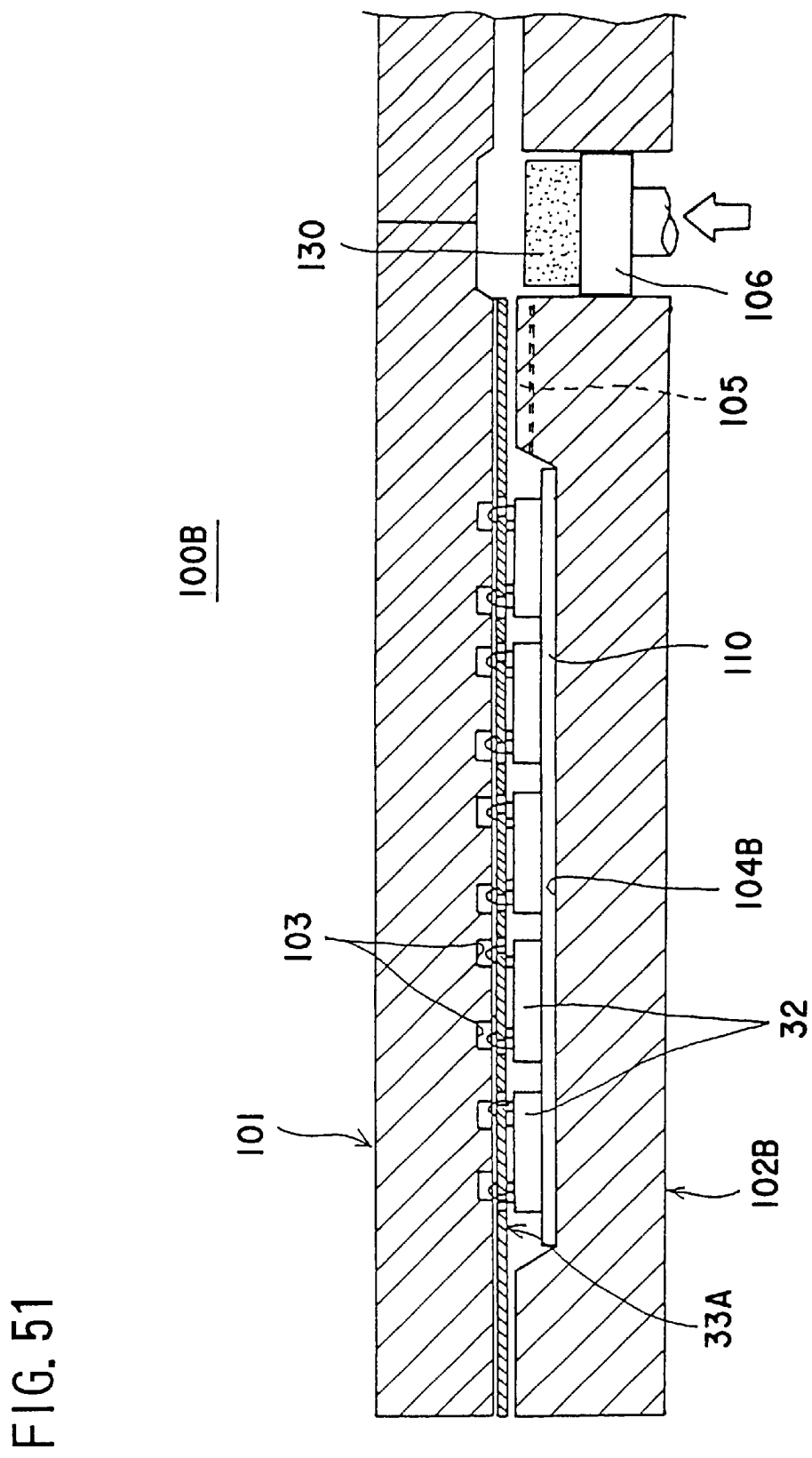
FIG. 51 illustrates a second example of a metal mold used in the molding step.
Figure 52:
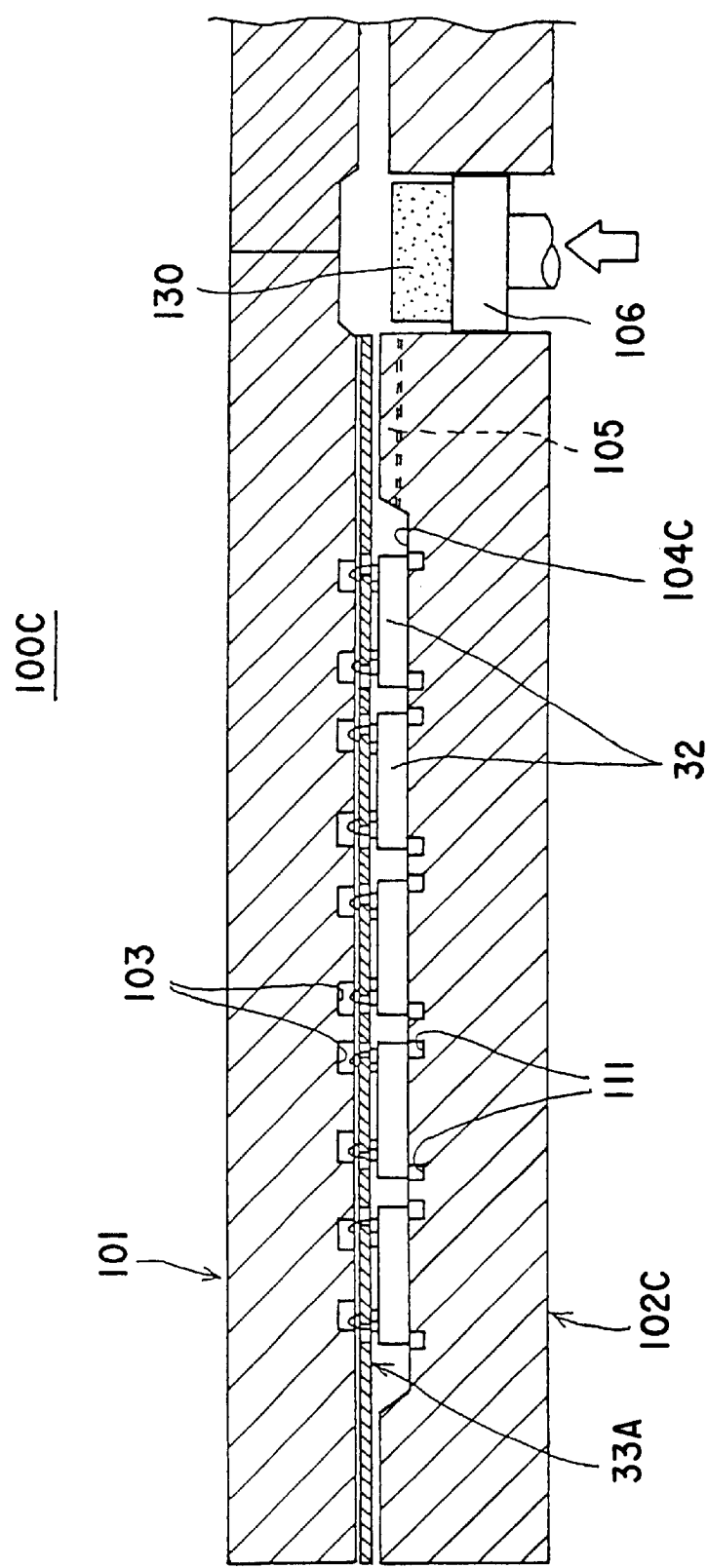
FIG. 52 illustrates a third example of a metal mold used in the molding step.

FIG. 51 illustrates a second example of a metal mold used in the molding step. In FIGS. 51 and 52, the same components as in the metal mold 100A of the first example shown in FIG. 47 are indicated by the same reference numerals.

In the metal mold 100A of the first example shown in FIG. 47, the semiconductor chips 32 are directly attached onto the lower cavity 104A of the lower mold 102A. In a metal mold 100B of this example, however, an elastic sheet member 110 (a temporary film) is disposed on the upper surface of a lower cavity 104B of a lower mold 102B, and the semiconductor chips 32 are mounted on the elastic sheet member 110. The material of the elastic sheet member 110 is polyimide tape, for instance.

In the metal mold 1001, when the semiconductor chips 32 attached to the substrate 32A are clamped between the upper mold 101 and the lower mold 102B, the semiconductor chips 32 are pressed onto the elastic sheet member 110. Even if there are some differences such as height variation among the semiconductor chips 32 and the substrate 33A, the elastic sheet member 110 can take up the differences, because the elastic sheet member 110 is deformed by the pressure from the semiconductor chips 32. Thus, resin leak or resin attachment to unnecessary areas can be prevented, and highly accurate molding can be carried out. Also, the elastic sheet member 110 also functions as a releasing member, and the mold resin 35A can be easily released from the metal mold 1003.

FIG. 52 illustrates a third example of a metal mold used in the molding step. A metal mold 100C of this example is characterized by resin entering grooves 111 formed in a lower cavity 104C facing the semiconductor chips 32. The resin entering grooves 111 prevent the resin 130 from entering between the semiconductor chips 32 and the lower cavity 104C. Each of the resin entering grooves 111 surrounds the corresponding semiconductor chip 32 in a rectangular shape. Even if the resin 130 flows toward between the semiconductor chips 32 and the lower cavity 104C at the time of filling the resin 130, the resin 130 is trapped in the resin entering grooves 111, and cannot enter between the semiconductor chips 32 and the lower cavity 104C. Thus, the rear surface (opposite to the surface attached to the substrate 33A) of the semiconductor chips 32 can be free of waste resin. This eliminates the conventional resin removing step (normally carried out by hand) after the molding step.

Figure 53A:
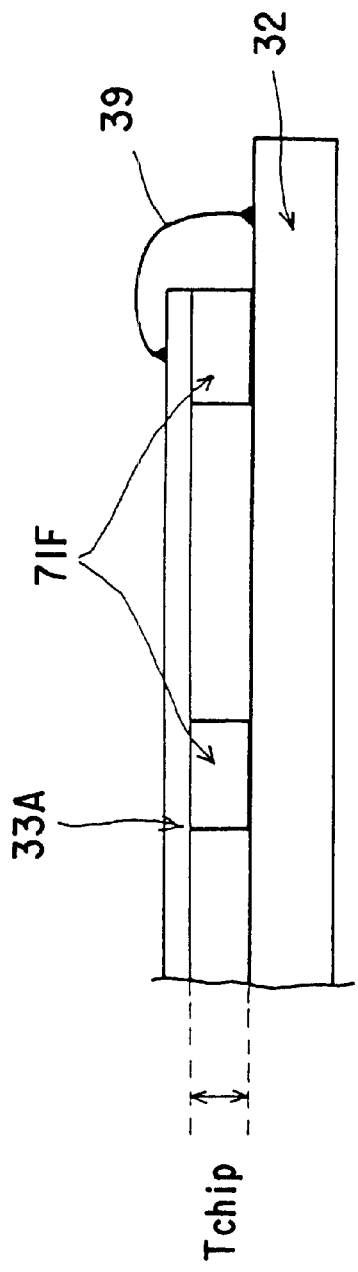
FIGS. 53A and 53B illustrate a situation in which the bonding members are made of an elastic material.
Figure 53B:
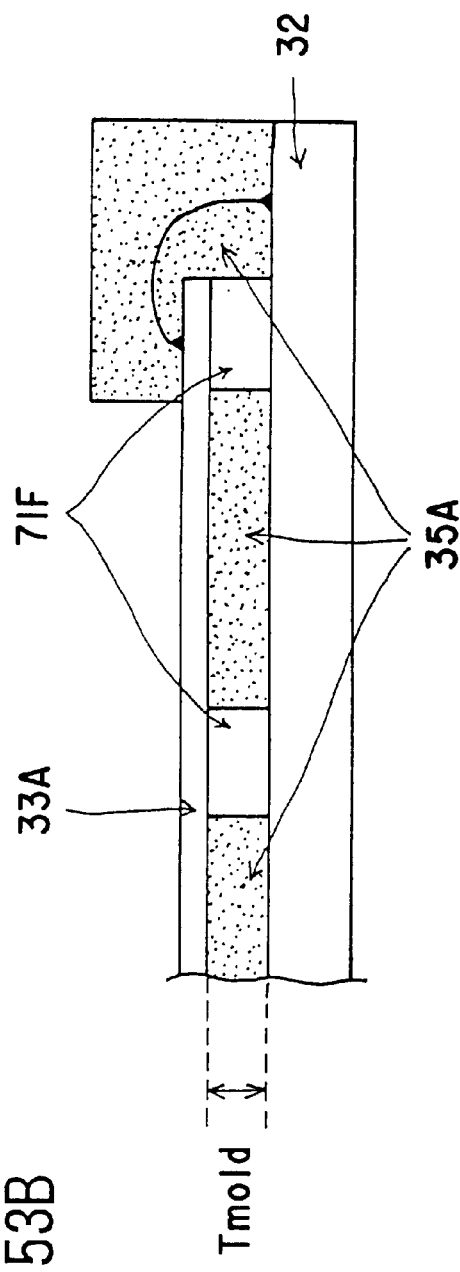

FIGS. 53A and 53B illustrate bonding members 71F formed from an elastic material in the bonding member disposing step. The bonding members 71F can be made of polyimide, for instance.

FIG. 53A illustrates the chip mounting step in which the substrate 33A is disposed on the semiconductor chip 32 via the bonding members 71F made of an elastic material. In this figure, the opening distance between the semiconductor chip 32 and the substrate 33A is indicated by $T_{chip}$. FIG. 53B illustrates a condition after the molding step.

When the semiconductor chip 32 (attached to the substrate 33A) is clamped between the upper mold 101 and the lower mold 102A in the molding step, a pressing force (which pushes the semiconductor chip 32 and the substrate 33A toward each other) is caused onto the semiconductor chip 32 and the substrate 33A. The bonding members 71F made of an elastic material interposed between the semiconductor chip 32 and the substrate 33A is elastically deformed in the pressing direction. Accordingly, the opening distance $T_{mold}$ (shown in FIG. 53B) between the semiconductor chip 32 and the substrate 33A after the molding step is shorter than the opening distance $T_{chip}$ between the semiconductor chip 32 and the substrate 33A prior to the molding step. In this condition, the molding step is carried out to form the mold resin 35A.

Even if there are differences such as height variations in the substrate 33A and the semiconductor chips 32, the bonding members 71F is elastically deformed to take up the differences. Thus, resin leak and waste resin attachment that are normally caused due to height variations in the substrate 33A and the semiconductor chips 32 can be avoided, and highly accurate molding can be carried out.

FIGS. 54A and 54B show the metal wires 39 sealed by potting resin in the molding step. In the molding step, a transfer molding technique in which a metal mold is only used to form the mold resin 35A (the connecting portion sealing resin 41A) in the interposing portions 45 is employed. After the transfer molding, the metal wires 39 are exposed, a shown in FIG. 54A. The substrate 33A and the semiconductor chips 32 provided with the mold resin 35A (the connecting portion sealing resin 41A) are then taken out from the metal mold, and a potting resin 112 for sealing the metal wires 39 are formed by potting with a dispenser nozzle 113, as shown in FIG. 54B.

With this structure, there is no need to form the minute upper cavities 103 (shown in FIG. 47), and the cost of the metal mold can be reduced. Also, the mold resin 35A (the connecting portion sealing resin 41D) can be prevented from being damaged by the upper cavities 103 that often hinders smooth mold release.

Figure 55:
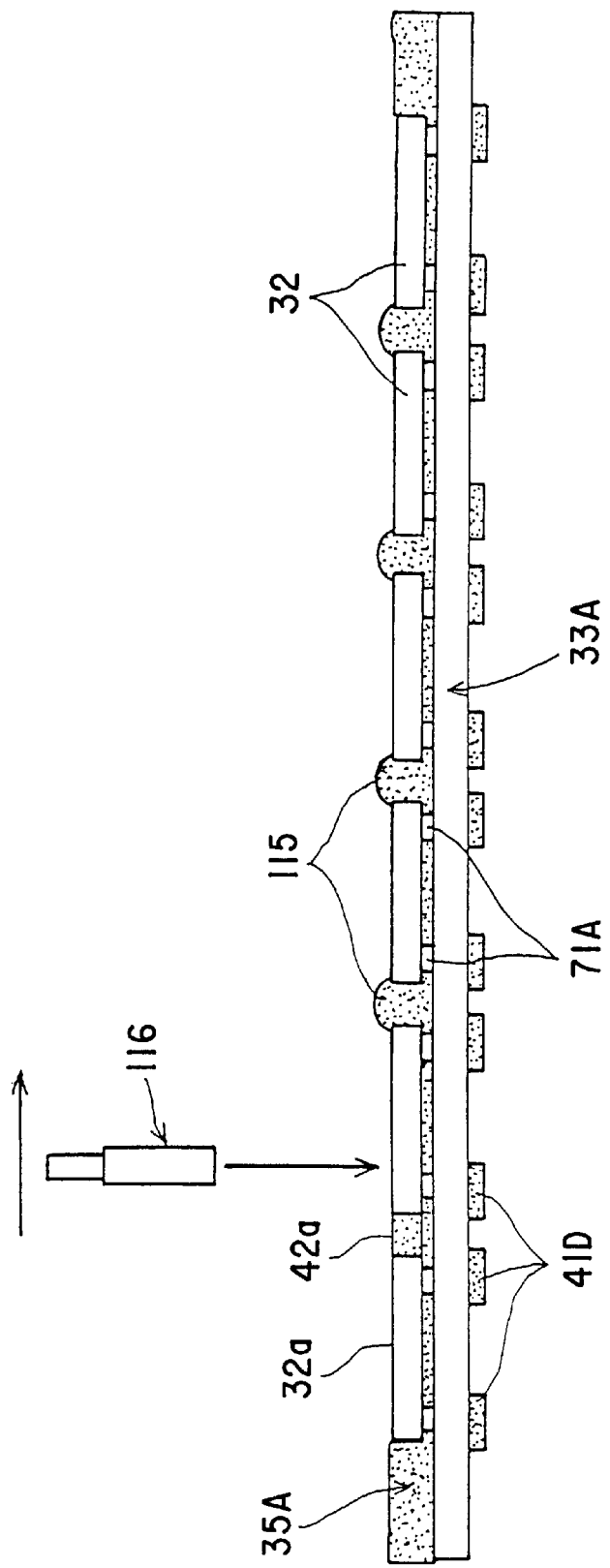
FIG. 55 illustrates a waste resin removing step.

FIG. 55 illustrates a waste resin removing step carried out after the molding step. In the waste resin removing step, residual waste resin 115 (hereinafter referred to as "waste resin") is removed by laser irradiation.

When the semiconductor chips 32 and the substrate 33A provided with the mold resin 35A are taken out from the metal mold after the molding step, the waste resin 115 might remain between the neighboring semiconductor chips 32 or on the rear surfaces of the semiconductor chips 32, as shown in FIG. 55. If the waste resin 115 is left as it is, leak would be caused in the positions of the waste resin 115, and the semiconductor devices 70A (shown in FIG. 23) to be produced could not be firmly chucked at the time of transporting by a vacuum chuck.

To eliminate such a problem, the waste resin 115 is removed after the molding step, so that the rear surfaces opposite to the surface attached to the substrate 33A) of the semiconductor chips 32 can be on the same plane as the upper surface 42a of the mold resin 35A. By doing so, the semiconductor device 70A to be produced can have a smooth upper surface, and can be transported by a vacuum chuck at the time of mounting. Also, since the waste resin 115 is removed by lasers, the removing can be carried out more efficiently and accurately than the conventional removing by hand.

When a laser device 116 is used, care should be taken not to adversely influence the semiconductor chips 32 by lasers. In this embodiment, the wavelengths of lasers emitted from the laser device 116 are set at 10 nm to 800 nm, so that the waste resin 115 can be efficiently removed without adversely influencing the semiconductor chips 32.

Although the waste resin 115 is removed by the laser device 116 in the above example, it is also possible to employ a water jet technique in which high pressure water is jetted to remove waste resin, or a sandblasting technique in which minute grains are blown to remove waste resin.

Figure 56:
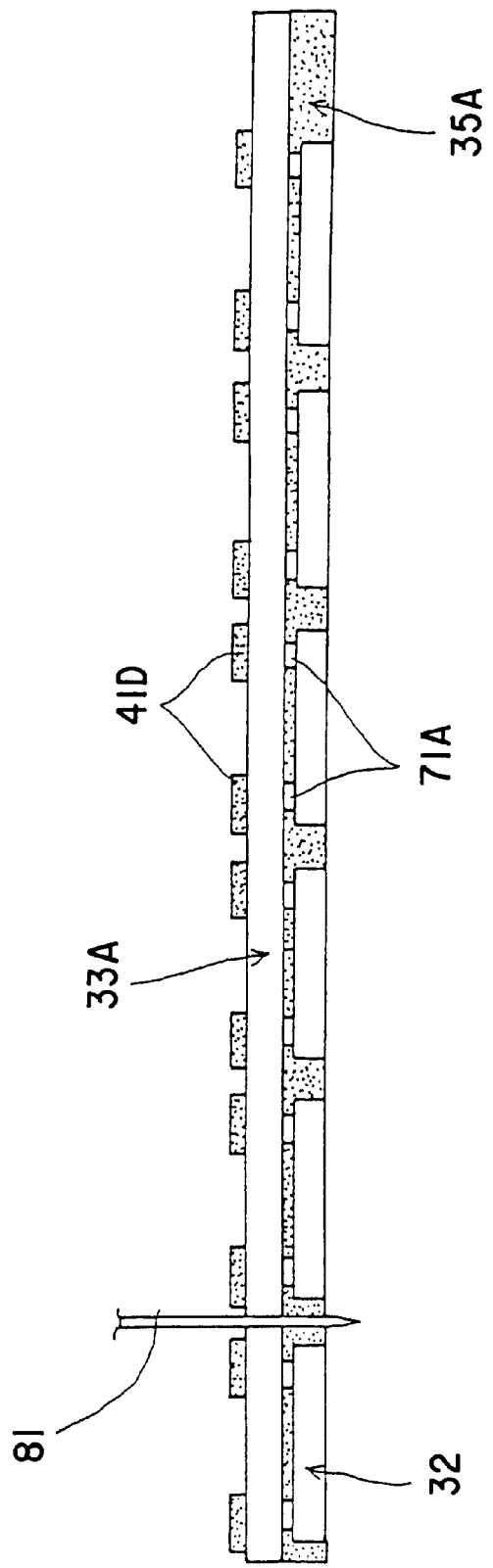
FIG. 56 illustrates the second cutting step in more detail.

FIG. 56 illustrates the second cutting step in more detail. In the second cutting step, as shown in FIG. 46, the dicing saw 81 cuts the mold resin 35A from the side to the semiconductor chips 32. In this example, on the other hand, the dicing saw 81 collectively cuts the molding resin 35A and the substrate 33A from the side of the substrate 33A. In this manner, the substrate 33A can be used as a reference in determining the cutting positions. The substrate 33A is already provided with a wiring pattern, and cutting marks can also be marked on the substrate 33A.

In a case where the slits 88A to 88D are formed, the slits 88A to 88D can be used as positioning marks. When cutting is carried out from the side of the substrate 33A, things formed on the substrate 33A (the wires, the land 77, the insertion holes 78, and the slits 88A to 88D) can be used as the positioning marks. Thus, accurate cutting can be carried out.

Also, the mold resin 35A and the substrate 33A are collectively cut in this embodiment. As a result, the side surfaces 72A of the mold resin 35A and the side surfaces 73A of the substrate 33A form the side surfaces of the produced semiconductor device 70A (shown in FIG. 23). Unlike the conventional gate-break technique, no gate-break marks are left on the surfaces of the semiconductor device 70A. Thus, the appearance of the semiconductor device 70A can be improved, and the mold resin 35A can be prevented from being nicked by gate breaking.

The following is a description of another embodiment of a semiconductor device production method of the present invention. In the method of this embodiment, the semiconductor device 70B shown in FIG. 24 is produced. In the following description, the same components as in FIG. 24 are indicated by the same reference numerals.

The method of producing the semiconductor device 70B includes a semiconductor substrate disposing step, a first cutting step, an expansion step, a substrate disposing step, a resin forming step, an external connecting terminal forming step, a second cutting step, and a releasing step.

Figure 57:
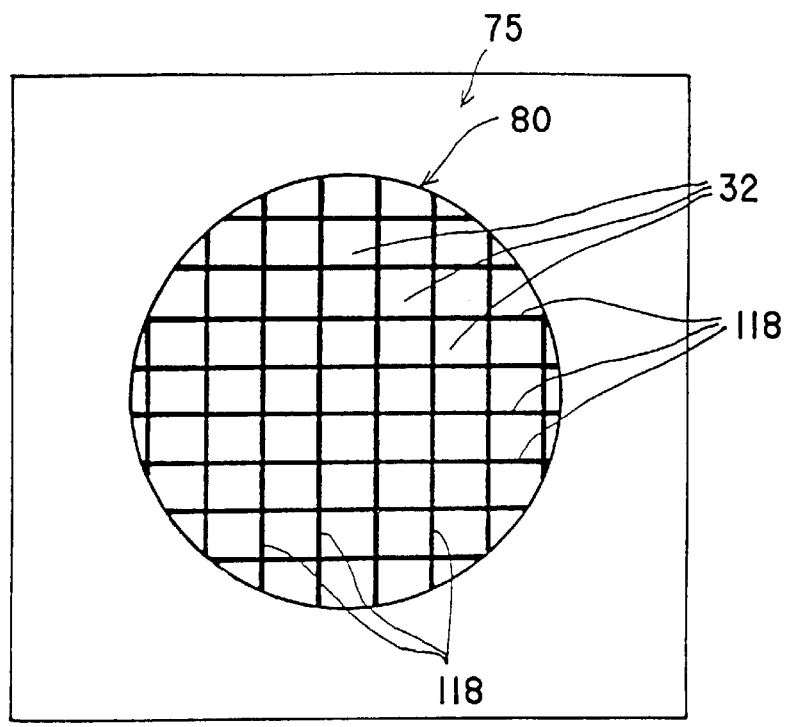
FIG. 57 illustrates a semiconductor substrate disposing step of a second example of a semiconductor device production method of the present invention.

FIG. 57 illustrates the semiconductor substrate disposing step, in which the wafer 80 (a semiconductor substrate) is evenly disposed on an expandable sheet member 75. The wafer 80 is provided with the semiconductor chips 32, and wafer dicing positions 118 are formed between the semiconductor chips 32. The wafer 80 is disposed on the expandable sheet member 75 with an adhesive which is strong enough to secure the wafer 80 (or the semiconductor chips 32) even when the expandable sheet member 75 expands. The expandable sheet member 75 is a fluororesin sheet, for instance, and its elongation percentage is 300% to 700%. The elongation percentage P is calculated by a formula, $P=\{(W2-W1)/W1\}\times 100$ (%), where W1 is the length of the expandable sheet member 75 prior to expansion, and W2 is the length of the extensile sheet member 75 after expansion.

FIG. 69 shows four types of expandable sheet members which can be employed in this embodiment. The elongation percentage of each of the expandable sheet members A to D is 300% to 700%. By selecting a material having a high elongation percentage for the expandable sheet member 75, the distance between the semiconductor chips 32 can be surely maintained at a desired value in the later-described expansion step.

The semiconductor substrate disposing step is followed by the first cutting step. In the first cutting step, the wafer 80 is cut at the wafer dicing positions 118 with a dicing saw (not shown), thereby producing individual semiconductor chips 32. The dicing saw cuts the wafer 80, but does not cut the expandable sheet member 75. Accordingly, after the first cutting step, the individual semiconductor chips 32 are still fixed to the expandable sheet member 75.

Figure 58:
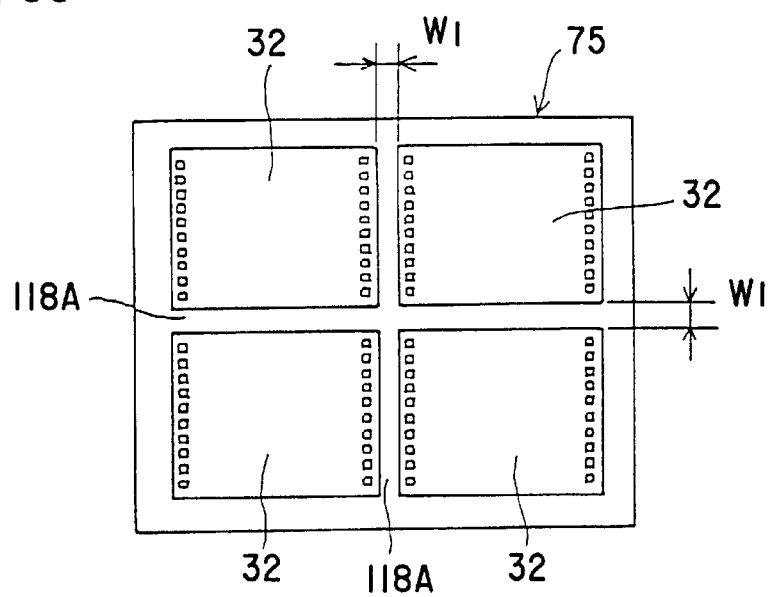
FIG. 58 illustrates a first cutting step of the second example of the semiconductor device production method of the present invention.

FIG. 58 shows the semiconductor chips 32 and the expandable sheet members 75 after the cutting step. There are only four semiconductor chips 32 shown in the figure for ease of drawing. Clearances 118A formed by the dicing are situated between the semiconductor chips 32, and only the expandable sheet member 75 exists in the clearances 118A. The width of each of the clearances 118A is indicated by W1 in FIG. 58.

The first cutting step is followed by the expansion step. FIGS. 59 to 61B illustrate the expansion step. In this step, the expandable sheet member 75 is expanded to elongate the distance between the individual semiconductor chips 32.

Figure 59:
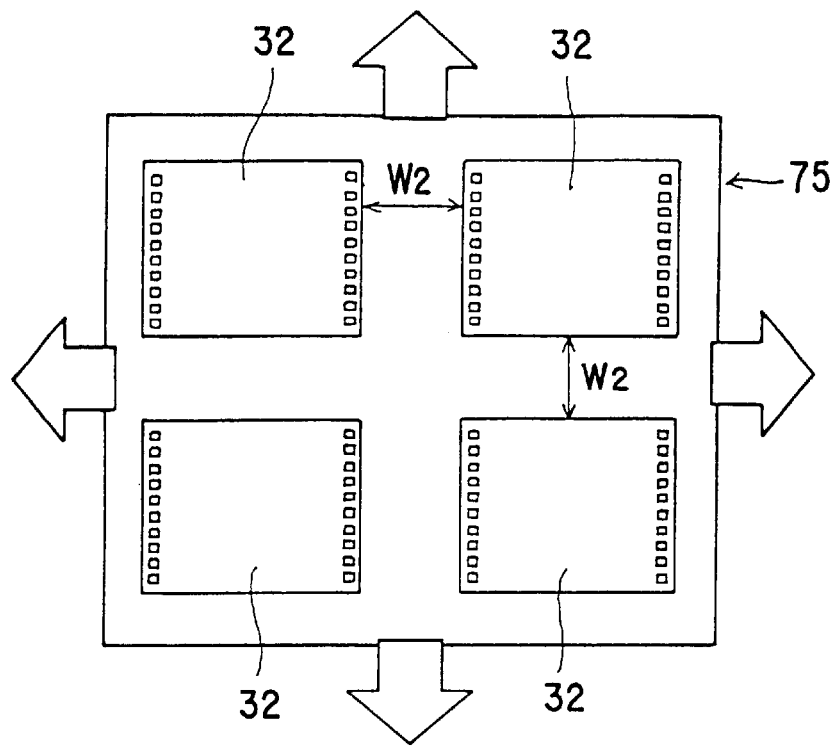
FIG. 59 illustrates an expansion step of the second example of the semiconductor device production method of the present invention.
Figure 60:
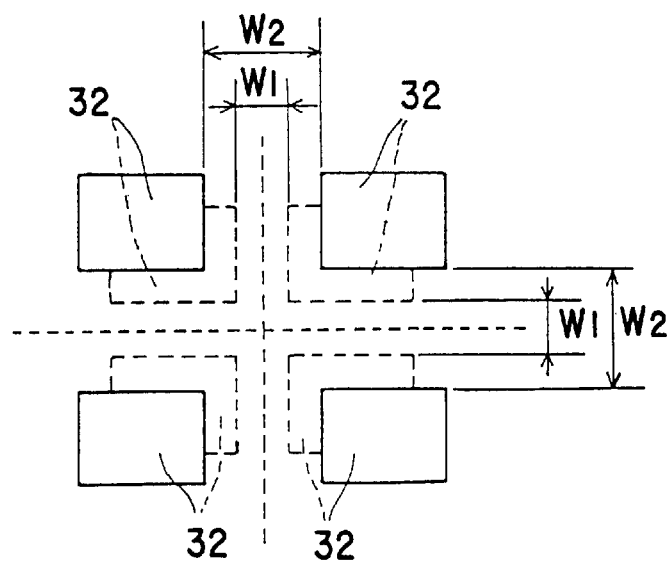
FIG. 60 illustrates the expansion step of the second example of the semiconductor device production method of the present invention.
Figure 61A:
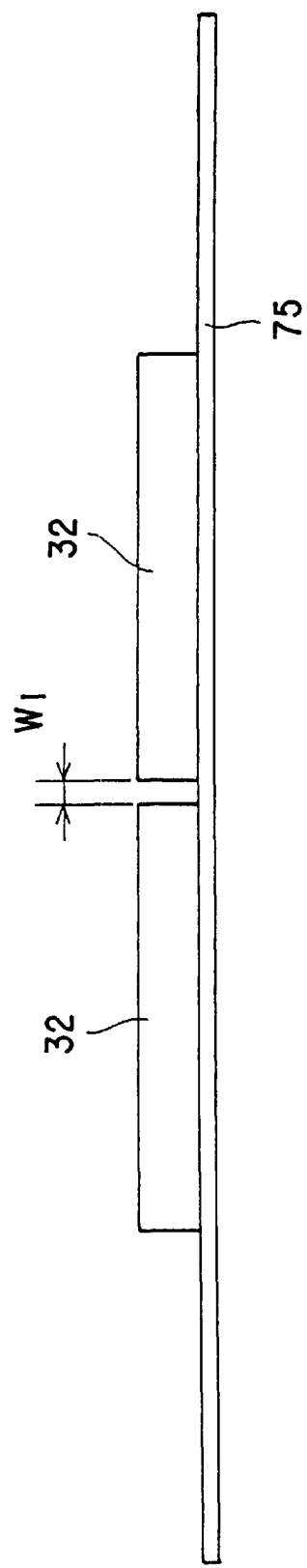
FIGS. 61A and 61B illustrate the expansion step of the second example of the semiconductor device production method of the present invention.
Figure 61B:
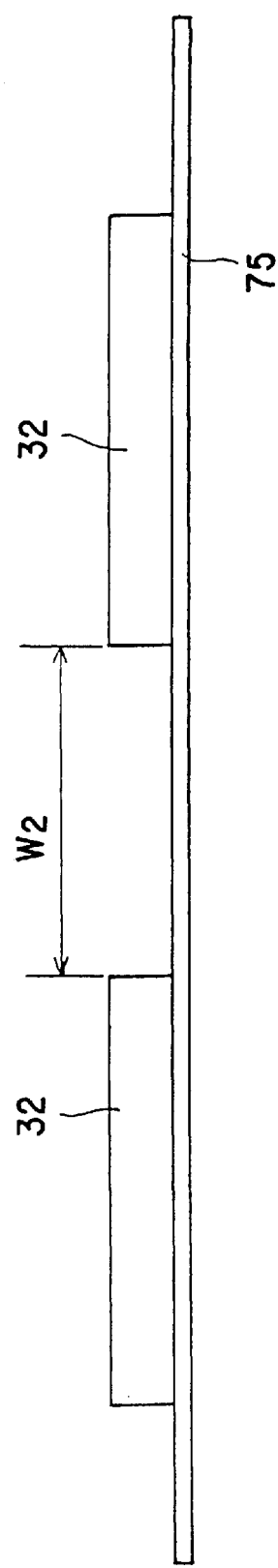

More specifically, the expansion sheet member 75 provided with the semiconductor chips 32 is attached to an expanding device (not shown), and is expanded in four directions indicated by arrows in FIG. 59. Since the material of the expandable sheet member 75 has a high elongation percentage, the expandable sheet member 75 can be expanded evenly in each of the four directions. To facilitate the expanding of the expandable sheet member 75, the environmental temperature of the expandable sheet member 75 can be set at a suitable temperature for expansion. The expanding directions of the expandable sheet member 75 are not limited to the four directions indicated by the arrows in FIG. 59, but the expandable sheet member 75 may also be expanded in other directions as long as it is evenly expanded.

By expanding the expandable sheet member 75 in the expansion step, the width of each of the clearances 118A between the semiconductor chips 32 is elongated from W1 to W2 (W2>W1). In other words, the distance between the adjacent semiconductor chips 32 can be elongated from W1 to W2, while the semiconductor chips 32 remain fixed to the expandable sheet member 75.

If the distance between the semiconductor chips 32 is changed from W1 to W2 without the expandable sheet member 75, it would be necessary to detach the semiconductor chips 32 from a sheet member (non-expandable) after t first cutting step, and then dispose the semiconductor chips 32 on another sheet member at intervals W2. The detaching and re-disposing of the semiconductor chips 32 would complicate the production procedures and lower the production efficiency. In the expansion step of this embodiment, on the other hand, it is unnecessary to remove the semiconductor chips 32 to another sheet member, and the distance between the semiconductor chips 32 can be easily and efficiently elongated.

Figure 62:
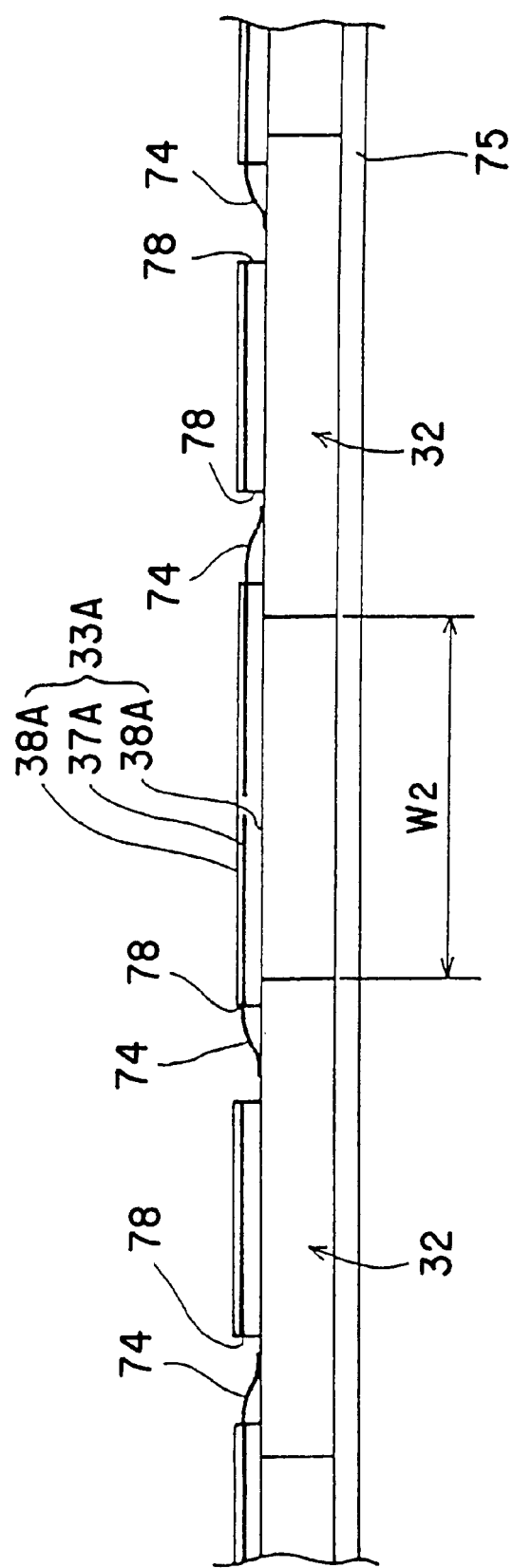
FIG. 62 illustrates a substrate disposing step of the second example of the semiconductor device production method of the present invention.

The expansion step is followed by the substrate disposing step (inter power disposing step). FIG. 62 illustrates the substrate disposing step.

In the substrate disposing step, the substrate 33A is placed on the semiconductor chips 32 with an adhesive so that the semiconductor chips 32 are electrically connected to the substrate 33A. As described above, the distance between the semiconductor chips 32 are elongated, and the substrate 33A is also disposed between widely apart two semiconductor chips 32. In FIG. 62, the substrate 33A is also disposed in a region indicated by an arrow W2.

To connect the semiconductor chips 32 to the substrate 33A, lead wires 74 extending from the wiring layer 37A penetrate through the insertion holes 78 in the substrate 33A, and the lead wires 74 are connected to the semiconductor chips 32. The connection between the semiconductor chips 32 and the substrate 33A is not limited to wire bonding using the metal wires 39. It is also possible to connect the lead wires 74 to the semiconductor chips 32 by a TAB technique. By the TAB technique, a plurality of lead wires 74 can be simultaneously connected with a bonding tool (not shown), thereby improving the production efficiency.

Figure 63:
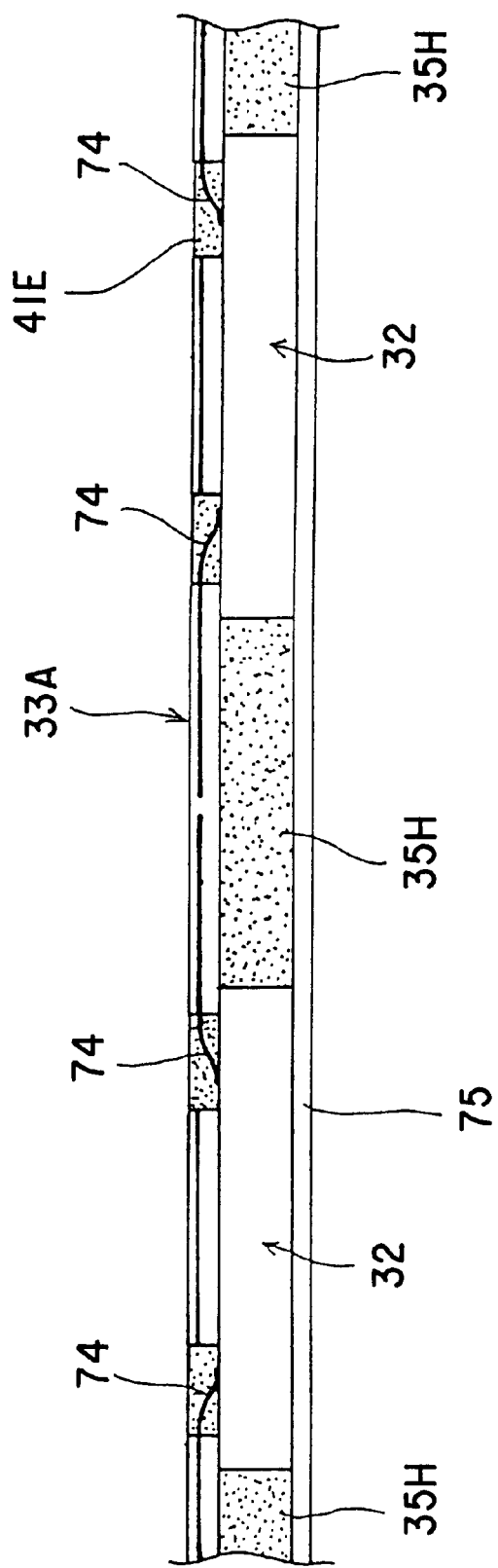
FIG. 63 illustrates a resin forming step of the second example of the semiconductor device production method of the present invention.

The substrate disposing step is followed by the resin forming step. FIG. 63 illustrates the resin forming step.

In the resin forming step, a mold resin 35H is formed in the clearances between the semiconductor chips 32 and in the connecting positions where the semiconductor chips 32 and the substrate 33A are electrically connected (i.e., the connecting positions of the lead wires 74). In this embodiment, the mold resin 35H (including connecting portion sealing resins 41E) is by transfer molding using a metal mold as in the other embodiments, but it is also possible to form the mold resin 35H by a potting technique.

The resin forming step is carried out to firmly fix the semiconductor chips 32 and the substrate 33A with the mold resin 35H. Here, the lead wires 74 are protected by the connecting portion sealing resins 41E. In this embodiment, the expandable sheet member 75 is disposed on the rear surfaces (the lower surfaces in the FIG. 63) of the semiconductor chips 32, and the expandable sheet member 75 also functions as a release member. Thus, the mold resin 35H can be easily released from the metal mold.

Figure 64:
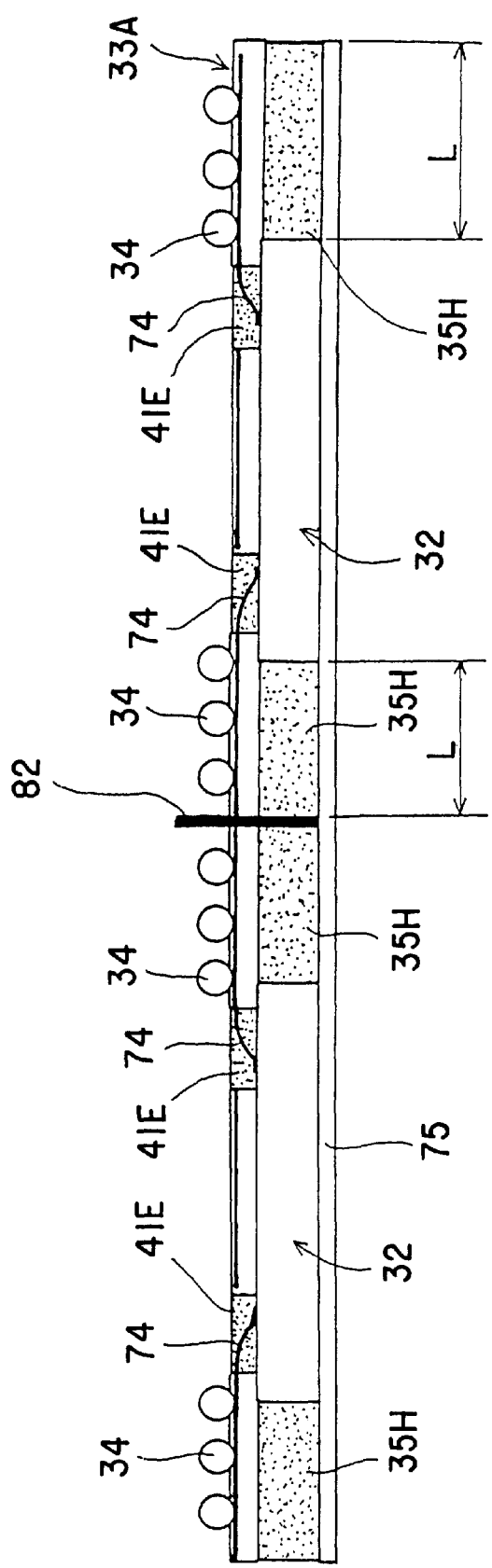
FIG. 64 illustrates an external connecting terminal forming step and a second cutting step of the second example of the semiconductor device production method of the present invention.

The resin forming step is followed by the external connecting terminal forming step and the second cutting step. FIG. 64 illustrates the external connecting terminal forming step and the second cutting step.

In the external connecting terminal forming step, the balls 34 to be the external connecting terminals are disposed in predetermined positions on the substrate 33A by a conventional transfer technique. In the second cutting step, the mold resin 35H and the substrate 33A are collectively cut into the semiconductor devices 70B. The cutting is carried out by a dicing blade (not shown) in the predetermined dicing positions 82 formed between the semiconductor chips. Here, only the mold resin 35H and the substrate 33A are cut, but the expanded sheet member 75 remains intact.

Figure 65:
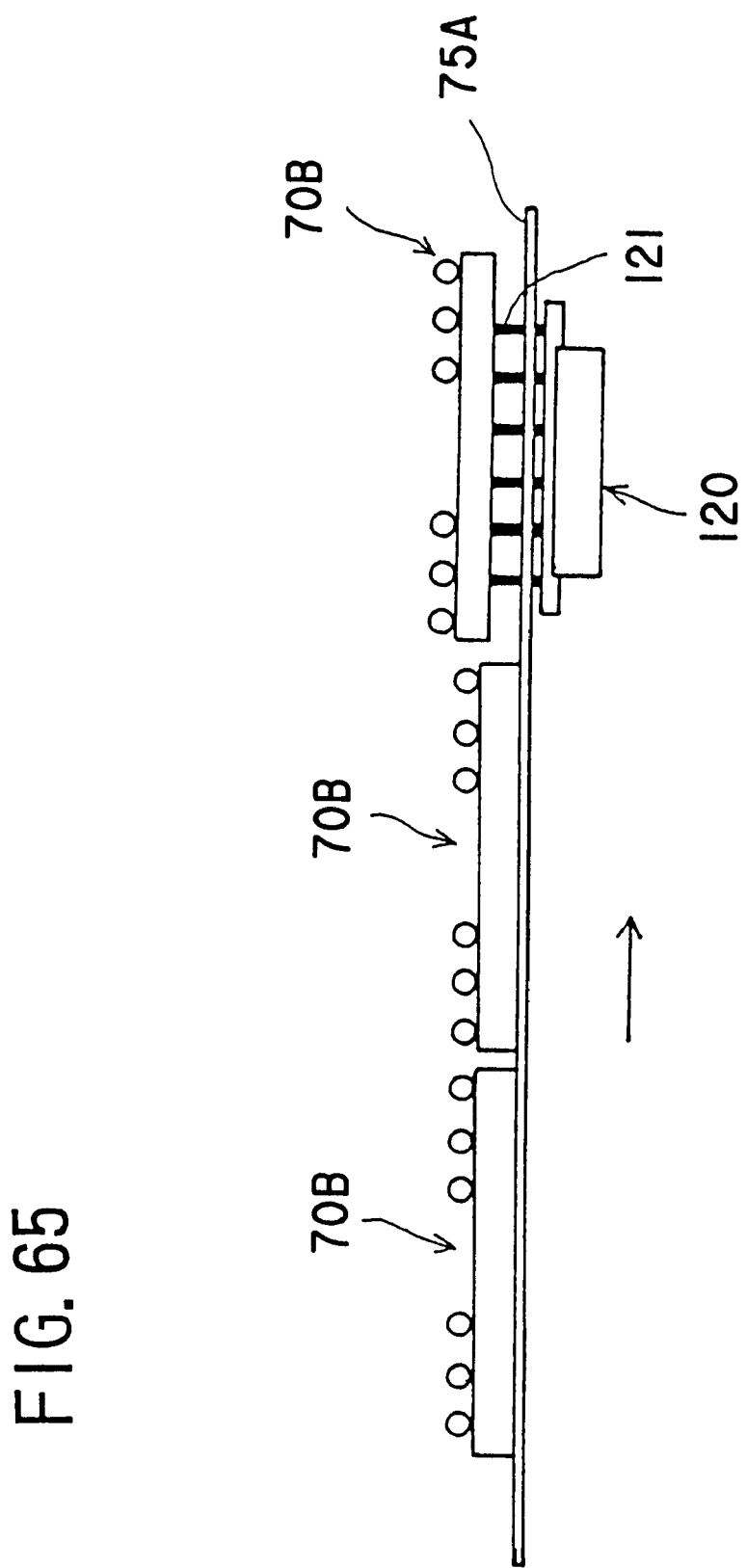
FIG. 65 illustrates a releasing step of the second example of the semiconductor device production method of the present invention.

The external connecting terminal forming step and the second cutting step are followed by the releasing step. FIG. 65 illustrates the releasing step.

In the releasing step, lifting pins 121 which penetrate the expandable sheet member 75 are used to release the individual semiconductor devices 70B from the expandable sheet member 75. More specifically, a lifting jig 120 equipped with the lifting pins 121 moves up and down with respect to the expandable sheet member 75. As the expandable sheet member 75 is transported in a direction indicated by an arrow in FIG. 65, the lifting jig 120 moves up when one of the semiconductor device 70B reaches the position above the lifting jig 120. As a result, the lifting pins 121 penetrate the expandable sheet member 75, and lift up the semiconductor device 70B. Thus, the semiconductor device 70B is released from the expandable sheet member 75.

In this embodiment, the semiconductor device 70B can be easily released from the expandable sheet member 75, as described above, by the lifting pins 121 penetrating the expandable sheet member 75 and lifting up the semiconductor device 70B. In this release step, it is also possible to employ a pickup device which has been conventional used in releasing a semiconductor chip from wafer fixing tape after wafer dicing.

The semiconductor device 70B is thus completed by carrying out the above production steps. Because of the expansion step, the distance W2 between the semiconductor chips 32 is wide, and the substrate 33A is disposed in the clearance. Accordingly, the substrate 33A protrudes outwardly from each of the semiconductor chips 32 after the mold resin 35H and the substrate 33A have been cut in the second cutting step. The protruding portions indicated by arrows L in FIG. 64 are rectangular in a plan view, and each of the protruding portions L has a large area. The balls 34 that function as external connecting terminals can be attached to the protruding portions L.

In the semiconductor device 70B produced by this method, the area of the substrate 33A is larger than the area of the semiconductor chip 32 (in a plan view). Accordingly, the balls 34 can be arranged at longer intervals than the electrode pads of the semiconductor chip 32. Thus, the semiconductor chip 32 having a plurality of terminals can be electrically connected to the printed circuit board via the balls 34, and the semiconductor device 70B can have high density.

Figure 66:
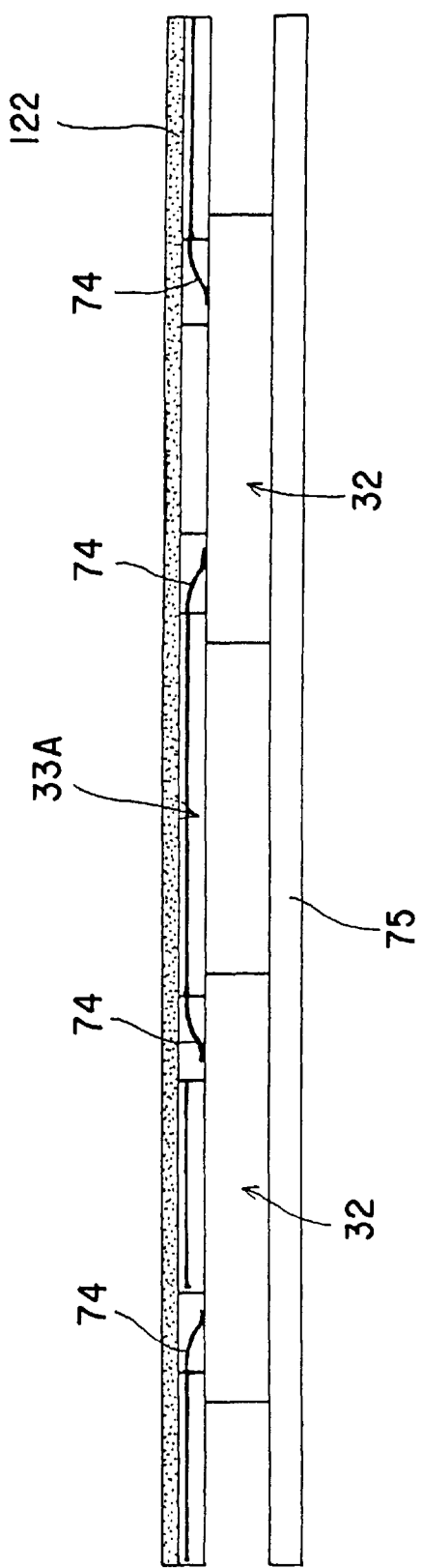
FIG. 66 shows the substrate provided with protection tape after the substrate disposing step of the second example of the semiconductor device production method of the present invention.

FIG. 66 shows the substrate 33A disposed on the semiconductor chips 32 and covered with protection tape 122 in the substrate disposing step. The protection tape 122 protects the upper surface (on which the wiring pattern is formed) of the substrate 33, so that the substrate 33A can be prevented from being damaged in the mold step and later steps, and that the elements (such as wires) formed on the substrate 33A can also be protected.

Figure 67:
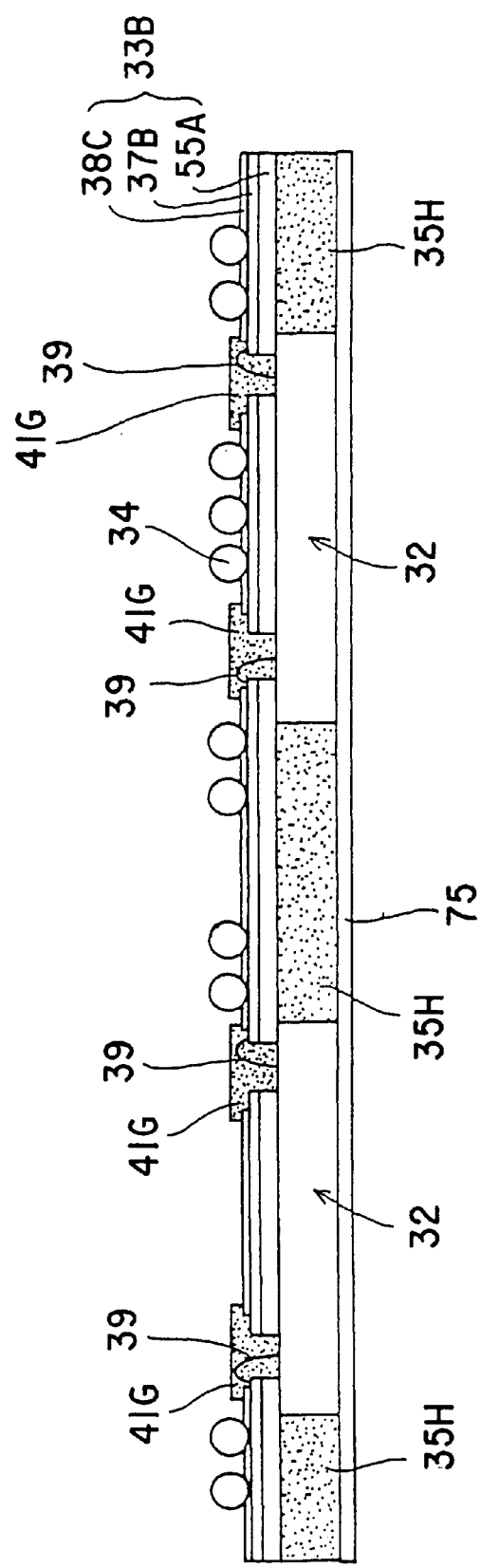
FIG. 67 shows the semiconductor chips electrically connected to the substrate by metal wires in the substrate disposing step.
Figure 68:
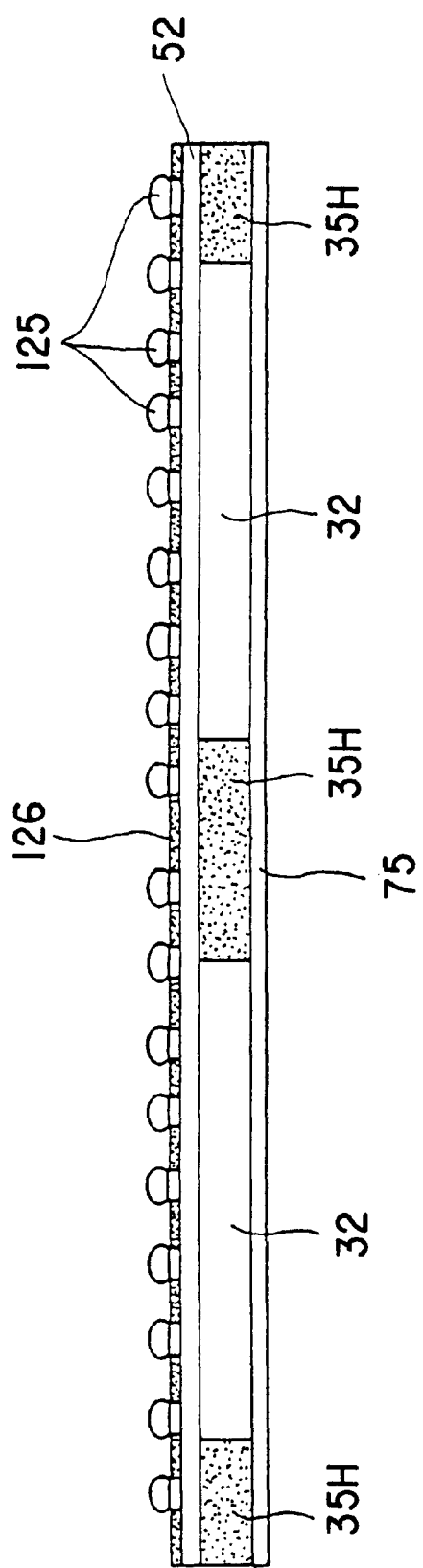
FIG. 68 shows a lead material used as the substrate in the substrate disposing step.

FIGS. 67 and 68 illustrate conditions after the resin sealing step of modifications of the semiconductor device production method.

In the modification shown in FIG. 67, the substrate 33B is a glass-epoxy wiring board having a layered structure comprising a base 55A, a wiring layer 37B, and a resist 38C. The semiconductor chips 32 are connected to the substrate 33B by the metal wires 39.

In the modification shown in FIG. 68, the lead member 52 formed by patterning a lead frame material in a predetermined pattern is used as an interposer, and the semiconductor chips 32 and the substrate 33B are connected by face-down bonding. Also, to protect the lead member 52, a cover resin 126 is formed on the upper surface of the lead member 52.

In a case where the substrate 33A, i.e., a tape-type wiring substrate (TAB tape), is used as an interposer, as in the embodiment shown in FIGS. 57 to 65, the wiring layer can be patterned at high density so as to comply with the high density of the semiconductor device 70B.

Meanwhile, in a case where the substrate 33B, i.e., a glass-epoxy wiring board, is used as an interposer, as shown in FIG. 67, the mechanical strength of the semiconductor device 70B can be improved, because the glass-epoxy wiring board has a higher rigidity than a film-type wiring board. In a case where the lead member 52 is used as an interposer, as shown in FIG. 68, the costs of the semiconductor device 70B can be reduced.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 10-175164, filed on Jun. 22, 1998, the entire contents of which are hereby incorporated by reference.

What is claimed is:

1. A semiconductor device comprising:

a semiconductor chip;

a plurality of protrusion electrodes which function as external connecting terminals, the semiconductor device being mounted to a printed circuit board via the protrusion electrodes;

an interposer which electrically connects the semiconductor chip to the protrusion electrodes;

a mold resin which seals at least a part of the semiconductor chip and a part of the interposer; and a connecting portion sealing resin which seals a connecting portion between the interposer and the semiconductor chip, wherein a thermal expansion coefficient of the mold resin is matched to a thermal expansion coefficient of the printed circuit board, wherein the mold resin is provided with a side surface holding portion which holds side surfaces of the semiconductor chip so as to restrict thermal deformation of the semiconductor chip, wherein the interposer is bonded to the semiconductor chip via a bonding member, wherein an interposing portion is formed in the bonding member, and wherein the mold resin is disposed in the interposing portion, so that the mold resin is interposed between the side surface holding portion and the connecting portion sealing resin.

2. The semiconductor device according to claim 1, wherein the protrusion electrodes are disposed on the interposer, and wherein materials interposed between the semiconductor chip and a region of the interposer above protrusion electrode disposing portions have at least one of uniform thermal expansion and uniform elasticity characteristics.

3. A semiconductor device comprising:

a semiconductor chip;

a plurality of protrusion electrodes which function as external connecting terminals, the semiconductor device being mounted to a printed circuit board via the protrusion electrodes;

an interposer which electrically connects the semiconductor chip to the protrusion electrodes;

a mold resin which seals at least a part of the semiconductor chip and a part of the interposer; and a connecting portion sealing resin which seals a connecting portion between the interposer and the semiconductor chip, wherein a thermal expansion coefficient of the mold resin is matched to a thermal expansion coefficient of the printed circuit board, wherein the mold resin is provided with a side surface holding portion which holds side surfaces of the semiconductor chip so as to restrict thermal deformation of the semiconductor chip, wherein the semiconductor device further comprises one or more semiconductor chips besides the semiconductor chip, and wherein all the semiconductor chips are stacked up in the mold resin.

4. A semiconductor device comprising:

a semiconductor chip;

a plurality of protrusion electrodes which function as external connecting terminals, the semiconductor device being mounted onto a printed circuit board via the protrusion electrodes;

an interposer which electrically connects the semiconductor chip to the protrusion electrodes;

a mold resin which seals at least a part of the semiconductor chip and a part of the interposer; and a connecting portion sealing resin which seals a connecting portion between the interposer and the semiconductor chip, wherein the mold resin is elastically deformed so as to take up stress caused by a thermal expansion difference between the semiconductor chip and the printed circuit board, wherein the interposer is bonded to the semiconductor chip via a bonding member, wherein an interposing portion is formed in the bonding member, and wherein the mold resin is disposed in the interposed portion.

5. The semiconductor device according to claim 4, wherein the semiconductor chip is connected to the interposer in a face-down fashion.

6. The semiconductor device according to claim 4, wherein, the protrusion electrodes are disposed on the interposer, and wherein materials interposed between the semiconductor chip and a region of the interposer above protrusion electrode disposing portions have at least one of uniform thermal expansion and elasticity characteristics.

7. The semiconductor device according to claim 4, wherein the semiconductor chip is provided with a heat releasing member which releases heat generated in the semiconductor chip.

8. The semiconductor device according to claim 4, wherein the interposer extends outward from an outer periphery of the semiconductor chip to form an extended region, wherein at least one of the protrusion electrodes are disposed in the extended region, and wherein side surfaces of the mold resin are situated on the same plane as side surfaces of the interposer.

9. A semiconductor device comprising:

a semiconductor chip;

a plurality of protrusion electrodes which function as external connecting terminals, the semiconductor device being mounted onto a printed circuit board via the protrusion electrodes;

an interposer which electrically connects the semiconductor chip to the protrusion electrodes;

a mold resin which seals at least a part of the semiconductor chip and a part of the interposer; and a connecting portion sealing resin which seals a connecting portion between the interposer and the semiconductor chip, wherein the mold resin is elastically deformed so as to take up stress caused by a thermal expansion difference between the semiconductor chip and the printed circuit board, wherein the interposer is bonded to the semiconductor chip via a bonding member, wherein an interposing portion is formed in the bonding member, wherein the mold resin is disposed in the interposed portion, wherein the semiconductor device further comprises one or more semiconductor chips besides the semiconductor chip, and wherein all the semiconductor chips are stacked up in the mold resin.

10. A method of producing a semiconductor device, comprising the steps of:

disposing bonding members in predetermined positions on one or both of a semiconductor substrate and an interposer;

cutting the semiconductor substrate into individual semiconductor chips;

bonding said individual semiconductor chips to the interposer via the bonding members, so that electrode pads formed on said individual semiconductor chips are electrically connected to the interposer;

molding a mold resin in an opening between each of said individual semiconductor chips and the interposer separated by one or both of the bonding members and sides of each of said individual semiconductor chips; and collectively cutting the mold resin and the interposer to form individual semiconductor devices, each containing one of said individual semiconductor chips.

11. The method according to claim 10, further comprising the step of forming stress absorbing portions which absorb stresses caused in the interposer.

12. A method of producing a semiconductor device, comprising the steps of:

disposing bonding members in predetermined positions on one or both of a semiconductor substrate and an interposer;

cutting the semiconductor substrate into individual semiconductor chips;

bonding said individual semiconductor chips to the interposer via the bonding members, so that electrode pads formed on said individual semiconductor chips are electrically connected to the interposer;

molding a mold resin in an opening between each of said individual semiconductor chips and the interposer separated by one or both of the bonding members and sides of each of said individual semiconductor chips; and collectively cutting the mold resin and the interposer to form individual semiconductor devices, each containing one of said individual semiconductor chips, wherein the bonding members are made of an elastic material.

13. A method of producing a semiconductor device, comprising the steps of:

disposing bonding members in predetermined positions on one or both of a semiconductor substrate and an interposer;

cutting the semiconductor substrate into individual semiconductor chips;

bonding said individual semiconductor chips to the interposer via the bonding members, so that electrode pads formed on said individual semiconductor chips are electrically connected to the interposer;

molding a mold resin in an opening between each of said individual semiconductor chips and the interposer separated by one or both of the bonding members and sides of each of said individual semiconductor chips; and collectively cutting the mold resin and the interposer to form individual semiconductor devices, each containing one of said individual semiconductor chips, wherein an elastic sheet member is disposed on a surface of a cavity of a metal mold to be used in the molding step.

14. A method of producing a semiconductor device, comprising the steps of:

disposing a semiconductor substrate evenly on an expandable sheet member;

cutting only the semiconductor substrate disposed on the sheet member into individual semiconductor chips;

expanding the sheet member so as to elongate a distance between said individual semiconductor chips;

disposing an interposer on said individual semiconductor chips so that said individual semiconductor chips are electrically connected to the interposer;

forming a sealing resin in a connecting position between the interposer and each of said individual semiconductor chips and sides of each of said individual semiconductor chips; and collectively cutting the sealing resin and the interposer into individual semiconductor chips, each containing one of said individual semiconductor chips.

* * * * *